United States Patent [19]
Wright, Jr. et al.

[11] Patent Number: 5,790,599
[45] Date of Patent: Aug. 4, 1998

[54] DATA COMPRESSION SYSTEM USING SOURCE REPRESENTATION

[75] Inventors: Laurence E. Wright, Jr., Huntington Beach; Ernest G. Kimme, Anaheim, both of Calif.

[73] Assignee: Redband Technologies, Inc., Newport Beach, Calif.

[21] Appl. No.: 390,575

[22] Filed: Feb. 17, 1995

Related U.S. Application Data

[63] Continuation-in-part of Ser. No. 924,188, Aug. 3, 1992, abandoned, which is a continuation-in-part of Ser. No. 300,037, Jan. 19, 1989, Pat. No. 5,136,618.

[51] Int. Cl.$^6$ .................................................. H04B 1/66
[52] U.S. Cl. .................. 375/240; 382/248; 348/390; 348/403
[58] Field of Search ............................ 375/240; 382/56, 382/232, 253, 249, 248; 341/106; 348/384, 390, 426, 403; 358/401, 426, 426.1, 426.2, 432

[56] References Cited

U.S. PATENT DOCUMENTS

| | | | |
|---|---|---|---|
| 3,725,592 | 4/1973 | Tanaka | 179/15.55 |
| 3,764,787 | 10/1973 | Yamanaka | 235/152 |
| 3,898,647 | 8/1975 | Morra et al. | 340/347 |
| 3,958,077 | 5/1976 | Ross et al. | 178/6 |
| 4,181,955 | 1/1980 | Mittelman et al. | 364/521 |
| 4,222,076 | 9/1980 | Knowlton | 358/263 |
| 4,277,779 | 7/1981 | Rohbacher | 340/348 |
| 4,364,026 | 12/1982 | Steckler et al. | 340/347 |
| 4,468,708 | 8/1984 | Coleman, Jr. | 358/310 |
| 4,633,296 | 12/1986 | Glenn | 358/12 |
| 4,672,444 | 6/1987 | Bergen et al. | 358/140 |
| 4,694,336 | 9/1987 | Keesen et al. | 358/133 |
| 4,703,348 | 10/1987 | Yuasa et al. | 358/133 |
| 4,870,685 | 9/1989 | Kakokawa et al. | 381/133 |
| 5,109,437 | 4/1992 | Honda | 382/56 |
| 5,109,438 | 4/1992 | Alves et al. | 382/56 |
| 5,126,962 | 6/1992 | Chiang | 382/56 |
| 5,136,618 | 8/1992 | Wright et al. | |
| 5,235,418 | 8/1993 | Lucas | 358/133 |

OTHER PUBLICATIONS

Lin, et al., Error Control Coding, published 1983, Prentice Hall, Inc., p. 85.

*Primary Examiner*—Don N. Vo
*Attorney, Agent, or Firm*—Oppenheimer Wolff & Donnelly LLP

[57] ABSTRACT

A data compression method and apparatus are disclosed including a receiver (14) for accepting a series of data at an input representing information to be transferred and a processor (18) for selecting one or more maximal sequences to represent at least a portion of the series of data. A transmitter is provided to transmit one or more of the maximal sequences to an output for purposes of handling the data in compressed form.

12 Claims, 11 Drawing Sheets

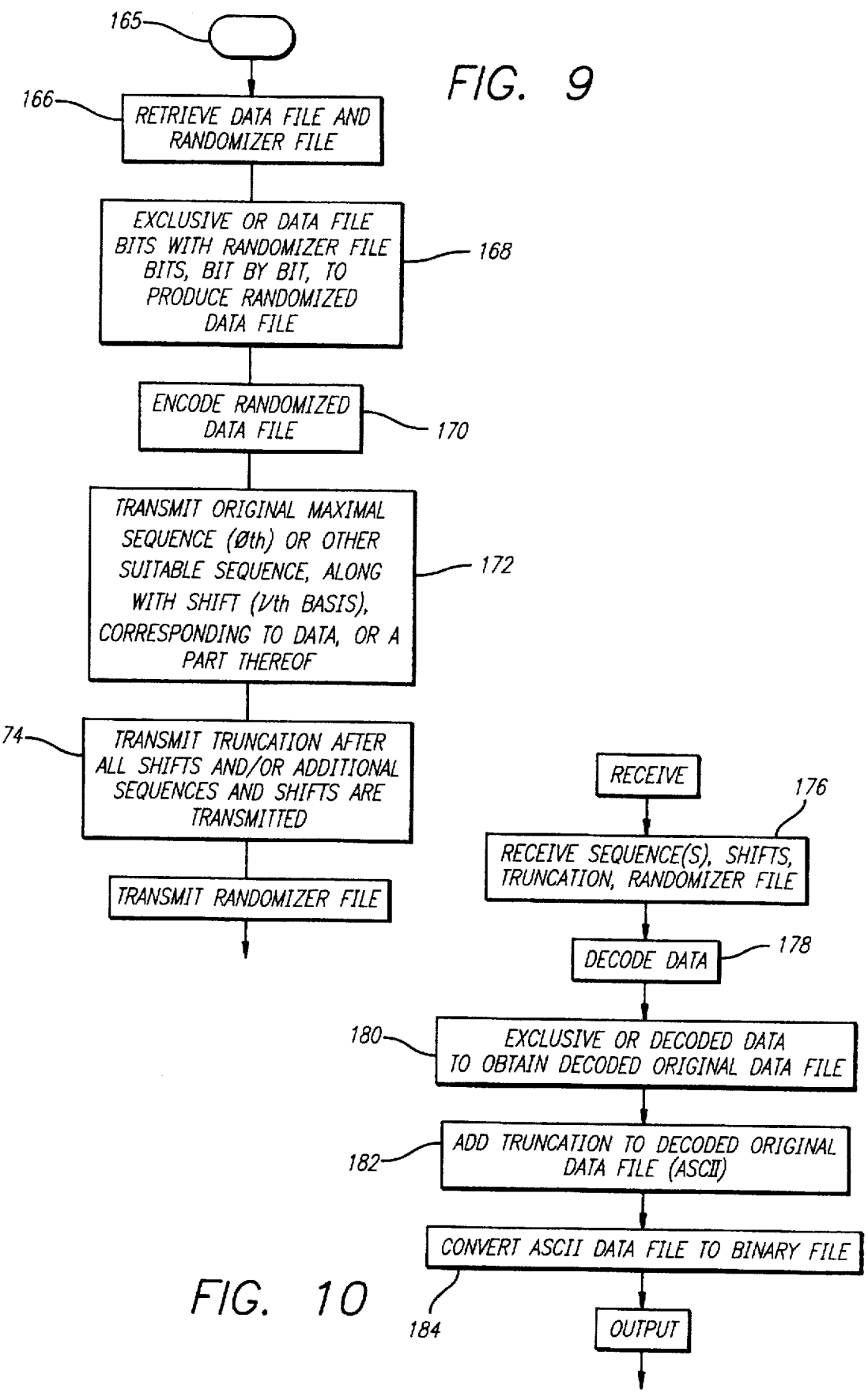

DATA COMPRESSION SYSTEM USING SOURCE REPRESENTATION

This application is a Continuation-In-Part of application Ser. No. 07/924,188, filed Aug. 3, 1992, now abandoned which is a Continuation-In-Part of co-pending application Ser. No. 300,037 filed Jan. 19, 1989, now U.S. Pat. No. 5,136,618 issued Aug. 4, 1992.

FIELD OF THE INVENTION

This invention relates to a system for compressing or transmitting digital or analog data sequences with a high degree of compression.

BACKGROUND OF THE INVENTION

It is well known that data carriers, such as telephone and electrical lines, radio and microwave links, optical fibers, and the like have a limited capacity to carry data. There are corresponding limits to the ability of transmitters and receivers to handle data. As a common example, many offices now have telefax machines that allow digital data (obtained by converting the light and dark regions of the document to be sent into a series of data "bits," that is, to a sequence of "1's" and "0's) to be transferred over telephone lines to a receiving machine elsewhere. Because of known physical and electrical limitations of the metal telephone wires, data cannot be transmitted faster than at a certain rate.

Furthermore, the "modems," built into the telefax machines, that actually apply the digital data to the telephone lines also have upper limits on their transmission speed. No matter how fast the telefax machine were to be able to convert a document to digital form, if its internal modem cannot transmit more than, say, 2400 data bits per second, the message cannot be sent and received at a faster rate. Finally, the speed at which the telefax machine can scan a document also limits the speed at which a message can be sent.

A way to improve transmission speed is to make the machines themselves faster. If the telefax machine is able to scan documents fast enough, if its modem can transmit at 4800 bits per second instead of only 2400, if the transmission medium is able to carry data at this rate, and if the receiving device is able to receive at this rate, then transmission speed can be doubled.

Another way to improve transmission speed is to use a transmission medium that has a greater "bandwidth," that is, a greater ability or capacity to carry data. Optical fibers, for example, transmit data in the form of light pulses, and as such they have a much greater data capacity than traditional copper wires, over which data is transmitted in the form of electrical signals.

Still another way to increase transmission speed is to compress the data to be transmitted. Continuing with the telefax example, assume one wishes to transmit a letter with only ten lines of typed text in the top half of a normal sheet of white paper. In a normal telefax machine, this document is scanned as a large number of lines, each consisting of a large number of adjacent points or picture elements ("pixels"). For the purpose of this example, assume that the scanner scans the document as a series of 1000 lines, and that each line consists of 1000 pixels; in other words, assume the telefax scanner divides the page into 1000×1000=1 million points.

During scanning, each pixel is for example assigned a value of "1" if it is mostly black and a value of "0" if it is mostly white. (More sophisticated telefax machines use different schemes, and many even represent each pixel as having one of several shades of gray.) In the example, the page can therefore be represented as a string of 1 million bits (1's and 0's). With only ten lines of actual text, however, very few of the points are black, and probably at least 99% of the transmitted data string will consist of zeroes; in particular, the bottom half of the page contains no text at all, but needs 500,000 bits, all zeroes, to represent it.

One transmission method in this example would be to transmit all 1 million data bits as they are. On the other hand, this would waste time and data storage space, since most of the transmission would contain no useful information (such as the bits representing the text). The time it takes to transmit the 500,000 "bottom half-page"-bits is wasted, since the transmission medium, such as the telephone line, is not able to be used for other, information-carrying messages while these bits are being transmitted.

One can reduce wasteful transmission by observing that the data series to be transmitted has a certain structure. In the example, one could notice that most ones, and especially zeroes, tend to occur in long strings rather than randomly. Indeed, the bottom half of the page is represented as a single string of 500,000 zeroes.

According to one known data compression scheme for telefax machines, which recognizes this characteristic structure of many telefaxed documents, one does not transmit the actual ones and zeroes representing the document, but rather transmits the length of the current bit string. For example, instead of transmitting a sequence of ten "1's", followed by ten "0's", followed by five "1's", followed by 500,000 "0's", one instead simply transmits the numbers 10, 10, 5, and 500,000. By telling the receiving machine that one is beginning with a "black" string, and that each new number represents a change of string color, one can transmit only the four numbers (which can be represented digitally using only a few tens of bits) instead of a string of 500,000+10+10+5=500,025 bits.

When the telefax receiver receives the string (10, 10, 5, 500,000) it begins by printing 10 black points, then switches to printing 10 white points, then it switches to printing 5 black points, then it switches to printing 500,000 white points. By taking advantage of the structure of the original data string, one is therefore able to include the same information in a much shorter string. This in turn allows one to send the same message cheaper and faster, and to take up less of the capacity of the transmission medium.

The receiver can receive and store the string (10, 10, 5, 500,000) very quickly even though it will take much longer actually to reprint the telefaxed document. The drawback of this data compression scheme, however, is that it achieves a high degree of compression only when the transmitted data contains many long strings of unchanging binary digits. The maximum degree of compression would be had if the transmitted page were all black (1 million "1's" in a row) or all white (1 million "0's"), since one then would only have to transmit a single number (1,000,000) to recreate the text fully.

On the other hand, this scheme would achieve no compression at all if the original document consisted of a checkerboard pattern of alternating black and white pixels; in such case, the system would have to transmit a string of a million "1's" (each string is only one pixel long, and there is a color change after every pixel). Since these would not be simple binary bits, but rather a million blocks of bits (each long enough to represent the largest possible transmitted number 1,000,000), it would actually take much longer to transmit the "compressed" data stream. The compression system requires the input data itself to have a certain structure in order for the system to be efficient.

The telefax example was given as one type of system where compression is useful but may not in every case achieve the desired result. Similar problems of data compression and efficiency are encountered in many other technical fields, such as the transmission of speech in digital form, digital television, and other areas in which information is to be communicated as a sequence of numbers. Since a majority of transmission of information, such as over modern carriers (satellites, optical fibers, etc.), is accomplished digitally (by transmitting binary numbers), the goal of increased capacity through data compression is found in many aspects of modern telecommunications technology.

Accordingly, there is a need for a data compression system which provides for a greater capacity for transmitting or handling data, and a system which provides faster handling of data resulting in greater data or information throughput. There is also a need for a system and method providing for a greater data compression than previously afforded.

Accordingly, an object of this invention is to provide a system for data communication that achieves a greater degree of data compression than is possible using existing systems.

It is a further object of the present invention to provide a method and apparatus for handling data or other information which has a greater capacity for handling the data than previously available, and which handles the data faster than previous methods and apparatus.

It is another object of the present invention to provide a method and apparatus for allowing greater data or information throughput for various data and information handling apparatus.

It is a further object of the present invention to provide a method and apparatus for increasing the capacity and speed with which data is handled by computers and by which data can be transmitted from one computer to another.

SUMMARY OF THE INVENTION

In accordance with the present invention, a data compression system and process is provided which allows for greater capacity for data handling and transmission, faster data handling and therefore greater information throughput and which provides for greater data compression, all without loss. A data compression system is provided with means for accepting a series of data at an input representing information to be transferred. Means are provided for selecting one or more labels to represent at least a portion of the series of data, the selecting means including systems of equations having corresponding labels and which systems of equations produce numerical data sequences. Means are also provided for transmitting the labels.

In a further form of the invention, a data compression system includes means for selecting one or more equations, representing one or more families of orthogonal bases to represent at least a portion of the series of data wherein each equation has a corresponding unique label. Means are further provided for transmitting to an output the one or more labels corresponding to the selected equations.

In another preferred form of the invention, the means for selecting includes means for selecting one or more maximal sequences. For example, a data compression system is provided which includes means for accepting a series of data representing information to be transferred. Means are also provided for selecting one or more maximal sequences to represent at least a portion of the series of data. Means are also provided for transmitting to an output representations of the one or more maximal sequences.

A method is also described herein for constructing a set of algorithms to be used in a data compression system, such as may be in the form of a plurality of finite state machines. The method includes the steps of defining a set of equations wherein equations in the set of equations are orthogonal with respect to each other to form orthogonal bases to be used to represent at least a part of a sequence of data and retaining the set of orthogonal bases. The method further includes the step of assigning a unique label to each basis, wherein each label represents the corresponding basis formed in the step of defining the step of equations. In a preferred embodiment, for example, the step of defining a set of equations includes the step of defining at least one maximal sequence. The step of defining at least one maximal sequence may include defining at least one maximal sequence of length N, and N−1 cyclic shifts of the maximal sequence of length N.

In a further preferred form of the invention, an encoding processor divides the data sequence generated by a source into blocks of N binary bits, which are then converted into blocks of N numbers. The N numbers are the corresponding arithmetic values of the binary bits or numbers. The value N is preferably chosen to be a Mersenne prime number of suitable size to enable efficient compression yet provide for acceptably rapid computation. The encoder then calculates a maximal sequence of length N for the first block. This maximal sequence, plus its N−1 cyclic shifts, forms a basis of N vectors. The system may also provide a number "i" specifying by how much the "0th" basis is to be shifted to get a different basis vector.

The N vectors or bases may then be stored in one or more processors, for example, such as a transmitting computer and a receiving computer or a computer suitable for storing compressed data, and assigned unique labels for use in communicating data. In the situation of the transmitting and receiving computers, incoming data is converted, a maximal sequence is found and one or more of its N−1 cyclic shifts is selected to represent a portion of the data. The labels for the maximal sequence and the related cyclic shifts are then transmitted to the receiving computer, and the receiving computer can recreate the same data block without loss. Alternatively, the system transmits the label for the maximal sequence and the indices of the basis (the degree of shift of the "0th" basis). Therefore, by determining an appropriate maximal sequence, in this example, the system can increase the capacity by which it handles data, thereby increasing the speed with which data is handled and increasing the throughput of data or other information. This system provides a relatively high amount of data compression. This method and system can be used for a wide range of applications, including the telefax application previously discussed.

One aspect of the telefax example that one should observe is that, using the described data compression scheme, one is not transmitting the actual data string representing the original message (the digitized document), but rather a "blueprint" for how the receiving machine itself can reconstruct the original message. One transmits a description of the characteristics of the original data stream instead of the data stream itself.

In accordance with the present invention, instead of transmitting a shortened (compressed) version of the data sequence, the system according to the invention constructs a series of data "building blocks" or "data generators" which it can combine to form a model of the data source that, when activated, generates the same data sequence one wishes to transmit. Instead of transmitting data, one may transmit information that tells the receiver how to combine its data generators in such a way that the receiver itself creates the data sequence anew. The "data generators" may be described mathematically as so-called "finite state machines," which may be implemented using one or more processors. The characteristics of these finite state machines are pre-defined and stored both in the transmitter and in the receiver. The system then analyzes the input sequence to determine which of the series of constructed finite state machines will generate the data input sequence. Alternatively, the characteristics of the finite state machines may be created upon initialization of the system. Thereafter, codes or instructions used for creating the characteristics of the finite state machines may be transmitted to the receiver. The transmitter and receiver are then similarly configured, and the transmitter can then send signals identifying which finite state machine, or combination thereof, will recreate the data sequence input to the transmitter.

Instead of transmitting the sequence itself, or characteristics about the sequence, the transmitter according to the invention instead transmits a signal identifying which, or which combination, of the finite state machines is able to recreate the input sequence; such a transmission requires very few data bits. The receiver can then activate this finite state machine and let it run to regenerate the data input sequence. The invention therefore develops a model or representation of the original data source, whereupon the model recreates the desired data sequence without loss within the receiver.

BRIEF DESCRIPTION OF THE DRAWINGS

FIG. 9 is a schematic block diagram and flow chart showing one aspect of the present invention as implemented in a prototype form for receiving and decoding data.

FIG. 10 is a schematic block diagram and flow chart representing a portion of the process followed in accordance with one aspect of the present invention, such as a receive or decode process for processing data.

DESCRIPTION OF THE INVENTION

Figure 1:
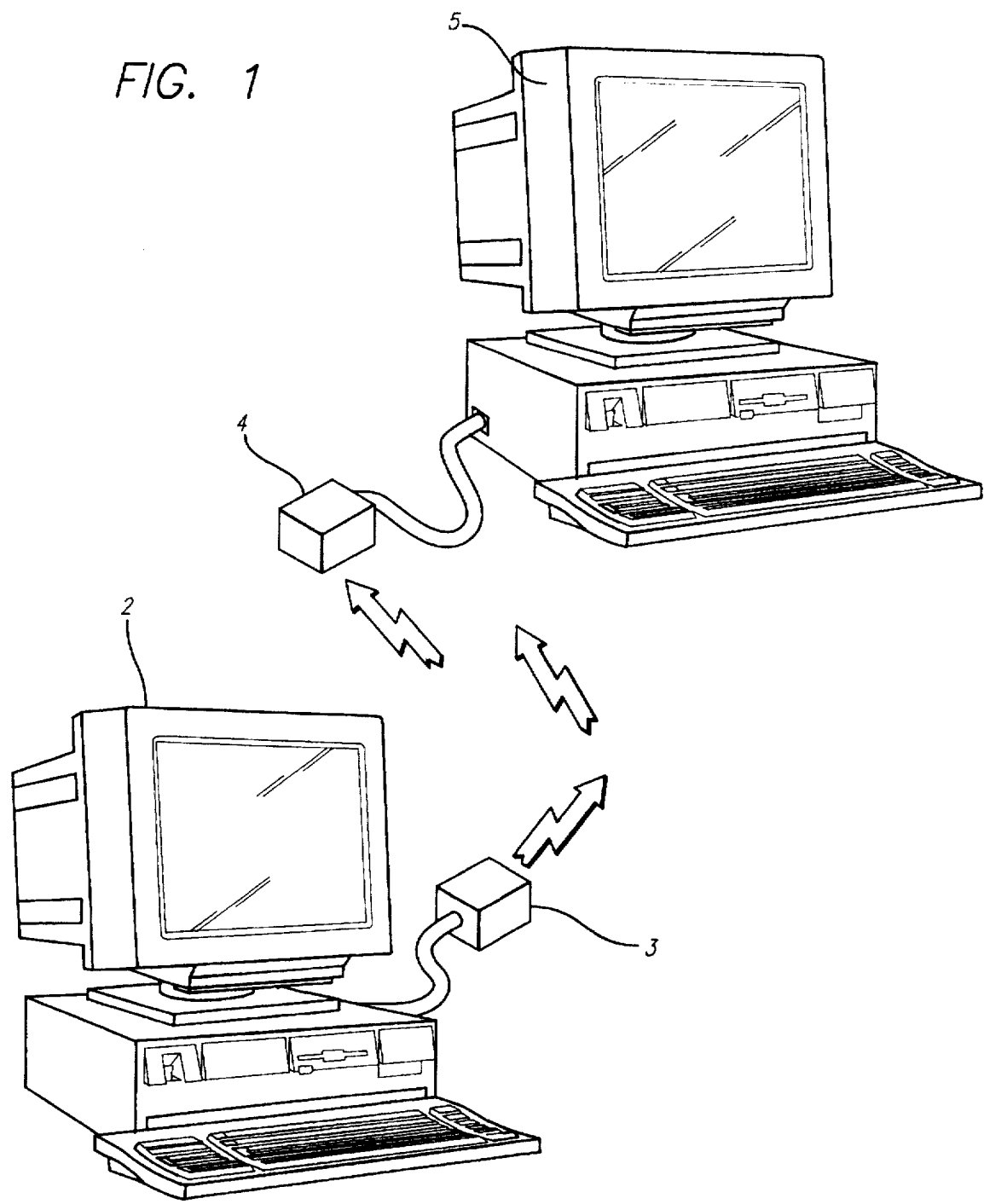
FIG. 1 is a schematic representation of two data processing units which can be used for the data compression of the present invention.
Figure 2:
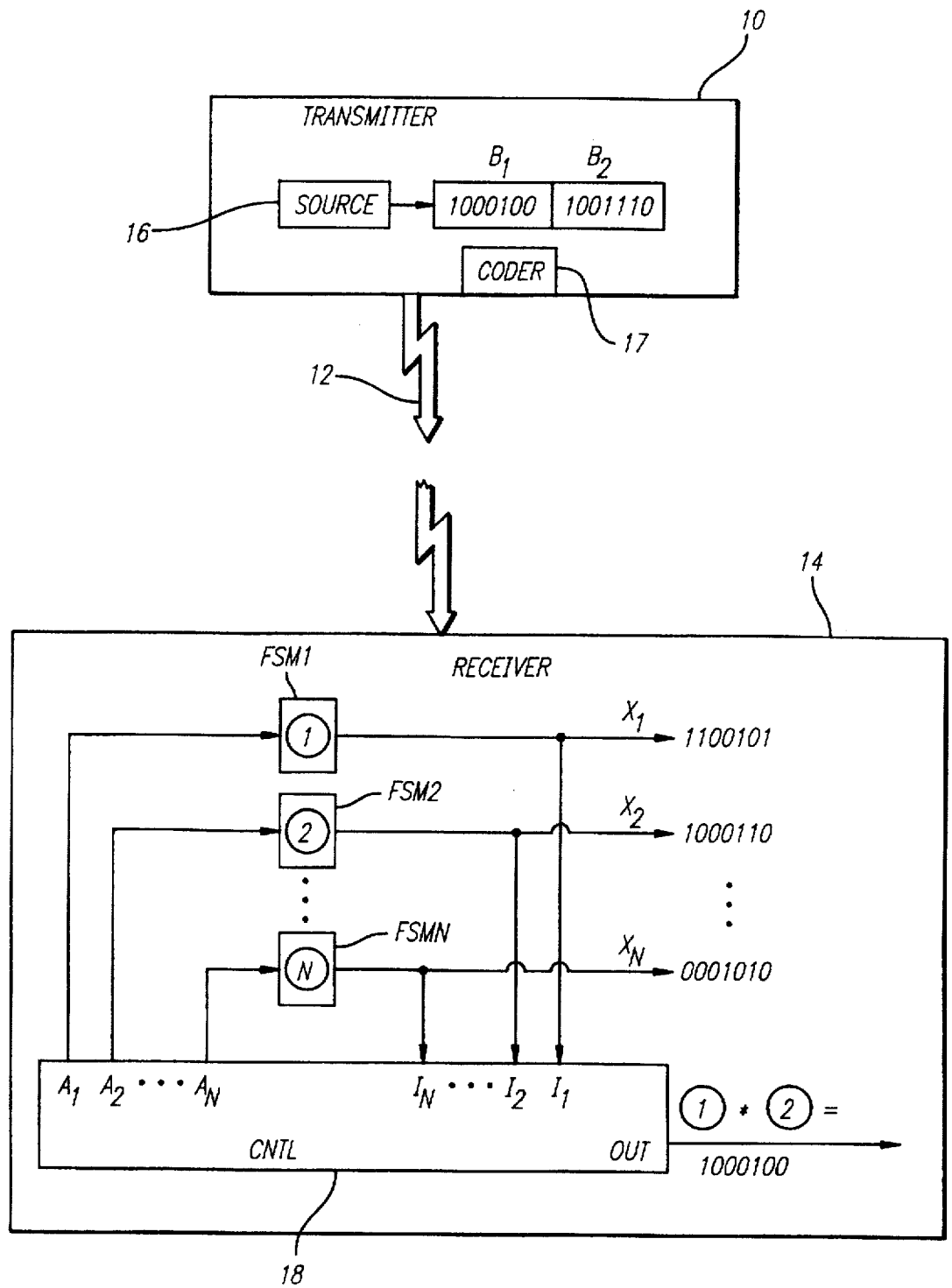
FIG. 2 is a schematic and block diagram of a transmitter and receiver incorporating aspects of the present invention and depicting the process according to the present invention.

In accordance with the present invention, a data compression system, depicted in the top block of FIG. 2, may be implemented in a number of applications. FIG. 1 depicts a transmitting and processing computer 2 containing a data compression system to receive and compress data according to the present invention and output one or more maximal sequences selected by the data compression system to represent at least a portion of the series of data to a modem 3 to transmit the maximal sequences to a receiving modem 4 linked to a receiving computer 5 containing the synthesis and decoding system for accepting the maximal sequences and synthesizing the series of data from the maximal sequences and the other information received by the transmitting computer 2.

The systems depicted in FIG. 1 are simply one representation of apparatus which can be beneficially used with the present invention to more easily and quickly handle data and information. Other applications of the invention easily come to mind, including for telefax applications, transmission of speech in digital form, digital television or recording and the like.

Before delving into the actual construction and operation of the invention, it is helpful to understand the concept of source representation. FIG. 2 illustrates the concept in the form of a greatly simplified telecommunications system. In FIG. 2, a transmitter 10 is intended to transmit data over a transmission medium 12 to a receiver 14. The medium 12 may be electrical wires, electromagnetic radiation, optical fibers, etc.

The transmitter includes, or, more commonly, is connected to, a data source 16, which produces an output signal that can be converted into numerical form. The source could be, for example, a document scanner, a speech digitizer, a computer containing data one wishes to transmit, a television camera, telemetry or scanning equipment in a satellite, or any of the virtually countless other modern devices that generate information in digital form. The numerical data may be numerical sequences from primary digital data or discretized forms of analog data, for example. In the illustrated example, the source 16 has generated a string of fourteen binary digits. The transmitter also contains a coder 17, whose function is described below.

The receiver 14 includes a controller or processor 18 and N digital networks or finite state machines (labelled FSM1, FSM2, . . . , FSMN). Each finite state machine generates a unique output signal X1, X2, . . . , XN in the form of a finite string of binary digits. FSM1, for example, when activated, generates the sequence 1100101. The structure of finite state machines is well understood in the field of digital electronics, and is discussed, for example, in *Digital Networks and Computer Systems*, Taylor L. Booth, John Wiley and Sons, Inc, 1971. Of interest to this discussion is that the components FSM1–FSMN generate unique strings of a fixed number of binary digits.

The controller 18 is connected (via output lines A1–AN) to each of the finite state machines FSM1–FSMN, and receives the generated data strings from the state machines via input lines I1–IN. The controller 18 is able to select any or all of the state machines and to combine their output signals. In this regard one should recall the binary, logical operators AND and OR. Given two binary strings X and Y, one forms (X AND Y) by multiplying their individual digits pairwise. Thus, (101 AND 011) is 001; that is, each digit in the result is a one only if the corresponding digits in both the input strings was a one. To form (X OR Y), one forms a resulting string that has ones only in positions where either or both of the input strings has a one in the corresponding position. Thus, (101 OR 011) is 111.

In the example shown in FIG. 2, the source 16 has generated an output string of 14 binary digits (10001001001110) that are to be transmitted. As is mentioned above, one could simply transmit these 14 bits, but this would achieve no compression. One could also try some encoding scheme such as transmitting the length of strings, but in this case, since one cannot assume long, unchanging strings, even such a scheme will not increase transmission efficiency.

On the other hand, assume that the coder 17 contains information about the output strings that the state machines FSM1–FSMN generate. The coder first divides the source output string into blocks B1 and B2 each having seven bits (the same length as the output strings of the state machines). The coder then can analyze block B1 and determine that it in fact can be obtained by forming (X1 AND X2): (1100101 AND 1000110)=1000100=B1. Similarly, the coder can determine that B2=(X2 OR XN).

Instead of transmitting the whole 14-bit string, the transmitter can therefore simply transmit short signals identifying which state machine(s) the controller 18 is to select, as well as short signals indicating which operations are to be performed on their output signals. The controller 18, after making the appropriate combinations, then allows the state machines to run so that the source output sequence is recreated within the receiver. In essence, the state machines, through proper combination, act as the source itself—the source is modelled within the receiver, and all that is transmitted is information necessary to configure the model.

The finite state machines shown in FIG. 2 are merely representative of the class of structures that can be used to represent a data source. In certain applications, it may be sufficient to have a single state machine, which generates different output strings depending on what starting values the controller gives it. In another class, the state machines each have a set output data sequence that they generate, but each sequence can be generated in a different cyclical order;
for example, a machine whose output was ABC could also generate CAB and BCA by shifting each letter to the right one step and "wrapping around" so that the last letter in one sequence becomes the first letter of the next sequence. (Letters of the alphabet are used only for the sake of clarity; strings of binary digits can be cycled in the same manner.)

With the example shown in FIG. 2 it is not altogether apparent that one will be able to model all possible sources 16 by combination or other manipulation of the outputs of the state machines FSM1–FSMN, although it is almost always possible to construct a finite state machine that will generate a desired finite output. For example, assume one only has state machines that generate X1=100 and X2=010. No simple combination of AND or OR operations can produce an output with a "1" in the third position; either another state machine, a different type of output, or different permissible operations would be required.

For example, if one also had the state machine that generated X3=001, one could reconstruct all eight possible 3-bit words by combination of X1, X2 and X3. In other words, X1, X2, and X3 form a complete basis for reconstruction of all 3-bit data sequences. Clearly, the choice of state machines and their outputs, and the process by which the outputs are manipulated determines which class of sources one can model (and transmit modelling parameters for).

With only 7-bit data blocks B1 and B2, the degree of compression that can be achieved by such a transmission system is relatively small, since it may take more than seven bits actually to model the source. On the other hand, one can show theoretically that the degree of compression one can achieve increases greatly with increasing block size; the key is to choose a set of output data (bases) from state machines or their equivalents (such as simple, stored listings of their desired output sequences), and suitable operations to perform on the set, such that one can model efficiently a desired or anticipated class of sources. This invention provides just such a key; it determines a complete basis of a much higher order than three, so that the system according to the invention is able to reconstruct sources that produce much longer data sequences, and thus is able to achieve a high degree of data compression.

Maximals as a Complete Basis

According to the invention, a data sequence of binary digits is first converted to an equivalent sequence of "real numbers," in part so that ordinary arithmetic operations may be performed on each digit in the normally understood manner (for example, rather than having to manipulate AND's and OR's, one can use normal multiplication and addition). One way to do this is to assign the value −1 to every binary "1" and the value +1 to every binary "0"; thus, the binary sequence (1, 0, 0, 1) is converted to the arithmetic sequence (−1, 1, 1, −1). The assignment can be represented using the known function "aval," which stands for "arithmetic value"; thus:

aval(x)=+1 (real number) when x=0 (binary number) and
=−1 (real number) when x=1 (binary number).

All operations in the system according to the invention are then carried out using conventional arithmetical operations on the arithmetical ("aval") equivalent of data sequences.

The system according to the invention also calculates a complete basis for data sequences that will fully model all sources in a predetermined class. The basis that is calculated is a collection of so-called maximal sequences. The theory of maximal sequences is developed in the literature, but a brief description is given below.

Orthonormality

Returning for the moment to the 3-digit binary system, a system with the basis vectors (1,0,0), (0,1,0) and (1,1,0) would be inefficient, since it would be possible to obtain the third vector by taking the first two together with an OR combination. The third vector adds nothing to the ability to reconstruct other vectors since it is similar to the other two. In other words, the third vector has too great a correlation with the others. Ideally, all the vectors are uncorrelated with or "orthogonal" to the others or combinations of the others.

Given a data sequence of length N, there are several ways in which to develop a set of N orthogonal base vectors with which one can reconstruct source sequences through proper manipulation. One common procedure for producing such vectors is known as the Gram-Schmidt process. Unfortunately, in order to create a set of N base vectors, this procedure requires approximately $N^2$ computations. It thus takes on the order of 1,000,000 computations to convert a set of 1,000 non-orthogonal base vectors to orthogonal form. For the purposes of rapid data compression, this computational burden is often too great, and is in most cases undesirably slow. A better approach, taken by this invention, is to start with a set of vectors that are known to be orthogonal or at least nearly so.

According to the invention, a maximal sequence of length L and its N−1 cyclic shifts are chosen as the base sequences. The disadvantage of using maximal sequences as the base sequences is that maximal sequences are structurally very complicated except for the sequences whose lengths are so-called Mersenne primes, that is, for lengths N that are prime numbers and that have the form $2^p-1$, where p itself is a prime number. (Lengths of 7, 35, 127 and 8191 are all examples of Mersenne prime lengths, for p=3, 5, 7 and 13, respectively.)

It can be shown that when N is a Mersenne prime, a single maximal sequence of length N and its N−1 cyclic shifts comprises a universal basis for all sequences of N real numbers. In other words, if one is given a sequence of N real numbers, one can also construct a single maximal sequence that, together with its N−1 cyclically shifted sequences (shifted one step to the left or right and "wrapped around," as for the ABC, CAB example given above), can be used to reconstruct any sequence of N real numbers.

This construction is also very efficient, and one can prove theoretically that it is possible to construct such a universal basis for a data sequence of N real numbers using no more than p binary numbers, where $p \leq 1+\log_2(M^{[N]}+1)$ and $M^{[N]}$ is the smallest Mersenne prime that is not less than N. For example, if one has a sequence of 31 real numbers, then one needs only $1+\log_2(31+1)=1+5=6$ binary numbers for complete reconstruction. In order to reconstruct any sequence of N=8191 real numbers, only 13 binary numbers would be needed.

The method according to the invention is accordingly for an encoding processor to divide the data sequence generated by a source into blocks of N binary bits, which are then converted into blocks of N numbers (the corresponding arithmetic values of the binary bits or numbers). The value N is chosen to be a Mersenne prime number of suitable size to enable efficient compression yet acceptably rapid computation. The size of N will depend on the application, and on any knowledge of the structure of the source sequences.

The encoder then calculates a maximal sequence of length N (using predetermined and well-defined equations) for the first block. This maximal sequence, plus its N−1 cyclic shifts, forms a basis of N vectors. Note, however, that it is not necessary to transmit all N vectors; it is sufficient to transmit the original maximal (0-shift). Since all others have the same elements, just shifted by a certain number of positions, once a receiver has the "$0^{th}$" basis, it is only necessary to transmit a single number i specifying by how much the "$0^{th}$" basis is to be shifted to get a different basis vector.

When each succeeding source data block is sufficiently similar to the block from which the maximal was calculated, the values to be transmitted to the receiver are the indices of the bases (the degree of shift of the "$0^{th}$" basis), and a decoding processor in the receiver can then reconstruct the source data block. In effect, the receiver creates a model or representation of the source, which is then "activated" to recreate the data sequence the "real" source generated. If the successive data blocks differ too greatly from the preceding (determined according to known formulas), the encoding processor recalculates a new maximal and the encoding and compression procedure is carried out again.

According to the invention, the encoding and decoding processors also perform certain other calculations on the various data sequences in order to transform them into more easily manipulated and analyzed forms. However, the blocking of source data into blocks of Mersenne prime length, the calculation of maximals, and the transmission only of maximals and shift indices for source reconstruction remains. The method according to the invention provides a much greater degree of data compression for long data sequences than is possible using existing compression systems.

With the foregoing general description of the invention, a more detailed discussion of several embodiments of the invention will be provided below.

Figure 4:
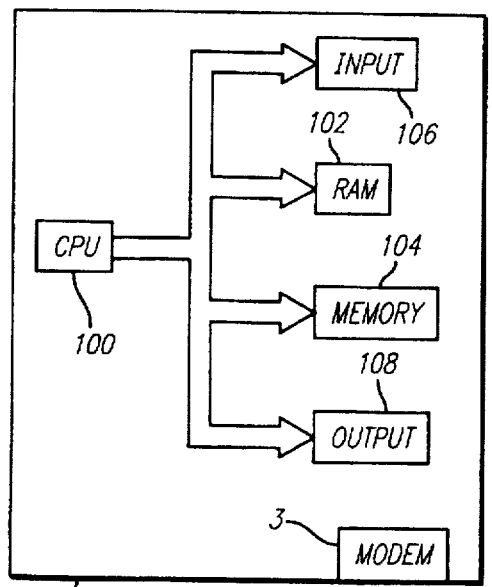
FIG. 4 is a schematic block diagram of a computer or other processor for processing data, such as encoding and transmitting data, in accordance with one aspect of the present invention.
Figure 5:
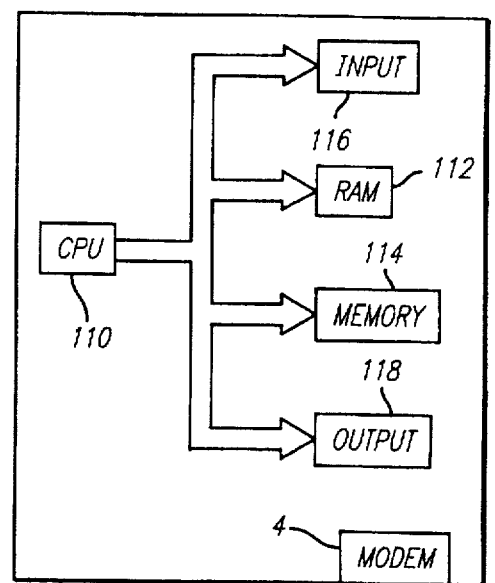
FIG. 5 is a schematic block diagram of a computer or other processor, such as a receiving computer or decoding processor, for use in accordance with one aspect of the present invention.

Considering the apparatus of Applicants' invention in more detail, the transmitting and processing computer 2 is shown in FIG. 4, along with a receiving computer 5 (FIG. 5). The processing computer 2 will preferably include the modem 3, and the receiving computer 5 preferably includes the modem 4. It should be understood that while two computers or processors are described with respect to the preferred embodiment, other apparatus may be used to achieve the purpose of the present invention relating to data compression, source code representation and the like. For example, the present invention is applicable to data storage, in which case the transmitting and receiving computer are one and the same. Additionally, where the application is for telefacsimile transmissions and reception, the transmitting and processing computer and the receiving computer, while strictly construed as processors, are not computers in the sense that they include keyboards, monitors, disc drives, etc., as those terms are understood. Furthermore, in the example of video or other data transmissions of visual material, the respective processors may be termed by some as something other than "computers". Nonetheless, the concepts of Applicants' invention described herein are equally applicable to other apparatus beyond exclusively computers. However, for present purposes, it should suffice for explanation that one preferred embodiment of the present invention will be described in the context of computers, such as for transmission of data or files between computers.

As is generally understood, the transmitting and processing computer 2 will include a central processing unit 100 which controls the operation and functions of the computer. For example, the central processing unit 100 controls, and functions with, a random access memory 102 in conjunction with a fixed memory 104 to operate on data received from the input 106 or from memory. Data may be from a keyboard, such as that shown in FIG. 1, a modem, such as modem 3 or an input port. The central processing unit 100 also controls transfer of data from the computer 2 through an output 108, which may include the screen, depicted generally in FIG. 1, the modem 3 or an output port. The receiving computer 5 (FIG. 5) also includes a central processing unit 110 for controlling, and operating with, a random access memory 112 and a fixed memory 114 for operating on data or files received from memory, or an input 116, similar to the processing computer 2. The receiving computer 5 also includes an output 118 similar to that with the processing computer 2. It should be understood that the inputs 106 and 116, and the outputs 108 and 118, respectively, may also include portable memory devices such as diskettes, peripheral hard drives, tape units, and the like. Once again, however, it should be understood that the computers are not limited to these elements, and would not necessarily include each of these elements in every application, but are generically referred to here as exemplary computers useful for carrying out the method of the present invention in accordance with the preferred embodiments.

Considering the transmitting and processing computer 2 in more detail (FIG. 4), the processor 100 preferably includes a counter or other record keeping device for use in controlling the data and properly accessing the data as is well known. For purposes of explanation, it should be understood that the elements described in FIGS. 4 and 5, are principally logical elements, and may reside in any one of a number of particular physical structure, or may be segregated into several physical structures. However, these elements are described herein as separate logical components since the functions served by them can be considered for purposes of explanation separately. Particularly, according to one preferred form of the invention, the transmitting computer 2 includes a data file segmentor 120, under control of the central processor 100, which receives the incoming data file or other data form from the data source and segments the data into defined blocks. In the preferred embodiment, the blocks are defined to have a length, in terms of bits, equivalent to a Mersenne prime, such as 127, e.g. where N equals a prime number and has the form $2^p-1$, where p is itself a prime number. These blocks of data correspond to $B_1$, and $B_2$ in FIG. 2.

The data file, in the form of segments, or otherwise, may be converted to other forms for ease of processing. For example, processing may be facilitated by having the data in binary form, or in the form of Ascii characters. More specifically, with a system using Basic for operation, the data is preferably in the form of Ascii characters. In one preferred embodiment, data from the data file segmentor 120 is transferred to a binary-to-Ascii converter 122 and then returned for further processing as Ascii characters.

The segmented data may be then stored in memory 104, RAM 102, or in some other location for later processing, or may be transferred to a data/basis comparator 124 for matching each input data block to a base sequence or basis for identifying a matching basis to be used in the data compression. It bears repeating that the particular process, the form of the data, the form of storage of the data may depend upon the type of data, the method of processing the data, the equipment available, and many other parameters. Therefore, the storage, if any, of the data depends upon the particular circumstances.

The comparator 124 compares each data block, bit by bit, or character by character, to a basis or sequence stored in a basis file 126, described more fully below. As with the other components previously described, the basis file may take any number of forms, depending upon the size and form which the sequences take for the bases, the speed of operation of the system, and the mode of operation defined by the programmer or other person implementing the system. In the preferred embodiment, the bases are orthonormal sequences, as described more fully below. Each basis may be assigned a label or some other representation which will serve as the shorthand or other tag for representing the data block. The label or tag will then ultimately be output as the representation of the particular source data file or data block from the data file segmentor 120 for which the basis matches.

The data/basis comparator 124 takes blocks of data one at a time, and for the first block finds a basis which represents the block and outputs to the output 108 or stores it as "alpha", which is the representation of the data and which is the 0th basis. "Alpha" represents the first data block. For the next subsequent block, the data/basis comparator 124 compares the data in the data block with each basis from the basis file 126 until a match is found between the data block and a basis from the basis file 126. The processor 100 then outputs to the output 108 the label or other representation of the basis. The label represents the amount of shift made or calculated from the 0th basis needed to obtain the vth basis representing the current basis. The label may be held in a buffer 128 with the representation "alpha", before data is provided to the output 108. Alternatively, the labels and other representations of the original source data may be provided to the output 108 continuously.

Figure 7:
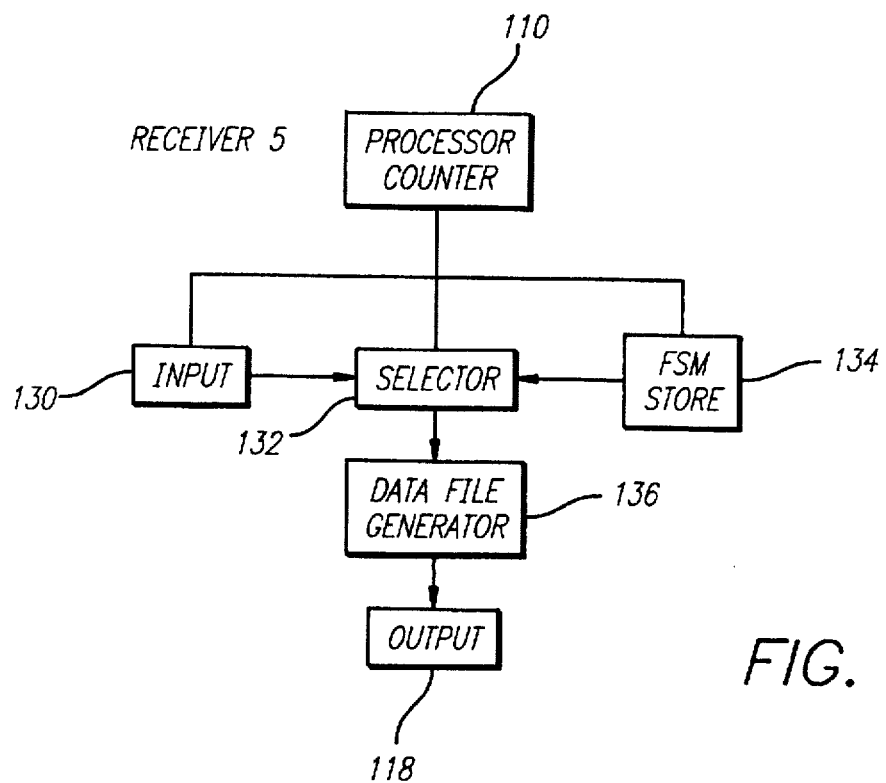
FIG. 7 is a schematic and block diagram of a computer or other processor for processing data in accordance with one aspect of the present invention, showing logical relationships between the processor and its functions.

The labels or representations of the original source or data, in one preferred embodiment, are then received in the receiver computer 5 through an input 130 (FIG. 7). The representations are received under control of the processor 110 at the input 130 and applied to the selector 132. The selector 132 applies the incoming labels and codes for accessing appropriate finite state machines in the finite state machine store 134. Each finite state machine, as described more fully above, includes a sequence representing a basis, corresponding to each of those stored in and used by the transmitting computer 2 in the basis file 126. There is a one-to-one correspondence between the labels from the basis file 126 and the respective finite state machines in the store 134. The labels obtained from the input 130 are then used to identify the proper finite state machine, which then provides its data, corresponding to the sequence, to the selector 132. The selector outputs the data to a data file generator 136 for recreating or reconstructing the data in accordance with the sequences obtained from the finite state machine store 134, as determined by the selector 132. The data sequences are determined in accordance with the labels received in the input 130.

The data file generator 136 reconstructs the data file and provides the data to the output 118. The data provided to the output 118 from the data file generator 136 will be the same as the data provided from the data file segmentor 120 to the comparator 124. In the case where the data is in the form of Ascii characters, the data provided to the output 118 will also be as Ascii characters, but still in the sequence as provided by the data file segmentor 120. It should be understood that an Ascii character-to-binary converter may also be provided in the receiving computer 5 either before or after the output 118, thereby providing the data in the same form as it was received by the data file segmentor 120. As with the transmitter 2, the receiver 5 may take any number of forms and may operate in any number of ways, depending on the particular application and the particular procedure adopted for carrying out the invention. However, it is preferred that the receiver 5 have a compatible construction and operation to that of the transmitter and processor 2 for any given application.

Figure 8:
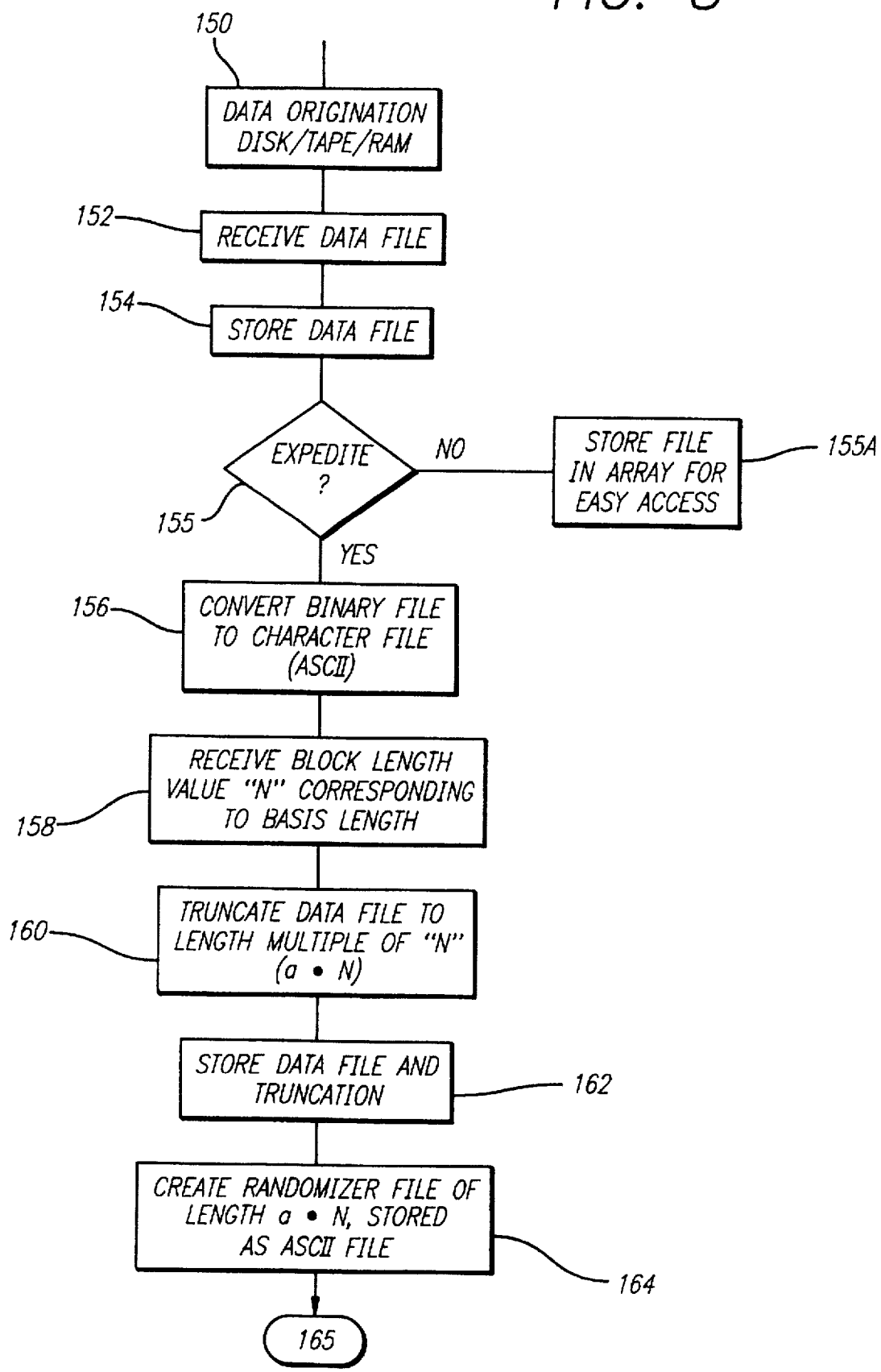
FIG. 8 is a block diagram and flow chart showing steps which may be followed in accordance with one aspect of the present invention carried out in a prototype application for encoding and transmitting data.

In the context of one embodiment of carrying out the invention, such as in a data compression, transmission and receive system, and which could be carried out with the apparatus described above with respect to FIGS. 4–7, a suitable process includes origination steps (FIGS. 8 and 9), and receive and decode steps (FIG. 10). In the data origination and encode steps, data is received 152 from a suitable source or a storage area 150, for example, which may take any form, including disk, tape, random access memory or other sources. The data file is received 152 (FIG. 8) from the source, such as source 16 (FIG. 2), and may be stored 154, such as in the random access memory 102 or the memory 104 (FIG. 4). In one embodiment, such as that represented by the computer program appendix, processing for data origination can be expedited 155 by storing 155A the data file in an array in the encode program for easy access during processing.

Figure 6:
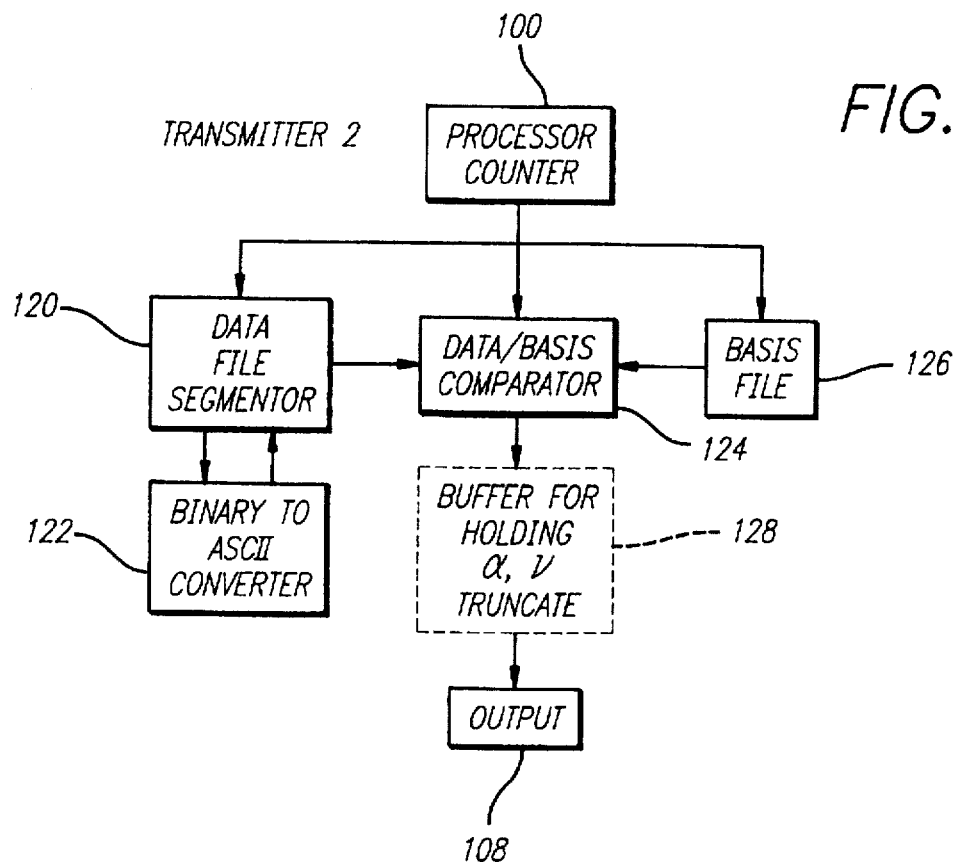
FIG. 6 is a schematic and block diagram of a computer or other processor for processing data in accordance with one aspect of the present invention, showing logical relationships between various aspects of the processor and its functions.

The data file is then converted 156 (FIG. 8) from its input binary form to an ASCII character file, for ease of processing in this particular prototype procedure which uses Basic programming. In one embodiment, the conversion can take place in the binary-to-ASCII converter 122 (FIG. 6).

The block length, which has been designated "N", is received 158 (FIG. 8) either with the data file or through some other input 106 (FIG. 4), and corresponds to the basis length to be applied to the data or file. The basis length in the case of maximal sequences, as described above, is preferably a Mersenne prime having the form $2^p-1$ and where p is a prime number. For example, "N" may be 127, where "p" is 7.

The data file is then truncated 160 (FIG. 8) to a length which is a multiple of the basis length so that the processor can operate on data lengths which correspond to the bases. The data file and the truncation are then stored so that the data file can then be encoded and the representations of the original data file transmitted along with the truncation for subsequent synthesis or decoding.

For purposes of one embodiment of the process, randomization is used to improve the processing time of the encoding step. Specifically, a randomizer file is created 164 (FIG. 8) having a length equal to the truncated length of the data file, and the randomizer file is then stored as an ASCII file. The data and randomizer files are then retrieved 166 (FIG. 9) and multiplied together by an exclusive OR process 168, bit by bit, to produce a randomized file. The randomized file is then encoded 170 as will be described more fully below with respect to FIGS. 3A and 3B. Briefly, the encoding process includes the steps of comparing each block of data with a known sequence, such as in the form of the bases developed from the orthonormal sequences, and preferably from the maximal sequences. When a basis representation is found, the basis or that sequence is output. Then, the next block of data is input and the new block is compared to the other basis corresponding to the preceding basis just output, to determine a match. If a match is found, the label for the corresponding basis or sequence is then output for transmission. If no match is found, another sequence or basis representation is selected for the current block of data and that sequence is then output. A new block of data is then input and the process repeated.

The original maximal sequence or other suitable sequence is then transmitted 172 (FIG. 9) along with the labels corresponding to the sequentially next blocks of data for which matches were found, or, for each block of data for which a suitable match was not found, an appropriate sequence is transmitted. All the sequences or labels are transmitted until such time as the end of the file is reached.

The truncation is also transmitted 174 either before, with or after the sequences and labels are transmitted.

In the demonstration represented by the code in the computer appendix, the sequences and labels which are equivalent to the encoded information is then decoded and synthesized, and compared to the original input to demonstrate that the compression was done in a lossless manner. It should be understood, however, that the compare or evaluation of the decode and encode steps would not ordinarily be carried out in a transmission system.

The transmitted data is then analyzed, synthesized or decoded in the receiver 5 (FIGS. 5 and 7) by decoding and outputting the reconstructed data file (FIG. 10). Specifically, the incoming sequences and labels are received 176 and analyzed. In one embodiment where the randomizer file is used, the randomizer file is also received.

Figure 3A:
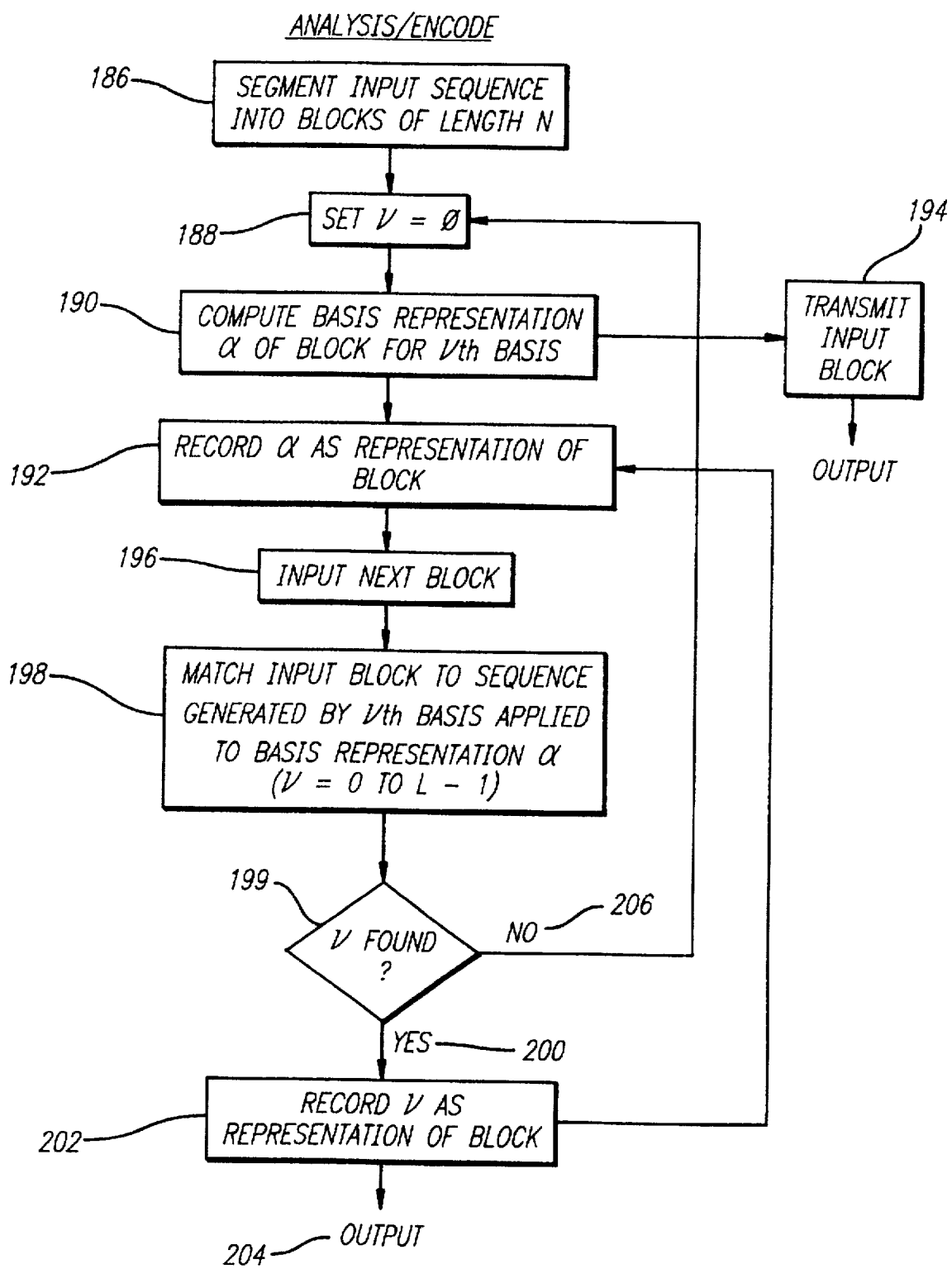
FIGS. 3A and 3B are flow charts depicting the overall process of analysis and encoding and synthesis and decoding, respectively, according to the process of the present invention.
Figure 3B:
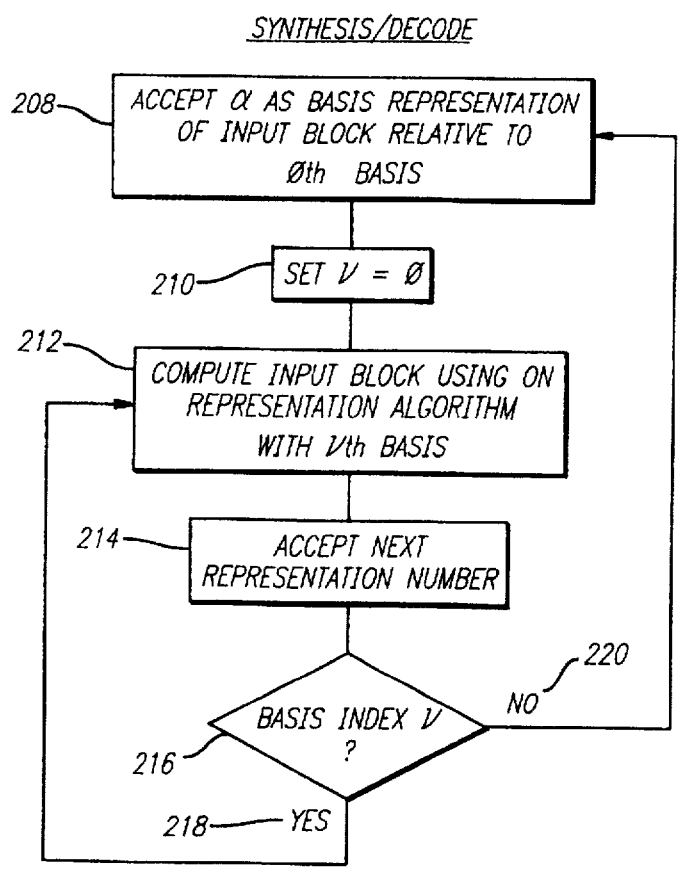

The incoming sequences and labels are then decoded 178, as described more fully with respect to FIG. 3B. The decoding step includes assembling the sequence which represents the first block of data, tacking on the next subsequent sequence, if no label is found which represents a basis related to the first sequence, and which represents the next subsequent block of data. If a label is found, the label is used to regenerate the basis or sequence which represents that next subsequent block of data. The process continues until the entire incoming information is analyzed. The truncation, if any, is then tacked on.

Where the original data file has been randomized into a randomized data file, the decoded data is then multiplied 180 through an exclusive OR process with the randomized file to obtain a decoded original data file. The truncation is then added 182 to the decoded original data file to form the Ascii file. The Ascii data file is converted 184 to the original binary file, which is then output or otherwise processed. The compression and transmission process has then been accomplished for the incoming data file.

Creation of a randomized file followed by multiplying the randomized file with the data file improves speed, but is not a necessary step. Without randomization, improved data compression and speed is still achieved with the described embodiments following the steps described above, while omitting the steps of creating the randomized file and multiplying it, on the transmit end, and also multiplying the synthesized or decoded file with the file on the receive end.

Considering the analysis/encode process in more detail (FIG. 3A), the incoming data sequence is segmented 186 into blocks of length "N", corresponding to the selected length. For a marker or label, v, v is set to "0" at 188, after which a basis representation alpha is computed 190 for the first block of data which corresponds to the 0th basis. The basis representation is computed or otherwise found in an array of basis representations or sequences. Each basis found in the array, or to be computed, is preferably orthonormal with respect to every other basis, and they are preferably selected from maximal sequences. The basis representation alpha is then recorded 192 as a representation of the first block input, and is also output 194 through an output 108 (FIG. 4) or placed in memory 104 (FIG. 4) for later transmission through modem 3 or some other appropriate device, in the case of the data transmission system being described in this embodiment. The basis representation alpha then serves as the starting point for finding a label for the next input sequence block. Therefore, the next data block is input 196 and compared 198 to alpha and to the sequences generated by the other bases which are orthonormal to alpha in order to find a match between the next subsequent input block of data and a basis. The bases with which that next subsequent input block is compared are the bases corresponding to v=0 through L−1. L−1 is preferably the number of independent orthonormal bases derived for a given sequence. While it is possible that a number of sequences developed from a maximal sequence may be redundant to another of the sequences for the given maximal sequence, such redundant sequences should be ignored and not included in the computation or the array of orthonormal sequences. Therefore, the value of L−1 may be significantly less than the value of "N", in other words, more than 1 less than N.

The result of the compare step 198 will either be a match, and therefore a value for v, or no match, in which case, no value will have been found for v. If a value for v has been found, indicating that a match exists between the next subsequent data block and a sequence orthonormal to the basis representation alpha, the value of v is recorded as a representation of that next subsequent data block. The value of v is the label to be transmitted from the recording step 202 to the output 204. The label or value of v is preferably that value by which the 0th basis is to be shifted to arrive at another orthonormal basis and which represents the next subsequent data block found in the comparison step 198.

If no value is found for v, so that the query 199 results in a negative 206, nothing is output for the next subsequent data block until v is set to 0, and a new basis representation $alpha_{new}$ is computed or generated to correspond to that next subsequent block for which no v could be found. The process then repeats itself as described above.

After all blocks of input data have been processed in accordance with the steps described with respect to FIG. 3A, all the data has been or can be output. If all the data was output in real time, none of the data will have been stored, and the last block compared will represent the end of the file. If the results of the encode process were stored, the results can then be output.

In the synthesis or decode process, on the receive side (FIG. 3B), the encoded data stream is received and processed. The receiver accepts the first alpha as the basis representation of the input block relative to the 0th basis. v is set 210 to 0 in the receive machine and the input data block is then computed using the basis representation. In the preferred embodiment, the incoming encoded sequences are decoded using finite state machines or their equivalent for producing data, such as in the form of Ascii characters, for reconstructing the incoming data sequence. The data is computed in the block 212. The processor then accepts 214 the next representation number in the encoded sequence. If the next representation number is a basic index v, the sequence must be reconstructed. If it is not a basic index v, then the next data represents a new basis representation alpha. A compare step 216 determines whether or not the basic index corresponds to a value for v. If the processor determines that the basis index corresponds to v, as indicated at 218 (FIG. 3B), the processor computes 212 the input block using v to determine which finite state machine contains the data representing the vth basis. The finite state machine can either compute the data sequence in real time, or may be in the form of an entry in an array. Steps 214 and 216 are then repeated.

For any situation where the next representation number is not a basic index v, the comparison step 216 then is negative 220 and returns to block 208 to accept the basis representation as a new alpha representing the next input data block to correspond to a new 0th basis. Steps 210, 212, 214 and 216 are then repeated. When the end of the file is reached, the entire data sequence will have been reconstructed except for any truncation. The data sequence can then be processed as desired.

Figures 11, 15:
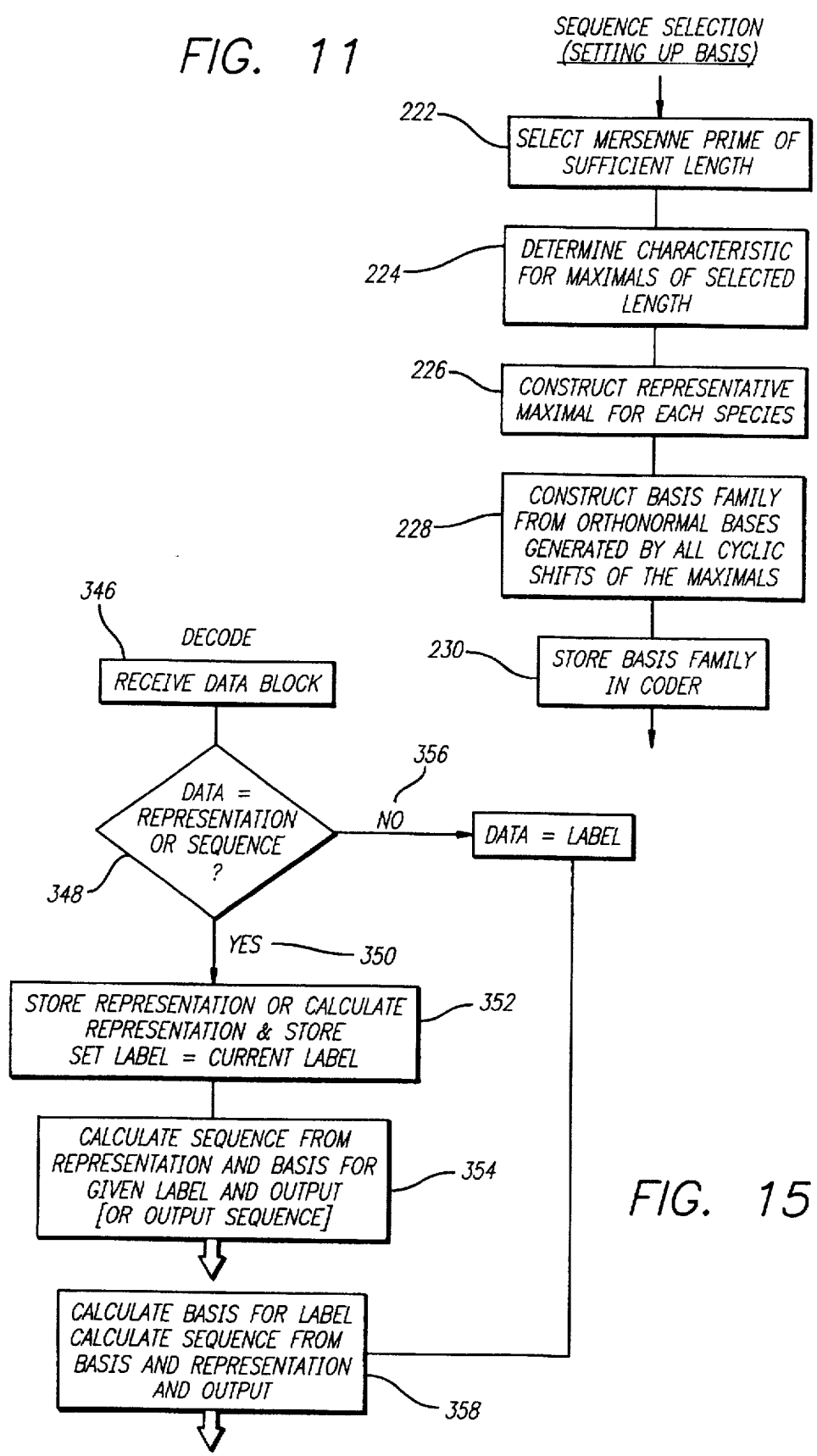
FIG. 11 is a schematic block diagram and flow chart depicting a further aspect of one part of the present invention relating to selection of maximal sequences for use in processing incoming data.
FIG. 15 is a flow chart depicting steps followed in receiving and decoding information representing data.

Selection of the sequences which make up the array or algorithms or equations forming the orthonormal basis in one preferred embodiment is by use of maximal sequences. While it should be understood that other orthonormal bases can be used, use of maximal sequences predictably provides orthonormal sequences which can be easily used and applied to the processes of the present invention. In a preferred embodiment of the present invention using maximal sequences, the method for selecting the sequences (FIG. 11) includes selecting 222 a Mersenne prime of sufficient length, the resulting basis to represent the various blocks of incoming data. For a length of N=31, corresponding to P=5, it was found that the block length did not produce bases which would adequately represent text-type data. However, for lengths of N=127, corresponding to P=7, bases could adequately represent text-type data, such as was found using the code from the computer program appendix. Sequences having greater lengths and which are also Mersenne primes therefore will also adequately represent text-type data.

For the selected Mersenne prime, the characteristic is determined 224 for maximals of the selected length. Preferably, the characteristics are the "proper characteristics" of the maximals of length N. A representative maximal is then constructed 226 for each species, wherein each species is preferably a "proper species" for the maximal. A basis family is then constructed 228 from orthonormal bases generated by all the cyclic shifts of the maximals. The basis family is then stored 230 for use in encoding and decoding data sequences. The basis family can be stored, for example, in an array having labels corresponding to each stored basis, which label can then be used in the encoding process. Alternatively, the properties of the basis can be incorporated into algorithums or equations which can be used to calculate each basis in real time, rather than relying on an array.

Considering the selection of the maximal sequences and orthonormal bases in more detail, a number of maximal sequences can be selected, orthonormal bases generated for each maximal sequence, and the maximal sequences and their respective bases stored for use in data compression or other applications of source representation. For a given maximal sequence, the number of distinct sets or families of bases is the number of distinct divisors of $(2^P−2)/p$. For example, for the Mersenne prime of 127 where the block length N will be 127, p=7, which provides six distinct families of bases, and $(2^P−2)/p=18$ so there are six genera of bases, or six distinct families of bases (six divisors). For each genus of bases, there are 18 versions of the maximal sequence. Each maximal sequence can then have its own set of orthonormal bases, for example 108. Because the first basis is trivial, five of the six families of bases would be used in the embodiment, and there is a group of 90 genera of bases. However, of the six families, the first and last are similar, the second and the second to the last are similar, and so on, so that there are effectively only four different categories or four distinct genera of bases that produce different sets of bases where "p" is 7. As a result, with the four genera, and 18 versions of the maximal sequence, there are 72 bases possible that can be generated. In other words, each distinct basis can be generated into 18 different species that can be generated from the characteristic element in a predictable way. Therefore, there is a technique for generating 72 different distinct orthogonal bases, for any arithmetic sequence of 127 elements.

With 72 sequences or bases, two bits can be used to decide which genus of the four genera is being considered, and five bits can be used to decide which species within the genus is being considered since five bits describes all numbers from 0 to 31. Since 18 is less than 31, a total of 7 bits may be used to describe sequences having 127 bits in the sequence. Therefore, during the encode process, the actual maximal sequences need not be recorded, nor any of the parameters associated with the maximal sequence. The genus and the species are identified so that with the number identifying the genus, and the number identify the species, the pair of numbers can be used to access the library to calculate or generate the correct sequence based on the pair of numbers.

While maximal sequences are particularly suitable for the present application, other groups of orthonormal sequences can be used to achieve the enhanced results of the present invention. For example, incoming data can be segmented into blocks of defined length, and each block then compared to the orthonormal sequences in the library of sequences. The representation for the first data sequence is then output and the next subsequent data sequence compared to the orthonormal bases. When a match is found, the label corresponding to the match is transmitted, and the process continues.

In the preferred embodiment using maximal sequences, however, the bases can be generated for a given maximal sequence. The bases may consist of N vectors, or N sequences, each one of which may be an element in an array of elements. To generate the sequences in the preferred embodiment, each maximal sequence is multiplied by a number and a number is subtracted from each element of the sequence, with the result that the sequence generated has the property that if it is correlated with itself, the correlation is one, and if it is correlated with each of the N shifts of the sequence, the correlation is 0. The shift may be a shift of any positive number of positions. The adjusted sequence then forms orthonormal bases which can be used to represent all arithmetic sequences that are of the length N. This process is followed for all of the maximal sequences, in the preferred embodiment, for a given Mersenne prime having the form $(2^p-1)$. For all bases or all sequences of a fixed length, the same set or pair of numbers are used to multiply the numbers in each sequence and subtract in each sequence. The formula is provided herein, in the context of converting the collection of cyclic shifts of a maximal to an orthonormal basis.

Figure 12:
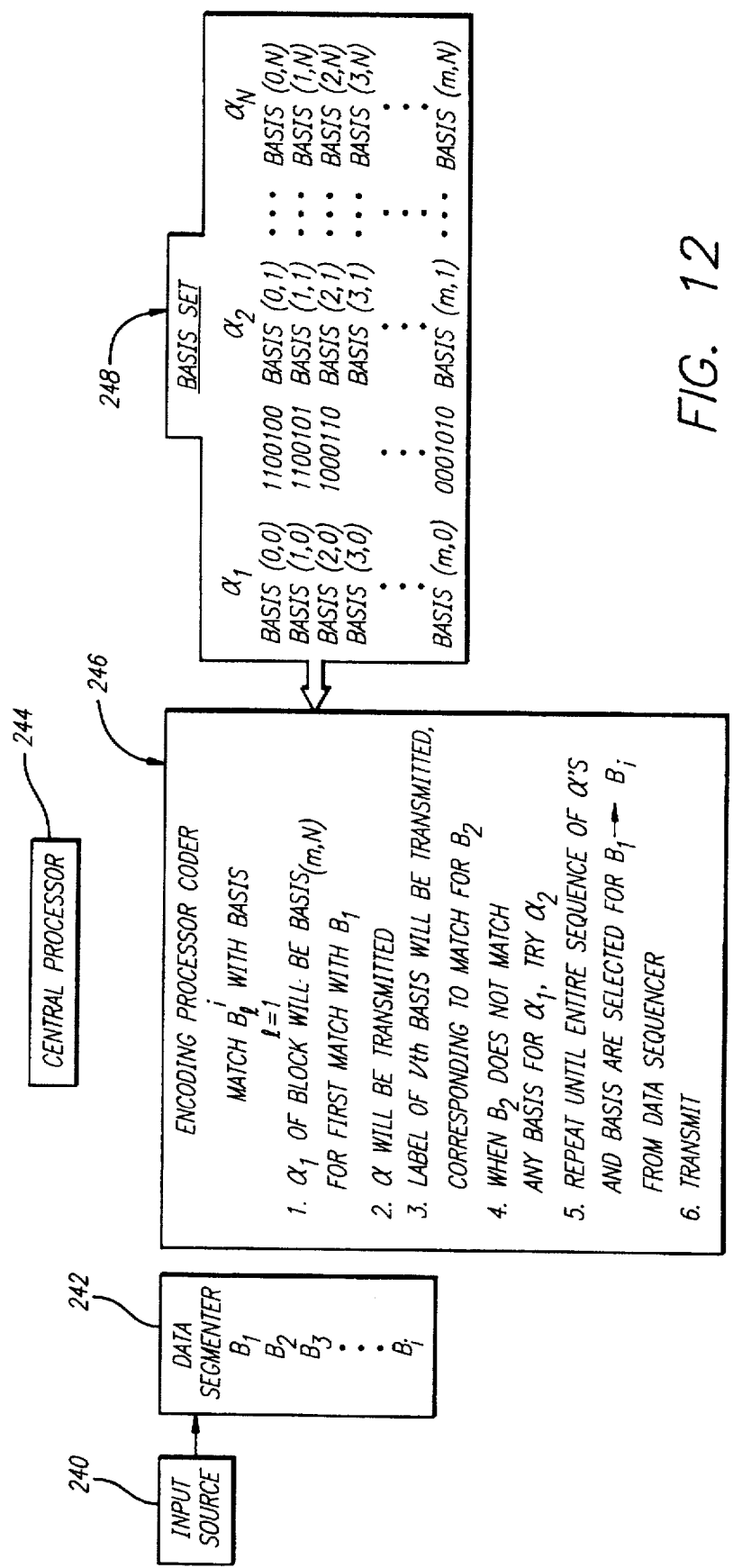
FIG. 12 is a schematic block diagram depicting functional and logical elements used with one aspect of the present invention for processing incoming data.

FIG. 12 shows a logical block diagram of a processor for carrying out one preferred form of the invention. Specifically, the input source 240 provides incoming data to the data segmenter 242 which segments the data into blocks $B_1, B_2, B_3 \ldots B_i$. Segmentation and input of the data is carried out under the control of the central processor 244. The encoding processor or coder 246 tries to match each data segment with a basis in the basis set 248, which contains the bases derived from the maximal sequences, or in other embodiments will contain the orthonormal sequences generated as desired. Preferably, the bases in the basis set 248 are developed beforehand and either stored or otherwise retained in the basis set for use or calculation for the encoding processor 246.

The foregoing description and computer code of the particular apparatus and method used to implement the prototype of one aspect of the present invention is a specific implementation, and the method and apparatus of the present invention also can be implemented in a number of different ways. While the prototype version uses particular steps which may not necessarily be carried out in every implementation, such as conversion from Binary to Ascii, a more general approach will be described below. While the implementation of the invention in the prototype transmitted the original representation of the first block of data as the input data sequence itself, for example, a more general approach may transmit a representation of the first input data sequence, rather than the actual sequence itself. Other variations will become apparent from consideration of the following description.

After considering the development and equations provided herein, it will be apparent that use of orthonormal sequences, and specifically the maximal sequences, for source or data representation can be approached in a number of ways. For example, the processes of the present invention can be used to achieve the same result whether the systems or computers create the bases stored as zeros and ones or whether the bases are stored with plus ones and minus ones or whether the orthonormal sequences are stored as characteristics of the sequences. The same end result can be achieved through manipulations of either of the combinations. The particular combinations used in the process may depend on the application, the hardware being used, the desire to speed up processing and any limitations or benefits provided by particular storage arrangements, for example. Generally, the index of the basis identifies the characteristic, and it generates the maximal sequences, and it can generate the bases. The maximal sequence can generate the bases or identify the bases. However, as will be apparent, storing characteristics and transmitting indices of the characteristics lead to particularly attractive benefits in that the indices for the characteristics of maximal sequences are relatively short, in terms of bit length. Specifically, the index of the basis is the index of the maximal, which is the index of the characteristic that generates the maximal, uniquely. Therefore, the amount of data used to transmit a label is quite small.

Given the number of different methods which can be used to carry out the present invention, the particular form of hardware used will vary depending on a number of factors, previously discussed, such as memory size, calculation time and the like. Therefore, a particular form of hardware will not be unique to the present invention, and the present invention can be implemented in any number of methods and using a wide variety of hardware, including hardware other than computers and processors. Therefore, the invention is not limited to any particular form of hardware implementation.

Figure 13:
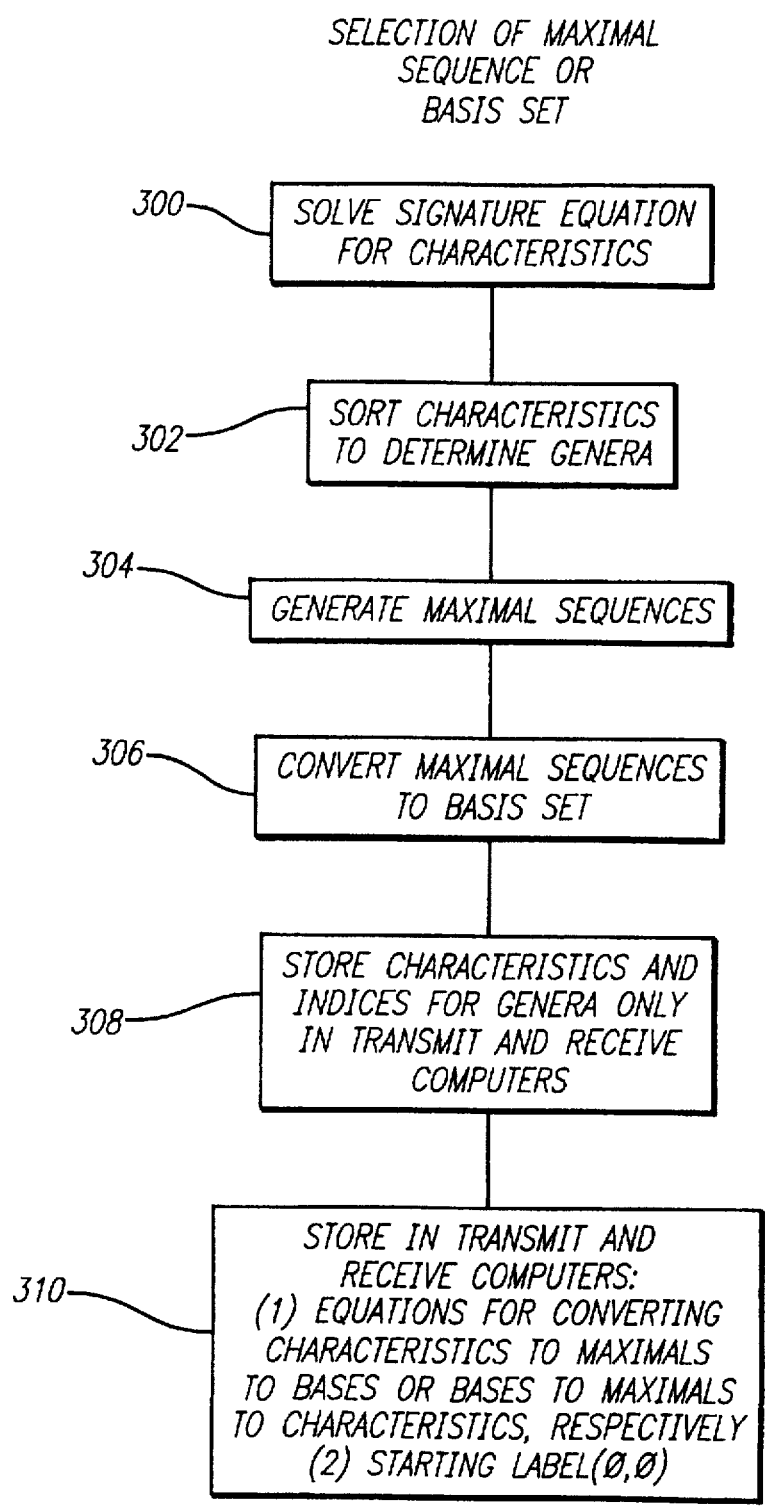
FIG. 13 is a flow chart depicting steps used in the preferred embodiment for selecting maximal sequences for a basis set to be used for the source representation and resynthesizing data.

Considering a general method for source representation (FIG. 13), selection of orthonormal sequences is preferably carried out using maximal sequences or a basis set derived from one or more maximal sequences. In the preferred embodiment, the signature equation, set forth more fully below, is solved 300 for the characteristics for a series of maximal sequences. The conditions are also set forth more fully below. In the particular embodiment where the block length N equals 127, for p=7, the characteristics have a length 18. The characteristics developed from the signature equation are then analyzed and those equations which satisfy the criteria set forth below with the signature equation are then used to form the genera of characteristics. The number of general distinct solutions of the signature equations is modL, as shown herein. The characteristics are then sorted 302 to find the genera to be stored for use in the method of the present invention. It should be noted that the steps of the process depicted in flowcharts herein can be carried out separately or as combinations of steps, and the combination of what may be more than one step in a single block in a flow chart does not mean the steps necessarily occur concurrently or in the same part of a processor, and vice versa.

The maximal sequences corresponding to the characteristics are then generated 304 using the equation for generating maximal sequences, preferably in the principal phase using the characteristic, which corresponds to chi of Lambda. The maximal sequences are then converted 306 to a basis set by developing the N−1 cyclic shifts, referred to as the arithmetization transformation. The arithmetization transformations scales the sequences.

The sorted genera of characteristics and their indices are stored 308 in the transmit and receive computers for use in computing or generating the desired maximal sequences and the basis set during the encode and decode processes. It is not necessary to store the maximal sequences or the basis set derived therefrom since the label corresponding to each characteristic uniquely specifies the bases of the basis set. The characteristic can then be used to calculate the maximal sequences and the corresponding bases for purposes of carrying out the encode and decode steps. As discussed above, the index of the characteristic provides the maximal sequence and the basis in the bases set. The index of the bases is the index of the maximal which, in turn, is the index of the characteristic that generates the maximal, uniquely. Going from a characteristic or a maximal to a basis is simply a set of linear equations. The equations for converting characteristics to maximals and to bases or converting from bases to maximals to characteristics are stored 310 in the transmit and receive computers, respectively, along with a prearranged starting label or index, preferably zero-zero (0,0). Both the original equations and their inverses may be stored in the receiving and decoding computer, particularly where the receiving computer may generate representations of a sequence from one or more characteristics.

Preferably, the sequences are generated prior to implementation of the data processing system. However, given the flexibility of the equations and the particular procedure which may be desired, other approaches are also possible.

Considering a general encode process, in principal a data block is received at the subject processor and a representation is generated for the data block. A label is recorded, corresponding to the basis used to generate the representation. Preferably, the basis is the zero basis in the genera and species of bases. The representation is calculated from the data block relative to the selected basis. The next data block is then received and the representation for the first data block is used with the other bases from the basis set to see if the first representation relative to the same or any of the other bases in the basis set provides the second data block. If the same representation provides the data block, a code may be output indicating that the same representation provides the second data block. Alternatively, a label or value for v can be output indicating that the second data block is the same as the first data block. The process is then repeated. The representation, in the preferred embodiment where the block length N equals 127 and p=7, is a sequence of 127 bits identifying the representation of the first data block relative to the 0th basis in the basis set. The transmitter may then output the original data sequence from the first data block or output a representation for the first data block. The label corresponding to the second data block can then be output. The decoder can use the representation for the first data block and the label for the second data block, corresponding to the genus and species of the characteristic used to generate the basis corresponding to the second data block in the encoder or transmitting computer, to then synthesize or decode the representation and the label to generate the data sequence originally input to the transmitter. The representation first received will give the first data block, and the representation and the label will lead to the generation in the receiving computer of the second data block. The process then continues.

Figure 14:
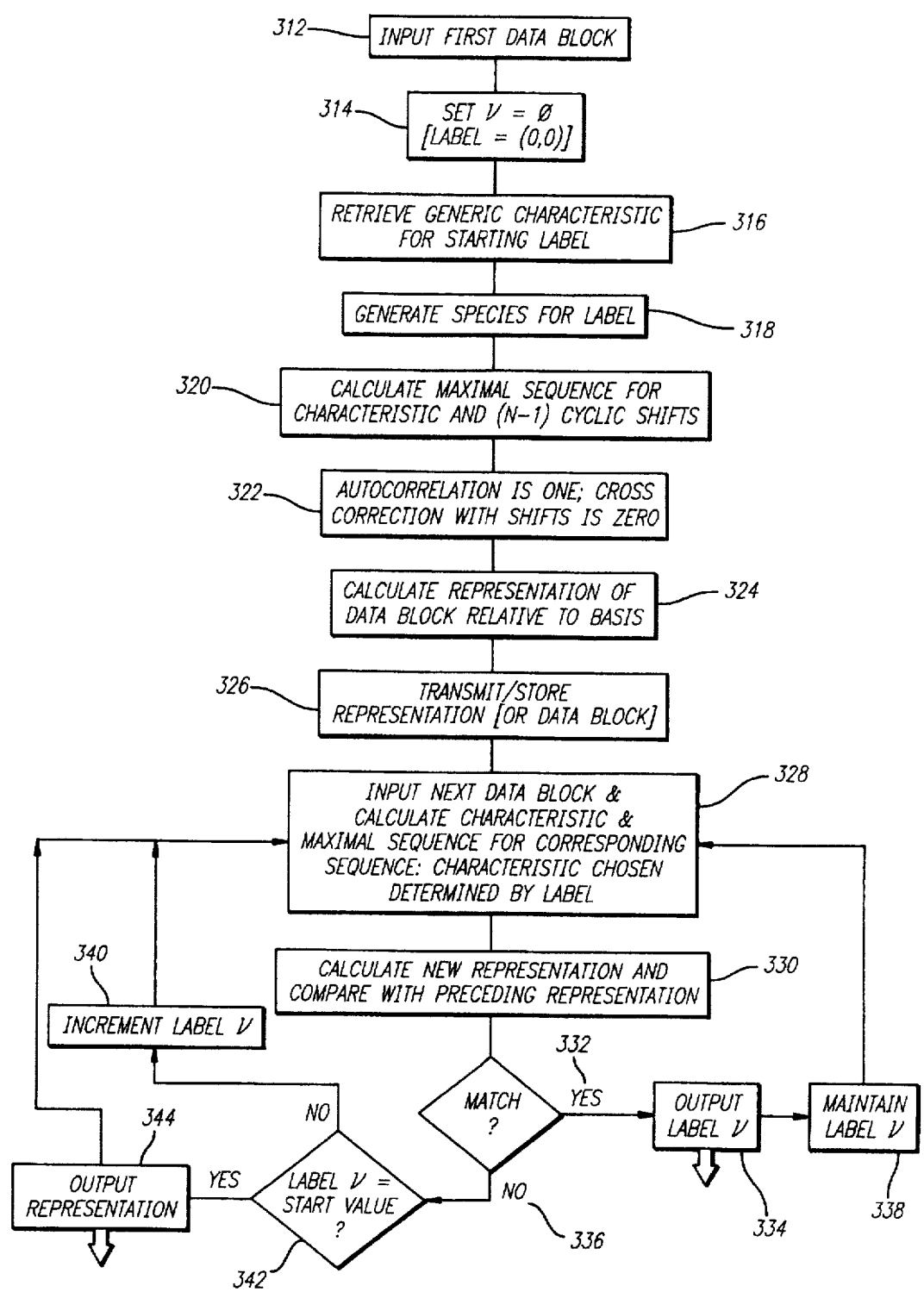
FIG. 14 is a flow chart depicting steps used in a process for encoding data using the maximal sequences or basis set.

Specifically, the first data block is input 312 (FIG. 14) and the label or v is set 314 to zero. The generic characteristic corresponding to the starting label is then retrieved 316 and the particular species of basis is generated corresponding to the label. As discussed elsewhere, the label is preferably two numbers, one corresponding to a designation of the particular generic characteristic, the other corresponding to a particular species of characteristic. Data processing is enhanced since the label may include as few as 7 bits.

A maximal sequence for the selected characteristic and its (N−1) cyclic shifts are calculated 320 to determine a basis. Each basis sequence is autocorrelated and cross correlated 322 and a representation of the data block relative to the selected basis is calculated 324. For the first data block, the representation is stored for subsequent use and also transmitted, in the particular embodiment for data transmission, to a receiving computer or processor. Alternatively, as mentioned herein, the representation need not be transmitted but the incoming data block transmitted instead. (The receiving computer then would receive the transmitted data block and calculate the corresponding representation from the characteristic designated by the label, which is pre-designated as starting at (0,0).

The next or second data block is then input 328, and a characteristic is calculated and a maximal sequence is generated corresponding to the second input data block. The characteristic chosen is determined by the current state of the label. A new representation is calculated 330 and compared with the preceding representation or, alternatively, the basis generated for the second data block is compared with the representation for the first data block to see if the basis for the second data block and the representation for the first data block provide the second data block. If there is a match 332, the label v is output 334 and the value for the label v is maintained as the encode processor returns to the input block 328 step for further processing.

If no match is found 336, the label v is evaluated to determine if all of the basis sequences have been processed so that the label v has returned by that time to the start value. If more bases remain to be analyzed, the label v is incremented 340 and the encode processor returns to the input step 328. If the label v does equal the start value, then all the basis sequences to be used have been exhausted 342, and the current representation corresponding to the current data block being analyzed is output 344 and the encode processor returns to the input step 328. The process repeats until the end of the file is reached.

The data from the encoding processor may be stored for future transmission or transmitted continuously. The data is then received and processed (FIG. 15) in the decode processor or computer. Specifically, a data block is received 346 and the receiving processor determines 348 whether or not the data represents a representation or an actual data sequence. If the data block represents 350 a representation or a sequence, the representation is stored 352 or, if the data block is a sequence, a representation for the sequence is calculated and stored in the receiving processor. The representation is used to regenerate or synthesize the data sequences. Because the decoding processor receives the first data block and assigns the label (0,0) the decoding processor can calculate a representation on its own. The label is also set to the current label. Where the received data block is the first data block, the label corresponds to the original starting label prearranged for both the transmitting and the receiving computer. Where the decode processor has previously processed data blocks, the label will correspond to the current value of the label last received from the transmitting computer.

The decode processor then calculates 354 a sequence from the representation and determines a basis for the given label. The basis is output for use in recreating the original input data sequence input to the transmitting computer. Where the data block received by the receiving computer is in the form of the original data sequence, as opposed to a representation thereof, the decode processor simply outputs the actual sequence. The decode processor then awaits receipt 346 of a further data block.

If the incoming data is not 356 a representation or a sequence, the incoming data block corresponds to a label. The decoding processor then applies 358 the label to determine which genera and which species of characteristic can be used to calculate a basis corresponding to the label and generate a sequence from the basis and the representation. The sequence is then output as a part of the regenerated or decoded data file. The output sequence is combined with other output sequences to arrive at the data originally input into the transmitting computer.

The decode processor reconstructs the encoded data as an exact, lossless copy of the input originally provided to the transmitting computer since the decode processor has the information necessary to use the representation and the bases to synthesize the original sequences. The process is lossless in the preferred embodiment since perfect agreement is set as the standard for comparison. If there is no perfect agreement for a given data block and the combination of a representation and a selected basis, the original data block is transmitted and no errors occur, but if there is exact agreement, the label is transmitted, and the data is exactly regenerated using the label and the known representation received from the transmitting computer.

The use of characteristics to general maximal sequences and a corresponding basis set can be implemented using one or more sub-routines in well known processors or computers. The encode and decode computers are originally configured by loading the list of characteristics and the equations to be used in generating maximal sequences, and a basis set, as well as in calculating a representation. The computer or processor can then generate the representations and the labels used to compress the data and can also be used to generate the sequence used to synthesize the encoded data to develop the data sequence originally input into the transmitting computer. In the case of datablock length N=127, the encode processor has a list of four genus characteristics, and the decode processor has the same list. Therefore, the encode and decode processors have a common data file and a common set of subroutines used to execute the source representation process. For four genus characteristics, two bits are used to designate the genus characteristic, and for the 18 species, five bits are used to designate the desired species. As a result, the label may have a total of seven bits to uniquely designate the characteristic.

The representation can be generated through a selector matrix or selector algorithms for generating the maximal sequences from the one or more characteristics. The selector matrix may consist of a series of 127-bit vectors, for example, 18 127-bit vectors where the block length N=127. The selector matrix can be used to construct the maximal sequences in the principal phase. Where the selector matrix is in the form of an array, the representation can be multiplied by the selector matrix to arrive at the original sequence, or the original sequence can be multiplied by the transpose of the selector characteristic to arrive at the representation in terms of a maximal sequence.

The label in the form of a genus/species argument allows storage, or listing the characteristics by storing only a reduced set of the characteristics, namely those that are distinct genera. Therefore, for a block length N=127, there are 72 distinct characteristics and 72 possible code libraries. With the 72 distinct characteristics, there are four groups of 18 characteristics, and the groups of 18 are considered species because they are all cyclic shifts of each other, but between genera, the characteristics are different. The characteristics between genera are not shifts of each other. Therefore, instead of storing 72 distinct characteristics, four specific characteristics can be stored. For reconstructing sequences, information about which genus and which shift of that genus or species, manipulation of data is much more manageable.

Principle of Operation

The general principle of operation of the invention is as follows:

A binary data sequence (the input sequence) is analyzed to determine which finite state machine, which may be in the form of an algorithm (sometimes termed the generator algorithm) of a labeled collection of finite state machines (sometimes termed the generator class of algorithms), all of which produce binary data sequences, will produce the input sequence. The label of this selected finite state machine is assigned to the input sequence and is designated the source representation for the input sequence. The input sequence is retrieved as the output sequence by selection, from the generator class of algorithms, of the algorithm whose label is the Source Representation of the input sequence and initiation of operation of this algorithm.

Utilization of Source Representation Data Communication in Data Transmission

If Source Representation Data Communication is utilized as an operational element of a data transmission system in which the Source Representation of the input sequence is itself represented as a binary sequence (the Source Representation Code of the input sequence), and if this Source Representation Code is the sequence actually transmitted, and if the receive element of the system retrieves the input sequence as the output sequence in accordance with the above description of Source Representation Data Communication, then:

Where the input sequence and the Source Representation Code of the input sequence have identical bit timing, the effect of Source Representation Data Communication is that the input sequence is transmitted and its replica output sequence is received with a code-bandwidth transmission factor that is the ratio of the length (number of binary elements or bits) of the input sequence to the length (similarly defined) of the Source Representation Code of the input sequence.

Construction of Generator Classes of Algorithms

An algorithm is a specification of a finite collection of arithmetic processes that produce assignments of numerical values to resultants (outputs) by application of arithmetic operations to numbers that are assigned values of operands (inputs). An algorithm is described by a collection of algebraic equations. For the purposes of this discussion, the complexity of an algorithm is indicated by the number of independent equations in its specification. Algorithms may have intermediate resultants, and some of these may also be intermediate operands; such algorithms are said to be recursive. This concept is also the basis for decomposition and concatenation of algorithms. These last attributes of algorithms are strictly ancillary to this discussion.

Since all members of a generator class of algorithms must produce binary sequences, it will always suffice to consider only binary arithmetic algorithms. That is to say, it will suffice to consider only algorithms whose operands and resultants are binary variables and that are realized by arithmetic processes consisting entirely of binary arithmetic operations, whether formulated as direct or recursive computations. Such algorithms are necessarily reducible to linear functions (disjunctive normal form) of all initial and intermediate operands. Hence:

Any generator class of algorithms is a subclass of the class of all binary arithmetic algorithms.

Every finite binary sequence (in any realization, a Source Representation Data Communication can operate only upon finite sequences) has at least one (trivial) generator algorithm. (For a binary sequence $\{a_n: 1 \leq n \leq N\}$ the trivial generator algorithm is $\{x_0=1; x_n=a_n \cdot x_0: 1 \leq n \leq N\}$.) There consequently exists a generator class of algorithms for any finite sequence, and there is at least one generator algorithm for this sequence that has a minimum number of explicit relations (equations) in its specification. This is a minimal generator of the sequence. The example just given of the trivial generator indicates that any minimal generator of a sequence of length n has at most n +1 independent (non-redundant) equations in its specification.

There consequently exists a generator class of algorithms for any collection of finite sequences. If every member of such a collection of sequences has a representation as an arithmetic combination of elements of some one fixed collection of sequences (a collection of basis sequences), then the minimal generators of these basis sequences form a set of basis algorithms, and all members of the generator class of algorithms for the original collection of sequences can be expressed as algebraic combinations (the basis algorithm synthesis) of the elements of set of basis algorithms. These algebraic combinations are necessarily realized as formulas (the synthesis formulas) consisting of specifications of the corresponding arithmetic combinations of the outputs of the basis algorithms. The complexity or otherwise of these basis algorithm syntheses will clearly depend upon the form of the basis sequence representations of the original collection of sequences.

The set of basis algorithms is an algebraic structure common to all generator algorithms for the given collection of sequences. This set of basis algorithms can be minimized by discarding those basis algorithms that can be synthesized using other basis algorithms; the basis algorithm syntheses of the elements of the generator class of algorithms can then be restated in terms of this minimal set of basis algorithms. The basis algorithm syntheses can also be reduced in complexity by the elimination of redundant terms. Application of these steps will produce a minimum basis algorithm synthesis for each generator algorithm, but there is in general no guarantee that this minimum synthesis will be unique; there may be several valid minimum syntheses for a given generator algorithm. Notwithstanding this fact, specification of any minimum basis algorithm synthesis of a particular generator algorithm will uniquely identify the binary sequence produced by that generator. The details of specification of the elements of the basis generator class of algorithms are unnecessary to this identification if the objective of identification is restricted to selection only from among the original collection of sequences; all of these sequences have the same set of basis generators and differ only in their basis algorithm syntheses.

The previous discussion provides the basis for the identification and exact reconstruction of each of the original sequences:

For any collection of binary sequences, and for any collection of basis sequences for this collection, Each sequence of this collection completely specifies its representation in terms of the basis collection;

Each such basis representation completely specifies a corresponding synthesis formula;

Each such synthesis formula completely specifies a generator algorithm for the original sequence.

The original sequence is retrieved by execution of the generator algorithm.

Summarily, any basis representation of the original sequence specifies a synthesis formula, and any such synthesis formula enables retrieval of the original sequence.

Universal Basis Sequence Collections

The mathematical theory of basis structures is extensively developed, and can be considered well-known to anyone "skilled in the art" of mathematics. Arithmetic computational processes involving binary numbers are implemented by the use of the ival ("integer value") function that maps binary numbers onto their symbolically corresponding real integers:

$$ival(x) = 1 \text{ (real number)} \quad \text{when } x = 1 \text{ (binary number)};$$
$$= 0 \text{ (real number)} \quad \text{when } x = 0 \text{ (binary number)}.$$

The function inverse to ival is designated $ival^{-1}$ and is defined in the conventional manner.

The theoretical basis for Source Representation Data Communication is developed in terms of a second pair of mappings designated aval ("arithmetic value") and bval ("binary value"):

$$aval(x) = +1 \text{ (real number)}, \quad \text{when } x = 0 \text{ (binary number)};$$
$$= -1 \text{ (real number)}, \quad \text{when } x = 1 \text{ (binary number)}.$$

This function is defined for binary numbers and takes on the real number values +1 and −1. The bval function is inverse to aval and is defined by the relations:

$$bval(x) = 1 \text{ (binary number)}, \quad \text{when } x = -1 \text{ (real number)};$$
$$= 0 \text{ (binary number)}, \quad \text{when } x = +1 \text{ (real number)}.$$

This function is defined for the real numbers +1 and −1 and takes on binary number values.

The functions ival and aval are related by two identities:

$$aval(x) = 1 - 2 \cdot ival(x);$$

$$ival(x) = \frac{1 - aval(x)}{2}.$$

The correlation of two binary sequences is a real number that quantifies the degree of similarity of the sequences. Sequence pairs with large absolute correlation values are highly similar, and pairs with low absolute correlation values are highly dissimilar. The value of the correlation function for any two binary sequences is the number of termwise agreements less the number of termwise disagreements. Sequences with zero correlation have exactly as many terms that differ as terms that are the same. Clearly sequences whose lengths are odd numbers cannot have zero correlation; such sequences may exhibit a minimal degree of correlation with correlation values of +1 or −1. Sequences with correlation values of N are termwise identical, and sequences with correlation values of −N are termwise complementary.

The correlation of two binary sequences $\{x_n\}$ and $\{y_n\}$ assumes a very simple form in terms of the aval function:

$$\rho(\{x_n\}, \{y_n\}) = \sum_{n=1}^{N} aval(x_n \oplus y_n)$$
$$= \sum_{n=1}^{N} (aval(x_n)) \cdot (aval(y_n)).$$

The symbol ⊕ designates conventional binary addition.

The correlation of binary sequences, in other words, is the conventional numerical correlation of the arithmetic evaluation of the sequences given by the aval function. If all binary numbers are represented in the Source Representation Data Communication computations by their aval equivalents, then correlations can be implemented with the conventional correlation formulas. Thus:

The implementation of a Source Representation Data Communication is initialized by application of the aval function to replace all input sequences by their arithmetic equivalents, and all Source Representation Data Communication processing is performed using conventional arithmetic operations thereon.

In other words, binary data is represented biuniquely as sequences of +1 and −1 numbers. This representation is to be understood throughout the remainder of this presentation; the aval notation will be suppressed, and binary data sequences will be treated as sequences of real numbers having values +1 and −1. The formula for the correlation function is then simply $$\rho(\{x_n\}, \{y_n\}) = \sum_{n=1}^{N} x_n \cdot y_n.$$

In the standard theory, basis collections are orthonormal (orthogonal and normal), that is, the correlation of two basis sequences has the value 0 (orthogonality) if the sequences are distinct, but has the value 1 (normality) if they are identical. Normality is easily achieved for any sequence by multiplicative scaling, but orthogonality requires some calculation effort if the candidate collection does not already have this property. The Gram-Schmidt process will convert any collection of candidate basis elements into an orthonormal collection, but if the collection has ab initio a common correlation value, this process reduces to a simple arithmetic scaling. Since the Gram-Schmidt process in general requires on the order of $N^2$ computations to orthogonalize N sequences of length N, it will materially simplify a Source Representation Data Communication to start with a collection of sequences that have some small common correlation value.

A maximal sequence and its termwise cyclic shifts are a strong candidate for this selection; the proper mutual correlations of such a collection of sequences all have the same minimum value (0, +1, or −1). The disadvantage of this selection is that maximal sequences are structurally complicated except for the sequences whose lengths are Mersenne primes, that is, for lengths N that are prime numbers and that have the form $2^p-1$. (p must also be prime for such an N to be prime.) Mersenne primes have been found of such large magnitude that a requirement that the sequences to be considered be of Mersenne prime lengths is not a practical restriction on any Source Representation Data Communication that depends on such an assumption.

The formal statement of maximality is as follows:

$$\{m(n)=\pm 1: n=0, 1, 2, \ldots, N-1\}$$

is a maximal sequence if and only if $$\sum_{n=0}^{N-1} m(n \bmod N)m((n+k) \bmod N) = N \quad \text{when } k=0$$
$$= -1 \quad \text{when } k \neq 0$$

It follows readily that $$\sum_{n=0}^{N-1} m(n) = \pm 1;$$

Trivial replication of complements is avoided by uniform choice of the negative option.

The collection of cyclic shifts of a maximal $\{m\}$ is converted to an orthonormal basis (relative to the metric generated by the correlation operation) by a linear arithmetic transformation; if $\{m\}$ is any element of the collection, its corresponding orthonormal basis element is $$\overset{o}{m}(n) = \frac{1}{\sqrt{N+1}} \left( m(n) - \frac{1}{1+\sqrt{N+1}} \right)$$

Shifted versions of m produce shifted versions of $\overset{o}{m}$. This procedure is referred to here as the arithmetization transformation. Its inverse is:

$$m(n) = \sqrt{N+1} \ \overset{o}{m}(n) + \frac{1}{1+\sqrt{N+1}}$$

The N sequences $\{\overset{o}{m}\}$ are orthonormal, as is readily verified by direct calculation of their correlations, and therefore any sequence of N real numbers can be represented uniquely as a linear combination of shifts of $\{\overset{o}{m}\}$. For any Mersenne prime N and any selection of a maximal sequence $\{m(n)\}$, the shifts of this maximal therefore generate a universal basis for representation of all numerical sequences of length N; the computational processes of the representation are implemented in principle by application of the inverse arithmetization transformation just described to the conventional orthogonal basis computations. In summary:

When N is any fixed Mersenne prime, a single maximal sequence of length N and its N−1 cyclic shifts comprise a universal basis for all sequences of N real numbers.

The maximals of a given length have structural properties that separate them into properly and trivially distinct species; when N is a Mersenne prime, the number of properly distinct species of maximals is (N−1)/p. The distinction between "proper" and "trivial", in the mathematical sense, is well understood and is therefore not discussed in detail here; the properly distinct species are structurally related in such a way that the transformations from one such species to another form an Abelian group, that is, these transforms are all iterations of a single transform.

The binary version of each such species of maximal of Mersenne prime length $2^p-1$ is generated by a binary shift register of length p; the arithmetic version of this binary generator algorithm is $$m(n) = \prod_{k=0}^{N-1} \frac{1}{2} ((a(k)+1)m(n-k \bmod N) + (a(k)-1))$$

in which the numbers $\{a(k)\}$ have either the value +1 or −1 and are parameters that completely determine the species of the maximal. Various combinatorial equivalents of this expression are useful for calculations, but this representation is used as stated in the implementation of Source Representation Data Communication computational algorithms. For Source Representation Data Communication, the salient features of all these formulas are, firstly, that, as noted, a complete universal basis representation is produced using exactly one maximal, and secondly, that any such maximal requires specification of only p–$\log_2$ N binary numbers $\{a(k): 1 \leq k \leq p\}$. Since any realizable finite sequence (one that could conceivably be recorded by some means) can be embedded in a sequence of Mersenne prime length, it follows that:

A universal basis can always be constructed for a collection of sequences of realizable length N that requires no more than $p \leq (1+\log_2 M^{[N]})+1$ binary numbers for its complete specification, where $M^{[N]}$ is the smallest Mersenne prime that is not less than N.

Partitions of Collections of Sequences Generated by Universal Basis Representations It can be shown that every cyclic shift of a maximal sequence is also maximal, and the collection of all maximals of a given length N is thereby sorted into disjoint subcollections of maximals that are equivalent in this sense, i.e., any two elements of such a subcollection are not only maximal sequences, but they are also cyclic shifts of each other. Maximal sequences belonging to different subcollections are essentially different in that no cyclic shift operation can possibly make them identical. These subcollections are referred to as species of maximals, and the structural differences among species are in general very complicated and difficult to describe quantitatively. When N is a Mersenne prime, however, the several species of maximals of length N are constructively defined by a binary-valued function $\chi(s)$ whose domain is the non-negative integers mod (N–1)/p. This function is referred to as the characteristic or signature of the species, and it specifies the distribution of signs in the binary arithmetic form of any maximal. The characteristic is constrained by the relation $$\sum_{s=0}^{\frac{N-1}{p}-1} \chi(s) = 0$$

Not all possible such binary functions are characteristics, but any cyclic shift of a characteristic is also a characteristic. The cyclic shift operations on characteristics form an Abelian group since all cyclic shifts are iterations of the cyclic shift that advances every term by exactly one position. There is always at least one characteristic that is maximal relative to this Abelian group, i.e., for which $\chi(s+v \bmod N) \equiv \chi(s)$ for all s only when v is a multiple of (N–1)/p. This characteristic and its (N–1)/p–1 cyclic shifts will be referred to as the proper characteristics of the maximals of length N and the corresponding species as the proper species of those maximals. Given a specification of the characteristic of any one of the proper species of maximals of a fixed Mersenne prime length N, all proper species of such maximals can be fully identified by specification of only the shift index v, whose domain is simply the integers mod (N–1)/p.

The structure described above is a specific implementation of the general situation that arises when the standard basis representation methods are applied to any collection of distinct but equivalent bases. The parameter v in general merely identifies which basis of the collection is under consideration; its structural significance in the maximal species case is extremely useful but remains peculiar to the maximal basis situation. In general, then, let B denote a finite collection of distinct bases for binary sequences of length N. Let L=|B| denote the number of bases in B, and let the elements of B be given any fixed order. Label the elements of B by this ordering:

$$B = \{b(v): v=0, 1, 2, \ldots, L-1\}.$$

Here b(v) is a basis set, and consists of N sequences of N real numbers:

$$b(v) = \{\{b(n, k; v): n=0, 1, 2, \ldots, N-1\}: k=0, 1, 2, \ldots, N-1\}.$$

In the maximal-sequence implementation described above, b (n, k, v) is the $n^{th}$ coefficient of the k-term cyclic shift of a maximal sequence of species v, and L is equal to (N–1)/p. Any binary sequence a (·) (actually, any sequence) has a unique basis representation in terms of each one of these bases:

$$a(n) = \sum_{k=0}^{N-1} \alpha(k; v) \cdot b(n, k; v).$$

If now a given sequence a(·) has basis representation coefficients $\{\alpha(k): 0 \leq k \leq N-1\}$ relative to a specific basis, say b(0), any of the related sequences $$a(n; v) = \sum_{k=0}^{N-1} \alpha(k) b(n, k; v)$$

can be generated from only a specification of the basis index v. It is evident that all such sequences have a common basis representation $\alpha(\cdot)$ and differ only in the selection of the basis b (v) used for their reconstruction from this common basis representation. The totality of possible N-term representations therefore creates a basis representation partition of the collection of all sequences of length N, and the structure of this partition depends entirely on the family B of basis collections. A basis representation partition consists of disjoint collections of sequences, and specification of any sequence of a given partition requires only specification of its unique basis index v. In summary:

Any finite ordered family B of orthonormal bases partitions the totality of sequences of a fixed length into disjoint collections of sequences with a common basis representation; any sequence is completely identified relative to the partition to which it belongs only by specification of the order index of its associated basis.

Operational Analysis Procedures for Source Representation Data Communications

The various details of the preceding discussions are assembled and exploited in a description of the general analysis method of a Source Representation Data Communication as follows:

An ordered family B of N-term orthonormal bases is specified.

An input bit stream is segmented into sequences of common length N.

A specific basis is selected and the basis representation of the first of these input sequences in terms of the selected basis is computed. Each subsequent input sequence is compared with all the sequences of the partition generated by the basis representation found for the first input sequence, and if a termwise match is found, the index of the corresponding basis is recorded as the representation number for that particular sequence. When no match is found, a new basis representation is computed and the above process is repeated.

Generic Implementation of a Finite-State Source Representation Data Communication Process When the common-basis-family method described above is used to implement Source Representation Data Communication, the partitions of sequences of length N created by the basis representations are independent of the organization of the basis family (construction and order); they depend only upon the input sequence. These partitions were seen to be uniquely labeled by the N-term sequences identified as basis representations and the prior selection of a $0^{th}$ basis. The basis representations are therefore independent of the history of the particular Source Representation Data Communication being implemented, and so constitute state variables for the system. Since, in this case, both analysis and synthesis processes are linear (the orthonormal basis representation and reconstruction equations are linear), this implementation of Source Representation Data Communication is in fact a linear finite-state system, and since the input sequence is the only input to the system (there are no control inputs), the system is a linear finite-state automaton. These types of systems have been extensively studied and a very considerable mathematical infrastructure (including software realizations) exists in the published literature.

A specific realization of Source Representation Data Communication can be constructed without this degree of elaboration, however; the initial step consists of the selection of a Mersenne prime of sufficient length (e.g., preferably, at least $2^{13}-1=8191$ with 630 species of maximals, or $2^{31}-1=2147843647$ with 69273666 species of maximals), computation of the characteristic for maximals of that length, and construction of a representative maximal of each species. The basis family then consists of the orthonormal bases generated by all the cyclic shifts of these maximals. The remaining steps are generic:

For a fixed family of orthonormal bases B the generator class of algorithms consists of all linear combinations of the basis elements from single basis sequence collections of B. The synthesis formulas in this case are specifications of the members of the family of bases. If the sequence length is a Mersenne prime, the synthesis formulas can be reduced to generator algorithms for the maximal sequences of length N. The source representation of any input sequence consists of successive blocks of binary data that include the initializing basis representation followed by a sequence of basis indices.

Estimation of the Number of Bits of Information Required for a Generic Source Representation Data Communication For a preassigned block sequence length N, the Source Representation Code for R blocks of input data as described in section 7 above consists of N strings of N binary numbers (the binary form of the basis representation of the first block) followed by R−1 basis indices which are numbers from 0 to L−1, L being the number of distinct bases in the family B. The number of bits required to specify the basis representation is $N^2$, and the number of bits required to represent a basis index is $\log_2 L$; the number of bits required to represent R blocks of input data is then $$N^2+(R-1)\log_2 L.$$

The number of bits required to represent R blocks of N binary numbers is RN; the ratio of these numbers is $$\frac{N^2+(R-1)\log_2 L}{RN} = \frac{N}{R} + \left(1-\frac{1}{R}\right)\frac{\log_2 L}{N},$$

which reduces to N as required when R=1, but which is asymptotically $$\frac{\log_2 L}{N}$$

when R>>N.

When N is a Mersenne prime, $N\sim 2^p$, and $L\sim 2^p/p$, so that this ratio becomes $$\frac{p-\log_2 p}{2^p}.$$

and clearly the effective code-bandwidth factor (the reciprocal of this ratio) is not bounded when the input sequence is such that the blocks of length N remain in a single partition.

Constructive Definitions of the Species of Maximal Sequences The Residue Class Mod N for Mersenne Primes A Mersenne prime is a prime number N of the form $2^p-1$. The integer p is the order of a multiplicative subgroup of the residue class mod N, and the integer L=(N−1)/p (N−1 is divisible by p if N is a Mersenne prime) is the order of a multiplicative subgroup of the residue class mod N; this second subgroup is isomorphic with the quotient group of the residue class mod N relative to the first subgroup. The integer 2 is a generator of the subgroup of order p, and there can always be found an integer g that generates the quotient group, i.e., such that $g^\lambda=1$ mod N $\Leftrightarrow \lambda=L$ or 0. Then every element of the residue class mod N is either 0 or uniquely of the form $g^\lambda \cdot 2^\rho$ for some $\lambda$, $\rho$ subject to $0\leq\lambda\leq L-1$, $0\leq\rho\leq p-1$. $\lambda$ is a member of the residue class mod L and $\rho$ is a member of the residue class mod p.

Sign Invariance of Maximals Relative to the Generator 2 Subgroup and the Characteristic By employment of known combinatorial methods, it can be established that for any maximal sequence $$\{m(n): 0\leq n\leq N-1\}$$

of Mersenne prime length N, there exists a fixed member k of the residue class mod N such that $$m((n+k) \bmod N)=m((2n+k) \bmod N), n=0, 1, \ldots, N-1.$$

This result is referred to as the "2's sampling" property of maximals. When k=0, the maximal m is said to be in its principal phase. Since the above relation will also be satisfied by the complement of any sequence that satisfies it, it is customary to achieve uniqueness by the additional requirement that m(0)=−1 for principal-phase sequences.

In terms of the residue class representation explained above, the 2's sampling property states the invariance of the sign of principal-phase maximal sequence elements over the generator 2 subgroup of its index set; $m(2^\rho g^{80})$ is a function of $\lambda$ alone. This function of $\lambda$ is the characteristic of the sequence $\{m\}$;

$$m((2^\rho g^\lambda) \bmod N)=\chi(\lambda), \lambda=0, 1, \ldots, L-1.$$

Since the product representation of the index n excludes only n=0, it follows that $$\sum_{n=1}^{N-1} m(n) = \sum_{n=0}^{N-1} m(n) - m(0) = (-1) - (-1) = 0$$

$$= \sum_{p=0}^{p-1}\sum_{\lambda=0}^{L-1} m((2^p g^\lambda) \mod N) = \sum_{p=0}^{p-1}\sum_{\lambda=0}^{L-1} \chi(\lambda)$$

$$= p \cdot \sum_{\lambda=0}^{L-1} \chi(\lambda).$$

The conclusion is that $$\sum_{\lambda=0}^{L-1} \chi(\lambda) = 0.$$

Construction of Maximal Sequences in Principal Phase

The characteristic is specified above in terms of the coefficients of its maximal sequence. This specification can be phrased so as to exhibit the coefficients in terms of the characteristic; the device used is the Kronecker delta ($\delta(\cdot)$) defined to have the value 1 only when its argument is zero, and to have the value zero otherwise:

$$m(n) = -\delta(n) + \sum_{\lambda=0}^{L-1}\sum_{\rho=0}^{p-1} \delta(n - 2^\rho g^\lambda) \mod N)\chi(\lambda).$$

The defining equation for the characteristic is derived from the correlation condition for maximal sequences: upon substitution of the above formula into the correlation equation for maximal sequences, there results $$r(k) = \sum_{n=0}^{N-1} m(n)m((n+k) \mod N) = (N+1)\delta(k) - 1$$

(defining condition of maximal sequence)

$$= \delta(k)\left(1 + p\sum_{\lambda=0}^{L-1} \chi(\lambda)^2\right) +$$

$$(1-\delta(k))\left(-\chi(\lambda) - \chi\left(\left(\lambda + \frac{L}{2}\right) \mod L\right) +\right.$$

$$+ \sum_{\lambda_1,\lambda_2=0}^{L-1}\left[\sum_{\rho_1,\rho_2=0}^{p-1}\delta((1 - g^{\lambda_1 2^{\rho_1}} - g^{\lambda_2 2^{\rho_2}}) \mod N)\right] \times$$

$$\times \chi\left(\left(\lambda_1 + \frac{L}{2} + \lambda\right) \mod L\right) \chi((\lambda_2 + \lambda) \mod L)\right).$$

When k is not zero, it has the form that characterizes the elements of the multiplicative group on the non-zero elements of the residue class mod N; thus, $k = g^{80} 2^p \mod N$ and the value of $\lambda$ in the last expression is that found in this representation of k. Note that the characteristic $\chi(\lambda)$ has only the values +1 and −1, and so the sum in the term involving $\delta(k)$ has the value L and that portion of the formula therefore reduces to N as required when k=0.

The expression in square brackets depends only upon the structure of the residue class mod N, and so its computation is a primitive step in the formula: let $$X(\lambda_1,\lambda_2) = \sum_{\rho_1,\rho_2=0}^{p-1} \delta((1 - g^{\lambda_1 2^{\rho_1}} - g^{\lambda_2 2^{\rho_2}}) \mod N);$$

then the equation $$-\chi\left(\left(\lambda + \frac{L}{2}\right) \mod L\right) - \chi(\lambda) +$$

$$+ \sum_{\lambda_1,\lambda_2=0}^{L-1} X(\lambda_1,\lambda_2)\chi\left(\left(\lambda_1 + \lambda + \frac{L}{2}\right) \mod L\right) +$$

$$\chi((\lambda_2 + \lambda) \mod L) = -1$$

is the defining equation of the characteristic (also called the signature equation). The solutions are sequences of +1, −1 values when suitably normalized, and those that replicate themselves only under cyclic shifts of L steps are the characteristics of the proper species of maximals. There are in general only L such solutions of this equation, and they are all cyclic shifts of each other. Each such solution produces a species of maximal sequence in principal phase from the defining relation stated first above in this subsection.

Computation of the Quotient Group Generator g

The range of the numbers $n^p \mod N$, n being the non-zero elements of the residue class mod N, consists of powers of the quotient group generator g. The quotient group is of order L, and so the powers mod N from 0 to L−1 of these numbers are all the powers of the quotient group generators. From this collection of numbers it is straightforward to select the primitive roots of $g^L = 1$. (These are the numbers g such that $g^{80} = 1$ only when $\lambda = L$.) Any of these will suffice for execution of the procedures exhibited above; the smallest is generally easiest to use.

The following relations exhibit the number-theoretic basis for these remarks:

$$2^p = 1 \mod N;$$
$$n = g^{\lambda} 2^p \mod N$$

$$n^p = (g^\lambda 2^p)^p = g^{p\lambda} 2^{pp} = (g^p)^\lambda \mod N;$$
g is a primitive root of $g^L = 1 \mod N$ $g^p$ is a primitive root of $g^L = 1 \mod N$ (p,L are relatively prime);
g is a primitive root of $g^L = 1 \mod N$ $\{g^\lambda \mod N : 0 \leq \lambda \leq L - 1\}$ is a proper Abelian group of order L.

Generic Flow Chart For Source Representation Data Communication

A Source Representation Data Communication Process may consist basically of two independent system processes; one process operates on input sequences and produces representations of them, and the other operates on representations and reconstructs the original input sequences. These two systems are referred to, respectively, as the Analysis System (Encode) and the Synthesis System (Decode). Obviously Analysis is associated with transmission and synthesis with reception. Generic flow charts of these processes are exhibited in FIG. 3; the necessary elements of prior system design are included also. A Basic language computer program listing for a prototype of one embodiment of the present invention follows, and corresponds generally to the system and method described above with respect to FIGS. 6 through 10. The listing represents a set of Basic language routines that are independent as compiled Basic programs on a PC compatible computer suitable for mathematical-type calculations.

63a

```
REM: PROGRAM MXPRMALL; INPUT MERSENNE PRIME EXPONENT P;
REM     CALCULATES
REM         MERSENNE PRIME: M
REM         FACTOR GROUP ORDER: L
REM         P INVERSE MOD L: PINVL
REM         FACTOR GROUP GENERATOR (MINIMUM): FGGEN
REM         FACTOR GROUP (GENERATOR POWERS)
REM         SELECTION MATRIX
REM         CHARACTERISTIC EQUATION KERNEL
REM         "ALL" CHARACTERISTIC SEQUENCES
REM     PARAMETER OUTPUT RECORDED IN FILE MXPRM(P)
REM     FACTOR GROUP RECORDED IN MXFG(P)
REM     SELECTION MATRIX RECORDED IN MXSL(P)
REM     CHARACTERISTIC KERNEL RECORDED IN MXCK(P)
REM     CHARACTERISTICS (ALL, BINARY STRINGS) RECORDED IN MXLCH(P)

OPTION BASE 0
        DEFLNG A-Z
        DECLARE SUB DIVALG (DVDND&, DVSR&, QTNT&, RMNDR&)
        DECLARE FUNCTION BMSNI (A!)
        DECLARE FUNCTION HCF& (A&, B&)
        DECLARE FUNCTION LMOD& (A&, B&)
        DECLARE FUNCTION LEXP& (M&, R&, N&)

CLS

PRINT SPC(13); "MAXIMAL SEQUENCE PARAMETERS "
        PRINT
        INPUT "ENTER MERSENNE PRIME EXPONENT: ", P
        P$ = LTRIM$(STR$(P))

FILE$ = "MXPRM" + P$
REM         FILE FORMAT IS: (P, M, L, PINVL, BPRML, FGGEN)
        OPEN FILE$ FOR OUTPUT AS #1
        CLOSE #1
        OPEN FILE$ FOR APPEND AS #1

REM     MXPL(P) RECORDS FACTOR GROUP INDICES THAT ARE RELATIVELY PRIME TO L
REM     MXFG(P) RECORDS FACTOR GROUP (POWERS OF FGGENS) AS SEQUENTIAL FILE
REM         OF STRING NUMBERS
REM     MXSL(P) RECORDS SELECTION MATRIX AS SEQUENTIAL FILE OF
REM         ROW VECTOR OF ROW VECTORS; VIRTUAL INDICES ARE M
REM         (CHARACTERISTIC-PHASE MAXIMAL SEQUENCE INDEX, >=1), MATRIX ROW #;
REM         INDXFG (FACTOR GP/CHARACTERISTIC SEQUENCE INDEX
REM         FOR M), MATRIX COL #; ENTRIES ARE (0,1)
REM     MXCK(P) RECORDS SYMMETRIC CHARACTERISTIC KERNEL AS L ROW VECTORS
REM         OF L-ELEMENT ROW VECTORS
REM     MXLCH(P) RECORDS CHARACTERISTIC SEQUENCES AS STRINGS*L OF
REM         BINARY NUMBERS; -1, MXSL * SIGNED MXLCHB = MAXIMAL SEQUENCE
REM         IN PRINCIPAL PHASE

PRINT #1, P
        PRINT "P = "; P

REM     PARAMETER COMPUTATION

DIM SHARED TWOPWR(0 TO P - 1)
        TWOPWR(0) = 1
        FOR I = 1 TO P - 1
```

64

```
        TWOPWR(I) = 2 * TWOPWR(I - 1)
        NEXT I

N = 2 * TWOPWR(P - 1)

N = N - 1

PRINT #1, N
        PRINT "N = "; N
        N1 = N - 1
        L = N1 / P

PRINT #1, L
        PRINT "L = "; L

L2 = L / 2

INDXPINVL = 0
        QPRD = 0
mxpc000:
        INDXPINVL = INDXPINVL + 1
        QPRD = QPRD + P
        QPRD = LMOD&(QPRD, L)
        IF QPRD = 1 THEN GOTO mxpc001 ELSE GOTO mxpc000
mxpc001:
        PINVL = INDXPINVL
        PRINT #1, PINVL
        PRINT "P INVERSE MOD L = "; PINVL REM  P INVERSE MOD L (=PINVLS): N OF RESIDUE CLASS MOD N IS PRODUCT OF
    REM        POWER OF TWO AND POWER OF FGGEN; N^P MOD N REMOVES POWER OF TWO;
    REM        N^P MOD N IS AN ELEMENT OF THE EXPONENTIAL REPRESENTATION OF
    REM        THE FACTOR GROUP (N^P MOD N =FGGEN^INDEX MOD N);
    REM        CHIINDX = INDEX*(P INVERSE) MOD L IS POWER OF FGGEN IN
    REM        FACTOR GROUP REPRESENTATION OF N; CHIINDX IDENTIFIES THE
    REM        INDEX OF THE SIGN ELEMENT FOR N IN THE CHARACTERISTIC
    REM        SEQUENCE. P INVERSE IS DEFINED BECAUSE P,L ARE
    REM        RELATIVELY PRIME (P IS PRIME).

FILEPRMLS = "MXPL" + P$
        OPEN FILEPRMLS FOR OUTPUT AS #2
        CLOSE #2
        OPEN FILEPRMLS FOR APPEND AS #2

NDV = 2
        RPRML = 0
mxpc002:
        IF NDV < L THEN GOTO mxpc003 ELSE GOTO mxpc009 mxpc003:
        LH = HCF&(NDV, L)
        IF LH = 1 THEN GOTO mxpc004 ELSE GOTO mxpc005
mxpc004:
        RPRML = RPRML + 1
        PRINT #2, NDV
mxpc005:
        NDV = NDV + 1
        GOTO mxpc002
mxpc009:
```

```
            CLOSE #2
            PRINT #1, RPRML
            PRINT "NO. L-RESIDUES PRIME TO "; L; "(GENERA) = "; RPRML
            PRINT "L-RESIDUES RELATIVELY PRIME TO L RECORDED IN "; FILEPRMLS
    REM     RPRML = NUMBER OF ELEMENTS OF RESIDUE CLASS MOD L RELATIVELY PRIME TO L

REM     FACTOR GROUP GENERATOR COMPUTATION

REM     PTH POWERS OF RESIDUES

N = 0
mxpc0:
            N = N + 1
            IF M < N THEN GOTO mxpc01 ELSE GOTO mxpc02
mxpc02:
            PRINT "FACTOR GROUP GENERATOR NOT FOUND"
            END
mxpc01:
            NPWR = 1
            FOR I = 1 TO P
            NPWR = NPWR * N
            NP = LMOD&(NPWR, M)
            NPWR = NP

NEXT I

REM     POWERS OF NPWR; COMPUTE EULER INDEX OF NPWR

K = 0
            CGEN = 1
mxpc2:
            K = K + 1
            IF K < L THEN GOTO mxpc3 ELSE GOTO mxpc10
mxpc3:
            CGEN = NPWR * CGEN
            CG = LMOD&(CGEN, M)
            CGEN = CG
            IF CGEN = 1 THEN GOTO mxpc0 ELSE GOTO mxpc2 mxpc10:
    REM     FGGEN IS MAXIMAL SOLUTION OF EULER EQUATION

FGGEN = NPWR

REM     COMPUTE FACTOR GROUP

FILE2S = "MXFG" + LTRIM$(STR$(P))
mxpc12:
            OPEN FILE2S FOR OUTPUT AS #2
            CLOSE #2
            OPEN FILE2S FOR APPEND AS #2

FGGENPWR = 1
            FGGENINDX = 0

PRINT #2, FGGENPWR
mxpc11:
            FG = FGGENPWR * FGGEN
```

66

```
         FGGENPWR = LMOD&(FG, N)
         IF FGGENPWR = 1 THEN GOTO mxpc20 ELSE GOTO mxpc13 mxpc13:
         FGGENINDX = FGGENINDX + 1

IF FGGENINDX = 1 THEN GOTO mxpc14 ELSE GOTO mxpc13003
mxpc13003:
         LNCF = NCF&(FGGENINDX, L)
         IF LNCF = 1 THEN GOTO mxpc13001 ELSE GOTO mxpc14
mxpc13001:
         IF FGGENPWR < FGGEN THEN GOTO mxpc13002 ELSE GOTO mxpc14
mxpc13002:
         FGGEN = FGGENPWR
         CLOSE #2
         GOTO mxpc12 mxpc14:
         PRINT #2, FGGENPWR

GOTO mxpc11
mxpc20:
         CLOSE #2

PRINT "MINIMUM FACTOR GROUP GENERATOR:   "; FGGEN
         PRINT #1, FGGEN
         CLOSE #1
         PRINT "PARAMETERS OF MAXIMAL SEQUENCE RECORDED IN "; FILE$
         PRINT "FACTOR GROUP COMPUTED AS POWERS OF "; FGGEN; ":    RECORDED IN "; FILE2$

REM      COMPUTE SELECTOR MATRIX

FILE3$ = "MXSL" + LTRIM$(STR$(P))
         OPEN FILE3$ FOR OUTPUT AS #3
         CLOSE #3
         OPEN FILE3$ FOR APPEND AS #3

TEST = 0
         M = 0
         GOTO mxpcsel01
mxpcsel0:
         IF TEST = 0 THEN GOTO mxpcsel02 ELSE GOTO mxpcsel01
mxpcsel02:
         PRINT "PROGRAM ERROR: FG REPN NOT FOUND FOR "; M
         END
mxpcsel01:
         M = M + 1
         IF M < N THEN GOTO mxpcsel1 ELSE GOTO mxpcselxt
mxpcsel1:
         MPWR = LEXP&(M, P, N)
         MFG = LEXP&(MPWR, PINVL, N)

FGLMNT = 1
         FGINDX = 0
         TEST = 0
mxpcsel2:
         IF FGINDX < L THEN GOTO mxpcsel3 ELSE GOTO mxpcsel0
mxpcsel3:
         IF TEST = 0 THEN GOTO mxpcsel31 ELSE GOTO mxpcsel5
mxpcsel31:
```

67

```
            IF MFG = FGLMNT THEN GOTO mxpcsel10 ELSE GOTO mxpcsel4
mxpcsel4:
            FGL = FGLMNT * FGGEN
            FGLMNT = LMOD&(FGL, N)
mxpcsel5:
            PRINT #3, 0
            FGINDX = FGINDX + 1
            GOTO mxpcsel2
mxpcsel10:
            PRINT #3, 1
            FGINDX = FGINDX + 1
            TEST = 1
            GOTO mxpcsel2
mxpcselxt:
            CLOSE #3
            PRINT "SELECTOR MATRIX COMPUTED; RECORDED IN "; FILE3$

REM     BEGIN CHARCTERISTIC KERNEL COMPUTATION

FILECK$ = "MXCK" + LTRIM$(STR$(P))
            OPEN FILECK$ FOR OUTPUT AS #4
            CLOSE #4
            OPEN FILECK$ FOR APPEND AS #4

FGINDX1 = 0
            C1GEN = 1 mxpcckrn1:
            FGINDX2 = 0
            C2GEN = 1 mxpcckrn2:
            CKRN = 0

ARG1 = C1GEN
            FOR R1 = 0 TO P - 1
            IF R1 = 0 THEN GOTO mxpcckrn31 ELSE GOTO mxpcckrn3
mxpcckrn3:
            AR1 = 2 * ARG1
            ARG1 = LMOD&(AR1, N)
mxpcckrn31:
            ARG2 = C2GEN
            FOR R2 = 0 TO P - 1
            IF R2 = 0 THEN GOTO mxpcckrn41 ELSE GOTO mxpcckrn4
mxpcckrn4:
            AR2 = 2 * ARG2
            ARG2 = LMOD&(AR2, N)
mxpcckrn41:
            AO = ARG1 + ARG2
            ARG = LMOD&(AO, N)

IF ARG = 1 THEN GOTO mxpcckrn5 ELSE GOTO mxpcckrn6
mxpcckrn5:
            CKRN = CKRN + 1
mxpcckrn6:
            NEXT R2
            NEXT R1

PRINT #4, CKRN
```

68

```
        FGINDX2 = FGINDX2 + 1
        IF FGINDX2 < L THEN GOTO mxpcckrn7 ELSE GOTO mxpcckrn8
mxpcckrn7:
        CG2 = C2GEN * FGGEN
        C2GEN = LMOD&(CG2, N)
        GOTO mxpcckrn2 mxpcckrn8:
        FGINDX1 = FGINDX1 + 1
        IF FGINDX1 < L THEN GOTO mxpcckrn9 ELSE GOTO mxpcckrn10
mxpcckrn9:
        CG1 = C1GEN * FGGEN
        C1GEN = LMOD&(CG1, N)
        GOTO mxpcckrn1 mxpcckrn10:
        CLOSE #4

PRINT "CHARACTERISTIC KERNEL MATRIX COMPUTED; RECORDED IN "; FILECK$

REM     MXCK(P) STORES VALUES OF THE (SYMMETRIC) CHARACTERISTIC KERNEL AS ROW VECTOR OF
REM             ROW VECTORS OF LENGTH L

REM     START CHI SEARCH FOR SOLN OF CHARACTERISTIC EQUATION

FILECH$ = "MXCH" + LTRIM$(STR$(P))
        OPEN FILECH$ FOR OUTPUT AS #5
        CLOSE #5
        KCHAR = 0 mxpc51:

mxpc53:

REM     CHINEW$ GENERATION IS RANDOM
rchgn0:
        SUMTEST = 0
        RANDOMIZE TIMER
        CHINEW$ = ""
        FGINDX = 0
rchgn1:
        IF FGINDX < L THEN GOTO rchgn2 ELSE GOTO rchgnexit
rchgn2:
        CHR = INT(2 * RND)
        CHICHAR$ = LTRIM$(STR$(CHR))
        CHIBN = 1 - 2 * CHR
        CHINEW$ = CHINEW$ + CHICHAR$
        SUMTEST = SUMTEST + CHIBN
        FGINDX = FGINDX + 1
        GOTO rchgn1 rchgnexit:

mxpc60:
        CHI$ = CHINEW$

LOCATE 17: PRINT "CHI$ :"; PRINT CHI$
```

69

```
        IF SUMTEST = 0 THEN GOTO mxpc61 ELSE GOTO mxpc51
mxpc61:
        CHITST$ = CHI$
        CHICHAR$ = MID$(CHITST$, 1, 1)
        CHITST$ = MID$(CHITST$, 2)
        CHITST$ = CHITST$ + CHICHAR$ TSTINDX = 2
mxpc62:
        CHICHAR$ = MID$(CHITST$, 1, 1)
        CHITST$ = MID$(CHITST$, 2)
        CHITST$ = CHITST$ + CHICHAR$
        IF CHITST$ = CHI$ THEN GOTO mxpc51 ELSE GOTO mxpc63
mxpc63:
        TSTINDX = TSTINDX + 1
        IF TSTINDX < L2 THEN GOTO mxpc62 ELSE GOTO mxpc100 mxpc100:

CHILW$ = CHI$
        INDXL2 = 0
mxpc111:
        IF INDXL2 < L2 THEN GOTO mxpc112 ELSE GOTO mxpc113
mxpc112:
        CHICHARW$ = MID$(CHILW$, 1, 1)
        CHILW$ = MID$(CHILW$, 2)
        CHILW$ = CHILW$ + CHICHARW$ INDXL2 = INDXL2 + 1
        GOTO mxpc111
mxpc113:
        CHIL$ = CHILW$
mxpc120:
   REM      BEGIN INTEGRAL EQUATION EVALUATION
   REM         EQUATION EXPRESSION IS EVALUATED FOR ALL VALUES
   REM         OF INDEPENDENT VARIABLE IVINDX, 0 TO L-1
   REM         IF VALUE NOT = -1 FOR ANY IVINDX, FAIL AND GET NEW CHI AT mxpc51

CHIO$ = CHI$
        CHIL$ = CHIL$
        IVINDX = 0 mxpc121:
        OPEN FILECK$ FOR INPUT AS #4

REM      CHIO$ AND CHILW$ ARE SHIFTED IVINDX PLACES
   REM         AND IVINDX IS LESS THAN L

REM      COMPUTE LINEAR TERMS IN INTEGRAL EQUATION

CHO$ = MID$(CHIO$, 1, 1)
        CHON = VAL(CHO$)
        CHOBN = 1 - 2 * CHON
        CHL$ = MID$(CHIL$, 1, 1)
        CHLN = VAL(CHL$)
        CHLBN = 1 - 2 * CHLN
        EQNSM = -(CHOBN + CHLBN)

REM      LINEAR TERMS COMPUTED
```

70

```
REM  BEGIN SUM ON FIRST (UNSHIFTED) CH INDEX: SUM TERMINATES WHEN CHIO IS EMPTY
REM  PROCESS THEN CHECKS VAL OF SUM, ADVANCES INDEPENDENT VAR

CHIOWS = CHIOWS
mxpc130:
      IF CHIOWS = "" THEN GOTO mxpc160 ELSE GOTO mxpc132
mxpc132:
      CHIOWCHARS = MID$(CHIOWS, 1, 1)
      CHIOWS = MID$(CHIOWS, 2)
      CHION = VAL(CHIOWCHAR$)
      CHIOBN = 1 - 2 * CHION

REM  BEGIN SUM ON SECOND (SHIFTED) INDEX

REM  IF CHILWS IS EMPTY, RETURN TO UNSHIFTED SUM

CHILWS = CHILWS
mxpc141:
      IF CHILWS = "" THEN GOTO mxpc130 ELSE GOTO mxpc142
mxpc142:
      CHILWCHARS = MID$(CHILWS, 1, 1)
      CHILWS = MID$(CHILWS, 2)
      CHILN = VAL(CHILWCHARS)
      CHILBN = 1 - 2 * CHILN
      CHIVAL = CHIOBN * CHILBN

INPUT #4, CKRN

EQNSM = EQNSM + CHIVAL * CKRN

GOTO mxpc141 mxpc160:
      CLOSE #4
      IF EQNSM = -1 THEN GOTO mxpc161 ELSE GOTO mxpc51
mxpc161:
      IVINDX = IVINDX + 1
      IF IVINDX < L THEN GOTO mxpc162 ELSE GOTO mxpc200 mxpc162:
      CHIOWCHARS = MID$(CHIOWS, 1, 1)
      CHIOWS = MID$(CHIOWS, 2)
      CHIOWS = CHIOWS + CHIOWCHARS
      CHILWCHARS = MID$(CHILWS, 1, 1)
      CHILWS = MID$(CHILWS, 2)
      CHILWS = CHILWS + CHILWCHARS GOTO mxpc121
mxpc200:
      OPEN FILECH$ FOR INPUT AS #6
mxpc2001:
      IF EOF(6) = -1 THEN GOTO mxpc2003 ELSE GOTO mxpc2002
mxpc2002:
      INPUT #6, CHIREC$
      IF CHI$ = CHIREC$ THEN GOTO mxpc2004 ELSE GOTO mxpc2001
mxpc2004:
      CLOSE #6
```

71

```
        GOTO mxpc2021
mxpc2003:
        CLOSE #6
        KCHAR = KCHAR + 1

OPEN FILECH$ FOR APPEND AS #5
        PRINT #5, CHI$
        CLOSE #5

PRINT "CHARACTERISTIC SEQUENCE NUMBER "; KCHAR; ";  RECORDED AS BINARY STRING IN  "; FILECH$; ":"

CHIR$ = CHI$
mxpc202:
        IF CHIR$ = "" THEN GOTO mxpc2021 ELSE GOTO mxpc201
mxpc2021:
        PRINT
'       IF KCHAR < L THEN GOTO mxpc51 ELSE GOTO mxpc210
        GOTO mxpc51 mxpc201:
        CHICHAR$ = MID$(CHIR$, 1, 1)
        CHIR$ = MID$(CHIR$, 2)
        CHIDIG = VAL(CHICHAR$)
        CHIDGBN = 1 - 2 * CHIDIG
        PRINT SPC(2); CHIDGBN;
        GOTO mxpc202
mxpc210:
        PRINT : PRINT "END COMPUTATIONS"
        CLOSE #5

END

FUNCTION BNSNI (AI)
DEFLNG A-Z

REM     CONVERTS BINARY (0,1) TO ARITHMETIC BINARY (1,-1)

IF AI = 0 THEN GOTO bnsn1 ELSE GOTO bnsn2
bnsn1:
        B = 1
        GOTO bnsn4
bnsn2:
        IF AI = 1 THEN GOTO bnsn3 ELSE GOTO bnsn5
bnsn3:
        B = -1
bnsn4:
        BNSNI = B
        GOTO bnsn6
bnsn5:
        PRINT "ERROR: BINARY ARITHMETIC CONVERSION DEFINED ONLY FOR BINARY NUMBERS"
        END bnsn6:
END FUNCTION

SUB DIVALG (DVDND&, DVSR&, QTNT&, RMNDR&)

DEFLNG A-Z
```

72

```
dvalg0:
        IF DVDND > 0 THEN GOTO dvalg1 ELSE GOTO dvalgxt
dvalg1:
        IF DVSR > 0 THEN GOTO dvalg2 ELSE GOTO dvalgxt
dvalgxt:
        PRINT "PROGRAM ERROR: DIVISION ALGORITHM DEFINED ONLY FOR NON-NEGATIVE NUMBERS"
        END
dvalg2:
        DVDNDX = DVDND&
        DVSRX = DVSR&
        QTNT& = INT(DVDNDX / DVSRX)
        RMNDR& = DVDNDX - QTNT& * DVSRX
END SUB

DEFLNG A-Z
FUNCTION HCF& (A&, B&)

DEFLNG A-Z

IF A& > 0 THEN GOTO hcf1 ELSE GOTO hcfxt
hcf1:
        IF B& > 0 THEN GOTO hcf2 ELSE GOTO hcfxt
hcfxt:
        PRINT "PROGRAM ERROR: HCF DEFINED ONLY FOR NON-NEGATIVE NUMBERS"
        END
hcf2:
        DND = A&
        DVS = B& hcf5:
        CALL DIVALG(DND, DVS, QT, RM)

IF RM = 0 THEN GOTO hcf10 ELSE GOTO hcf6
hcf6:
        DND = DVS
        DVS = RM
        GOTO hcf5
hcf10:
        HCF& = DVS

END FUNCTION

DEFLNG A-Z
FUNCTION LEXP& (N&, R&, N&)

DEFLNG A-Z
        NX = N&
        MPWR = 1
        FOR IR = 1 TO R&
        MP = MPWR * NX
        MPWR = LMOD&(MP, N&)
        NEXT IR
        LEXP& = MPWR

END FUNCTION

FUNCTION LMOD& (A&, B&)
DEFLNG A-Z
        IF A& > 0 THEN GOTO mod1 ELSE GOTO modxt
mod1:
```

```
        IF B& > 0 THEN GOTO mod2 ELSE GOTO modxt
modxt:
        PRINT "PROGRAM ERROR: LONG MODULUS DEFINED ONLY FOR NON-NEGATIVE NUMBERS"
        END
mod2:
        CALL DIVALG(A&, B&, C, D&)
        LMOD& = D&

END FUNCTION
```

74

```
REM     PROGRAM MXCHSRT; EXTRACTS NON-EQUIVALENT GENERIC CHARACTERISTICS
REM             FROM SET OF ALL CHARACTERISTICS
REM     RECORDED IN MXCHBG(P)

DEFLNG A-Z

CLS
        PRINT "SORT MAXIMAL CHARACTERISTICS": PRINT
        INPUT "ENTER MERSENNE PRIME EXPONENT: ", P
        FILEPRMS = "MXPRM" + LTRIM$(STR$(P))
        OPEN FILEPRMS FOR INPUT AS #1
        INPUT #1, DUMMY
        INPUT #1, N
        INPUT #1, L
        INPUT #1, PINVL
        INPUT #1, RPRML
        INPUT #1, FGGEN
        CLOSE #1

FILELCHS$ = "MXCH" + LTRIM$(STR$(P))

FILECHBGNS = "MXCHG" + LTRIM$(STR$(P))
        OPEN FILECHBGNS FOR OUTPUT AS #3
        CLOSE #3

OPEN FILELCHS$ FOR INPUT AS #2
chsrt1:
        IF EOF(2) = -1 THEN GOTO chsrtend ELSE GOTO chsrt2
chsrt2:
        INPUT #2, CHI8$
        OPEN FILECHBGNS FOR INPUT AS #3
chsrt3:
        IF EOF(3) = -1 THEN GOTO chsrt100 ELSE GOTO chsrt4
chsrt4:
        INPUT #3, CHIBGNS SHFTINDX = 0
chsrt5:
        IF SHFTINDX < L THEN GOTO chsrt6 ELSE GOTO chsrt3
chsrt6:
        CHIBGNCHAR$ = MID$(CHIBGNS, 1, 1)
        CHIBGNS = MID$(CHIBGNS, 2)
        CHIBGNS = CHIBGNS + CHIBGNCHAR$
        IF CHIBGNS = CHI8$ THEN GOTO chsrt7 ELSE GOTO chsrt8
chsrt7:
        CLOSE #3
        GOTO chsrt1
chsrt8:
        SHFTINDX = SHFTINDX + 1
        GOTO chsrt5
chsrt100:
        CLOSE #3
        OPEN FILECHBGNS FOR APPEND AS #3
        PRINT #3, CHI8$
        CLOSE #3

GOTO chsrt1 chsrtend:
        CLOSE #2
```

75

```
CLOSE #3
PRINT "DISTINCT GENERIC BINARY CHARACTERISTICS RECORDED IN "; FILECHBGN%
END
```

76

```
REM     PROGRAM FLGNRNDS: GENERATES FILE OF RANDOM ASCII (0,1) CHARCTERS
REM             SOURCE FILE USED TO PARSE CREATED FILE
REM             GENERATED FILE LENGTH = SOURCE FILE LENGTH
REM             SOURCE FILE LENGTH ASSUMED TO BE AN INTEGRAL MULTIPLE OF BLOCK LENGTH

CLS
        PRINT "RANDOM FILE GENERATION"
        INPUT "ENTER BLOCK LENGTH: ", N
        INPUT "ENTER FILENAME IN QUOTES OF BINARY ASCII SOURCE (LENGTH MUST BE INTEGER*127): ", SRCFL$
        INPUT "ENTER FILNAME IN QUOTES OF GENERATED RANDOM FILE: ", RNDFL$

OPEN SRCFL$ FOR INPUT AS #1

OPEN RNDFL$ FOR OUTPUT AS #2: CLOSE #2
        OPEN RNDFL$ FOR APPEND AS #2 flgnnxtblk:
        IF EOF(1) = -1 THEN GOTO flgnquit ELSE GOTO flgnnxtblk1
flgnnxtblk1:

FOR I = 0 TO N - 1
        DMY$ = INPUT$(1, #1)
        NEXT I

FOR I = 0 TO N - 1
        RANDOMIZE TIMER
        DAT% = INT(2 * RND)
        DT$ = LTRIM$(STR$(DAT%))
        PRINT #2, DT$;
        NEXT I

GOTO flgnnxtblk flgnquit:
        CLOSE #1
        CLOSE #2

PRINT "RANDOM FILE GENERATION COMPLETE"
        PRINT "GENERATED RANDOM FILE IS "; RNDFL$; ", PARSED BY "; SRCFL$
        PRINT "PROGRAM ENDS"
END
```

77

```
REM     PROGRAM EXOR
REM         PRODUCES EXCLUSIVE-OR OF TWO ASCII BINARY FILES

PRINT "PROGRAM EXOR": PRINT
        PRINT "INPUT FILES MUST HAVE EQUAL NUMBERS OF (0,1) ASCII ELEMENTS"
        INPUT "ENTER NAME OF FIRST FILE IN QUOTES: ", INFIL1$
        INPUT "ENTER NAME OF SECOND FILE IN QUOTES: ", INFIL2$
        INPUT "ENTER NAME OF PRODUCT FILE IN QUOTES: ", OUTFIL$

OPEN INFIL1$ FOR INPUT AS #1
        OPEN INFIL2$ FOR INPUT AS #2
        OPEN OUTFIL$ FOR OUTPUT AS #3: CLOSE #3
        OPEN OUTFIL$ FOR APPEND AS #3

FLNGTH = 0 exor1:
        IF EOF(1) = -1 THEN GOTO exorend ELSE GOTO exor2
exor2:
        IF EOF(2) = -1 THEN GOTO exorend ELSE GOTO exor3
exor3:
        INCHAR1$ = INPUT$(1, #1)
        INCHAR2$ = INPUT$(1, #2)
        INBIN1 = VAL(INCHAR1$)
        INBIN2 = VAL(INCHAR2$)
        OUTBIN = INBIN1 XOR INBIN2
        OUTCHAR$ = LTRIM$(STR$(OUTBIN))
        PRINT #3, OUTCHAR$;
        FLNGTH = FLNGTH + 1

GOTO exor1 exorend:
        CLOSE #1: CLOSE #2: CLOSE #3
        PRINT "PROGRAM EXOR ENDS:"
        PRINT "EXCLUSIVE-OR OF FILES "; INFIL1$; ", "; INFIL2$; " IS "; OUTFIL$
END
```

78

```
REM     PROGRAM PROCRSTG: RENAMES AND TRIMS MOD N (BLOCK LENGTH)
        CLS
        PRINT SPC(18); "PROCRSTG: RELABEL AND TRIM FOR ENCODE/DECODE": PRINT
        INPUT "ENTER BLOCK LENGTH: ", N
        INPUT "ENTER NAME IN QUOTES OF FILE TO BE RELABELED AND TRIMMED: ", FLIN$
        INPUT "ENTER NAME IN QUOTES OF SCRAP FILE: ", FSCRAP$
        INPUT "ENTER NAME IN QUOTES OF TRIMMED FILE: ", FLOUT$
        OPEN FLIN$ FOR INPUT AS #1
        OPEN FSCRAP$ FOR OUTPUT AS #2: CLOSE #2
        OPEN FLOUT$ FOR OUTPUT AS #3: CLOSE #3
        OPEN FLOUT$ FOR APPEND AS #3
pcrst1:
        I = 0
        OPEN FSCRAP$ FOR APPEND AS #2
pcrst2:
        IF EOF(1) = -1 THEN GOTO pcrst20 ELSE GOTO pcrst3
pcrst3:
        I = I + 1
        IF I < N + 1 THEN GOTO pcrst4 ELSE GOTO pcrst10
pcrst4:
        DATCHAR$ = INPUT$(1, #1)
        PRINT #2, DATCHAR$;
        GOTO pcrst2
pcrst10:
        CLOSE #2
        OPEN FSCRAP$ FOR INPUT AS #2
        FOR K = 1 TO N
        DATCHAR$ = INPUT$(1, #2)
        PRINT #3, DATCHAR$;
        NEXT K
        CLOSE #2
        OPEN FSCRAP$ FOR OUTPUT AS #2: CLOSE #2
        GOTO pcrst1
pcrst20:
        IF I = N THEN GOTO pcrst10 ELSE GOTO pcrst21
pcrst21:
        CLOSE #1: CLOSE #2: CLOSE #3
        END
```

```
REM:     PROGRAM RESTORE
         CLS
         PRINT "PROGRAM RESTORE"
         INPUT "ENTER NAME IN QUOTES OF FILE TO WHICH SCRAP IS TO BE APPENDED: ", APNDENDS
         INPUT "ENTER NAME IN QUOTES OF SCRAP FILE: ", APNDEES
         OPEN APNDENDS FOR APPEND AS #1
         OPEN APNDEES FOR INPUT AS #2
rstr1:
         IF EOF(2) = -1 THEN GOTO rstr10 ELSE GOTO rstr2
rstr2:
         DATCHARS = INPUTS(1, #2)
         PRINT #1, DATCHARS;
         GOTO rstr1
rstr10:
         CLOSE #1: CLOSE #2:
         END
```

80

```
REM     PROGRAM ENCODED.BAS
REM         ENCODE V.0 EXECUTES TRANSMIT ELEMENTS OF WRIGHT-KIMME SCRP

DIM SHARED P AS INTEGER
        DIM SHARED N AS LONG
        DIM SHARED PEXP$
        DIM SHARED L AS LONG
        DIM SHARED X1#
        DIM SHARED X2#
        DIM SHARED NSPECIES AS LONG
        DIM SHARED NGENERA AS LONG
        DIM SHARED GENUS&
        DIM SHARED SPECIES&
        DIM SHARED FILECHG$
        DIM SHARED FILEMXSL$

DECLARE SUB DIVALG (DVDND&, DVSR&, QTNT&, RMNDR&)
        DECLARE FUNCTION LMOD& (A&, B&)
        DECLARE FUNCTION BNSN! (A!)
        DECLARE SUB MXCORRT (DAT1$, DAT2$, DCOR$)         'FILES #40+
        DECLARE SUB MXREPT (A$, GENUS&, SPECIES&, AREP$)  'FILES #50+
        DECLARE SUB MXCORRTI (DAT1$, DAT2$, DCOR$)        'FILES #40+
        DECLARE SUB MXREPTI (A$, GENUS&, SPECIES&, AREP$) 'FILES #50+
        DECLARE SUB DATINENC (AFILE$, RTNEND)             'FILES #60+
        DECLARE FUNCTION FLCOMP (A$, B$)                  'FILES #70+
        DECLARE SUB DATOUTNC (B$)                         'FILES #80+

REM     ORDERWIRE SPEC:  4 = TRANSMIT INPUT FILE
REM                      3 = TRANSMIT NEW GENUS&, SPECIES&
REM                      2 = TRANSMIT NEW GENUS&
REM                      1 = TRANSMIT NEW SPECIES&
REM                      0 = TRANSMIT NULL DATA (AOLD=A)

REM     INITIALIZE TO GENUS&, SPECIES& = 0
        WIDTH LPRINT 132

CLS
        PRINT "WRIGHT-KIMME SCRP: ENCODE, V.0"
        LPRINT "WRIGHT-KIMME SCRP: ENCODE, V.0"
        INPUT "ENTER EXPONENT OF MERSENNE PRIME CODE BLOCK LENGTH: ", P
        PEXP$ = LTRIM$(STR$(P))
        FLMXPRM$ = "MXPRM" + PEXP$
        OPEN FLMXPRM$ FOR INPUT AS #5
        INPUT #5, PFILE
        INPUT #5, N
        LPRINT : LPRINT "DATA BLOCK LENGTH = "; N
        INPUT #5, L
        CLOSE #5

X1# = (SQR(N + 1)) / (N + 1)

X2# = -((N + 1) - SQR(N + 1)) / (N * (N + 1))

FILEMXSL$ = "MXSL" + PEXP$          'FILE #5
        FILECHG$  = "MXCHG" + PEXP$         'FILE #6
        RXFL$     = "RXFL"                  'FILE #1
        AFILE$    = "AFL"                   'FILE #4
        AFILENEW$ = "AFLN"                  'FILE #7
```

```
        CODEFILES = "CDFL"              'FILE #4 (ALSO NAMED "AFL")
        CODEFILENAMES = "CDFL"          'FILE NOT OPENED OR RENAMED
        ALPHAFILES = "ALPHA"            'FILE #5
        NCODEFILES = "NCODE"            'FILE #2
        OWFILES = "OW"                  'FILE #3

OPEN FILECHG$ FOR INPUT AS #6
        GENUS& = 0
preenc1:
        IF EOF(6) = -1 THEN GOTO preenc10 ELSE GOTO preencin:
preencin:
        GENUS& = GENUS& + 1
        INPUT #6, CHI$
        GOTO preenc1
preenc10:
        CLOSE #6
        NGENERA = GENUS&
        NSPECIES = L PRINT "MAXIMUM NUMBER OF DISTINCT CHARACTERISTIC GENERA = "; NGENERA
        INPUT "ENTER NUMBER OF GENERA TO USE: ", NGENERA PRINT "MAXIMUM NUMBER OF DISTINCT CHARACTERISTIC SPECIES& = "; NSPECIES
        INPUT "ENTER NUMBER OF SPECIES& TO USE: ", NSPECIES
preenc11:
        YG = LOG(NGENERA) / LOG(2)
        YGINT = INT(YG)
        IF YG - YGINT > 0 THEN GOTO preenc13 ELSE GOTO preenc12
preenc12:
        YG = YGINT
        GOTO preenc14
preenc13:
        YG = YGINT + 1
preenc14:
        ZS = LOG(NSPECIES) / LOG(2)
        ZSINT = INT(ZS)
        IF ZS - INT(ZS) > 0 THEN GOTO preenc16 ELSE GOTO preenc15
preenc15:
        ZS = ZSINT
        GOTO preenc17
preenc16:
        ZS = ZSINT + 1
preenc17:
        BITSGENUS = YG: PRINT "BITSGENUS = "; BITSGENUS BITSSPECIES = ZS: PRINT "BITSSPECIES = "; BITSSPECIES
encinit:
        OPEN RXFL$ FOR INPUT AS #1
        TALLYIN& = 0
        NBLOCKSIN& = 0

OPEN NCODEFILES FOR OUTPUT AS #2
        CLOSE #2
        OPEN NCODEFILES FOR APPEND AS #2

OPEN OWFILES FOR OUTPUT AS #3
        CLOSE #3
        OPEN OWFILES FOR APPEND AS #3

TALLYOUT& = 0
```

82

```
        NBLOCKSCODED& = 0

CALL DATINENC(AFILES, RTNEND)
        IF RTNEND = 1 THEN GOTO encend ELSE GOTO enc0
enc0:
        TALLYIN& = N
        NBLOCKSIN& = 1

GENUS& = 0: SPECIES& = 0
        OPEN ALPHAFILE$ FOR OUTPUT AS #8
        CLOSE #8
        CALL NXREPT(AFILES, GENUS&, SPECIES&, ALPHAFILE$)
        OWCHAR$ = LTRIM$(STR$(4))
        CALL DATOUTNC(AFILES)
        PRINT #3, OWCHAR$
        TALLYOUT& = N + 3
        NBLOCKSCODED& = 0

GENUSOLD& = GENUS&
        SPECIESOLD& = SPECIES&
enc1:
        IF EOF(1) = -1 THEN GOTO encend ELSE GOTO encin
encin:
        CALL DATINENC(AFILES, RTNEND)
        IF RTNEND = 1 THEN GOTO encend ELSE GOTO encin2
encin2:
        TALLYIN& = TALLYIN& + N
        NBLOCKSIN& = NBLOCKSIN& + 1
        PRINT "PROCESSING BLOCK NO. "; NBLOCKSIN& encbssch:
        SPCINDX& = 0
encbsschsp:
        IF SPCINDX& < NSPECIES THEN GOTO encbsschsp1 ELSE GOTO enccodetxe
encbsschsp1:
        SPEC& = SPECIESOLD& + SPCINDX&
        SPECIES& = LMOD&(SPEC&, NSPECIES)

GNINDX& = 0
encbsschgn:
        IF GNINDX& < NGENERA THEN GOTO encbsschgn1 ELSE GOTO encbsschnxtsp
encbsschgn1:
        GEN& = GENUSOLD& + GNINDX&
        GENUS& = LMOD&(GEN&, NGENERA)
encbsschtst:
        OPEN AFILENEW$ FOR OUTPUT AS #7
        CLOSE #7

CALL NXREPTI(ALPHAFILE$, GENUS&, SPECIES&, AFILENEW$)
        TST = FLCOMP(AFILES, AFILENEW$)
        IF TST = 1 THEN GOTO enccodeasm ELSE GOTO encbsschnxtgn
encbsschnxtgn:
        GNINDX& = GNINDX& + 1
        GOTO encbsschgn
encbsschnxtsp:
        SPCINDX& = SPCINDX& + 1
        GOTO encbsschsp
enccodeasm:
        NBLOCKSCODED& = NBLOCKSCODED& + 1
        IF GENUSOLD& = GENUS& THEN GOTO enccodeasm1 ELSE GOTO enccodeasm2
```

83

```
enccodessm1:
      IF SPECIESOLD& = SPECIES& THEN GOTO enccodessm3 ELSE GOTO enccodessm4
enccodessm4:
      SP$ = LTRIM$(STR$(SPECIES&))
      PRINT #2, SP$
      TALLYOUT& = TALLYOUT& + BITSSPECIES
      OWCHAR$ = LTRIM$(STR$(1))
      PRINT #3, OWCHAR$
      TALLYOUT& = TALLYOUT& + 3
      GOTO encout
enccodessm2:
      IF SPECIESOLD& = SPECIES& THEN GOTO enccodessm5 ELSE GOTO enccodessm6
enccodessm5:
      GN$ = LTRIM$(STR$(GENUS&))
      PRINT #2, GN$
      TALLYOUT& = TALLYOUT& + BITSGENUS
      OWCHAR$ = LTRIM$(STR$(2))
      PRINT #3, OWCHAR$
      TALLYOUT& = TALLYOUT& + 3
      GOTO encout
enccodessm3:
      NUL$ = LTRIM$(STR$(0))
      PRINT #2, NUL$
      TALLYOUT& = TALLYOUT& + 1
      OWCHAR$ = LTRIM$(STR$(0))
      PRINT #3, OWCHAR$
      TALLYOUT& = TALLYOUT& + 3
      GOTO encout
enccodessm6:
      GN$ = LTRIM$(STR$(GENUS&))
      PRINT #2, GN$
      TALLYOUT& = TALLYOUT& + BITSGENUS
      SP$ = LTRIM$(STR$(SPECIES&))
      PRINT #2, SP$
      TALLYOUT& = TALLYOUT& + BITSSPECIES
      OWCHAR$ = LTRIM$(STR$(3))
      PRINT #3, OWCHAR$
      TALLYOUT& = TALLYOUT& + 3
      GOTO encout
enccodetxe:
      OPEN ALPHAFILE$ FOR OUTPUT AS #8
      CLOSE #8
      CALL MXREPT(AFILE$, GENUS&, SPECIES&, ALPHAFILE$)

CALL DATOUTNC(AFILE$)
      TALLYOUT& = TALLYOUT& + N
      OWCHAR$ = LTRIM$(STR$(4))
      PRINT #3, OWCHAR$
      TALLYOUT& = TALLYOUT& + 3
      GOTO encout
encout:
      GENUSOLD& = GENUS&
      SPECIESOLD& = SPECIES&
      GOTO enc1
encend:
      CLOSE #1
      CLOSE #2
      CLOSE #3
      LPRINT "RX FILE EMPTY; ENCODE ENDS"
      LPRINT "CODED DATA RECORDED IN "; NCODEFILE$; ": ORDERWIRE RECORDED IN "; OWFILE$
```

84

```
        LPRINT TAB(5); "BIT TALLY IN = "; TALLYIN&; TAB(30); "NO. DATA BLOCKS PROCESSED = "; NBLOCKSIN&
        LPRINT TAB(5); "BIT TALLY OUT = "; TALLYOUT&; TAB(30); "NO. DATA BLOCKS CODED = "; NBLOCKSCODED&
        XCOMPRESS = TALLYIN& / TALLYOUT&
        LPRINT : LPRINT "EFFECTIVE COMPRESSION RATIO = "; XCOMPRESS; " TO ONE"
        LPRINT CHR$(12)

PRINT "RX FILE EMPTY; ENCODE ENDS"
        END

FUNCTION BNSNI (AI)

REM     CONVERTS BINARY (0,1) TO ARITHMETIC BINARY (1,-1)

IF AI = 0 THEN GOTO bnsn1 ELSE GOTO bnsn2
bnsn1:
        B = 1
        GOTO bnsn4
bnsn2:
        IF AI = 1 THEN GOTO bnsn3 ELSE GOTO bnsn5
bnsn3:
        B = -1
bnsn4:
        BNSNI = B
        GOTO bnsn6
bnsn5:
        PRINT "ERROR: BINARY ARITHMETIC CONVERSION DEFINED ONLY FOR BINARY NUMBERS"
        END bnsn6:

END FUNCTION

SUB DATINENC (AFILE$, RTNEND)

REM     RXFL$ IS ASSUMED OPEN AS #1, AND AFILE$ DEFINED

RTNEND = 0

OPEN AFILE$ FOR OUTPUT AS #4
        CLOSE #4
        OPEN AFILE$ FOR APPEND AS #4

READINDX = 0
datin1:
        IF EOF(1) = -1 THEN GOTO datinend ELSE GOTO datin3
datin3:
        INPUT #1, X$
        PRINT #4, X$
        READINDX = READINDX + 1
        IF READINDX < N THEN GOTO datin1 ELSE GOTO datinexit
datinexit:
        CLOSE #4
        GOTO datin10
datinend:
        CLOSE #4
        RTNEND = 1
datin10:
END SUB
```

85

```
SUB DATOUTNC (B$)
    REM         NCODEFILES ASSUMED OPEN FOR APPEND AS #2

OPEN B$ FOR INPUT AS #82
datout1:
        IF EOF(82) = -1 THEN GOTO datoutexit ELSE GOTO datout2
datout2:
        INPUT #82, BCHAR$
        PRINT #2, BCHAR$
        GOTO datout1
datoutexit:
        CLOSE #82
END SUB

SUB DIVALG (DVDND&, DVSR&, QTNT&, RMNDR&)

DEFLNG A-Z dvalg0:
        IF DVDND& < 0 THEN GOTO dvalgxt ELSE GOTO dvalg1
dvalg1:
        IF DVSR& > 0 THEN GOTO dvalg2 ELSE GOTO dvalgxt
dvalgxt:
        PRINT "PROGRAM ERROR: DIVISION ALGORITHM DEFINED ONLY FOR NON-NEGATIVE NUMBERS"
        END
dvalg2:
        DVDNDX = DVDND&
        DVSRX = DVSR&
        QTNT& = INT(DVDNDX / DVSRX)
        RMNDR& = DVDNDX - QTNT& * DVSRX
END SUB

FUNCTION FLCOMP (A$, B$)

TST = 1
        OPEN A$ FOR INPUT AS #71
        OPEN B$ FOR INPUT AS #72 flcomp1:
        IF EOF(71) = -1 THEN GOTO flcomp2 ELSE GOTO flcomp3
flcomp2:
        IF EOF(72) = -1 THEN GOTO flcompexit ELSE GOTO flcomp5
flcomp3:
        IF EOF(72) = -1 THEN GOTO flcomp5 ELSE GOTO flcomp4
flcomp4:
        INPUT #71, ADAT$
        INPUT #72, BDAT$
        IF ADAT$ = BDAT$ THEN GOTO flcomp1 ELSE GOTO flcomp5
flcomp5:
        TST = 0
flcompexit:
        FLCOMP = TST
        CLOSE #71
        CLOSE #72

END FUNCTION

FUNCTION LMOD& (A&, B&)

IF A& < 0 THEN GOTO modxt ELSE GOTO mod1
```

86

```
mod1:
        IF B& > 0 THEN GOTO mod2 ELSE GOTO modxt
modxt:
        PRINT "PROGRAM ERROR: LONG MODULUS DEFINED ONLY FOR NON-NEGATIVE NUMBERS"
        END
mod2:
        CALL DIVALG(A&, B&, C&, D&)
        LMOD& = D&
END FUNCTION

SUB MXCORRT (DAT1S, DAT2S, DCORS)

REM     DCOR(K) = X1#*SUM ( DAT1 ( M ) * DAT2 ( M + K ): M = 0 TO N-1 )
REM             +X2#*SUM (DAT1 (M) : M = 0 TO N-1 )
REM         DAT2 IS BINARY (UNSCALED) MAXIMAL SEQUENCE
REM     1: CORRELATION INDICES ARE COUNTED BY INPUTS FROM DAT2S;
REM             DAT2S IS INITIALLY COPIED TO FILTMP1S
REM     2: COR PROC IS ALWAYS DCOR=DCOR+(DAT1S INPUT)*(FILTMP1S INPUT)
REM     3: FILTMP1S IS SHIFTED VERSION OF DAT2S
REM     4: EACH PRODUCT COMPUTATION:
REM             FIRST: (FILTMP2S EMPTY) FILTMP1S ENTRY IS RECORDED
REM             ALL SUCCEEDING: (FILTMP2S NON-EMPTY)
REM                 FIRST FILTMP1S ENTRY APPENDED TO FILTMP2
REM             AFTER LAST: (DAT1S EMPTY) FIRST FILTMP1S ENTRY
REM                 APPENDED TO FILTMP2S
REM     5: AT END OF EACH INDEX COMPUTATION, FILTMP2S REPLACES FILTMP1S
REM             AND FILTMP2S IS INITIALIZED TO EMPTY
REM     6: X1#, X2# ARE SCALING CONSTANTS FOR MAXIMAL TO BASIS CONVERSION,
REM             AND ARE ASSUMED COMPUTED BY CALLING PROGRAM
REM     7: NAMES OF DAT1S, DAT2S, AND DCORS ARE SET BY CALLING PROGRAM

FILTMP1S = "FILTMP1"
        FILTMP2S = "FILTMP2"

OPEN FILTMP1S FOR OUTPUT AS #43: CLOSE #43
        OPEN FILTMP2S FOR OUTPUT AS #44: CLOSE #44
        OPEN DCORS FOR OUTPUT AS #43: CLOSE #43

REM     COPY DAT2S TO FILTMP1S, CHECK FOR EQUIDIMENSIONALITY, AND SUM DAT1S

OPEN FILTMP1S FOR APPEND AS #43
        OPEN DAT1S FOR INPUT AS #41
        DAT1SUM# = 0
        OPEN DAT2S FOR INPUT AS #42
precort1:
        IF EOF(42) = -1 THEN GOTO precort4 ELSE GOTO precort2
precort2:
        IF EOF(41) = -1 THEN GOTO corterr ELSE GOTO precort3
precort3:
        INPUT #42, DT2S
        INPUT #41, DT1S
        DT1# = VAL(DT1S)
        DAT1SUM# = DAT1SUM# + DT1#
        PRINT #43, DT2S
        GOTO precort1
precort4:
        IF EOF(41) = -1 THEN GOTO precort5 ELSE GOTO corterr
precort5:
        CLOSE #41: CLOSE #42: CLOSE #43
```

87

```
        GOTO cortinit
corterr:
        CLOSE
        PRINT "INPUT ERROR: SEQUENCES TO BE CORRELATED MUST HAVE EQUAL NUMBERS OF ELEMENTS"
        END cortinit:
        OPEN DAT2$ FOR INPUT AS #42
cort0:
        IF EOF(42) = -1 THEN GOTO cortend ELSE GOTO cort1
cort1:
        INPUT #42, DUMMY$
        DCR# = 0
cort2:
        OPEN FILTMP1$ FOR INPUT AS #43
        OPEN DAT1$ FOR INPUT AS #41
        NPROD = 0 cort3:
        IF EOF(41) = -1 THEN GOTO cortexit ELSE GOTO cort4
cort4:
        INPUT #41, DT1$
        DT1# = VAL(DT1$)
        INPUT #43, DT2$
        DT2# = VAL(DT2$)

DCR# = DCR# + DT1# * DT2#
        IF NPROD = 0 THEN GOTO cort6 ELSE GOTO cort5

REM         FIRST COR TERM; NPROD = 0 cort6:
        DAT2FIRST$ = DT2$
        NPROD = 1

GOTO cort3

REM         POST FIRST COR TERM; SET FILTMP1$ ENTRY IN FILTMP2$ cort5:
        OPEN FILTMP2$ FOR APPEND AS #44
        PRINT #44, DT2$
        CLOSE #44
        GOTO cort3 cortexit:
        CLOSE #41: CLOSE #43
        OPEN FILTMP2$ FOR APPEND AS #44
        PRINT #44, DAT2FIRST$
        CLOSE #44
        DCR# = X1# * DCR# + X2# * DAT1SUM#
        DCR$ = LTRIM$(STR$(DCR#))
        OPEN DCOR$ FOR APPEND AS #45
        PRINT #45, DCR$
        CLOSE #45
        KILL FILTMP1$
        NAME FILTMP2$ AS FILTMP1$
        OPEN FILTMP2$ FOR OUTPUT AS #44: CLOSE #44

GOTO cort0
```

88

```
cortend:

CLOSE #42

KILL FILTMP1$
    KILL FILTMP2$
```

```
SUB MXCORRTI (DAT1$, DAT2$, DCOR$)

REM     DCOR(K) = X1#*SUM ( DAT1 ( M ) * DAT2 ( M + K ): M = 0 TO N-1 )
REM              +X2#*SUM (DAT1 (M) : M = 0 TO N-1 )
REM         DAT2 IS BINARY (UNSCALED) MAXIMAL SEQUENCE
REM     1: CORRELATION INDICES ARE COUNTED BY INPUTS FROM DAT2$;
REM         DAT2$ IS INITIALLY COPIED TO FILTMP1$
REM     2: COR PROC IS ALWAYS DCOR=DCOR+(DAT1$ INPUT)*(FILTMP1$ INPUT)
REM     3: FILTMP1$ IS SHIFTED VERSION OF DAT2$
REM     4: EACH PRODUCT COMPUTATION:
REM             FIRST: (FILTMP2$ EMPTY) FILTMP1$ ENTRY IS RECORDED
REM             ALL SUCCEEDING: (FILTMP2$ NON-EMPTY)
REM                 FIRST FILTMP1$ ENTRY APPENDED TO FILTMP2
REM             AFTER LAST: (DAT1$ EMPTY) FIRST FILTMP1$ ENTRY
REM                 APPENDED TO FILTMP2$
REM     5: AT END OF EACH INDEX COMPUTATION, FILTMP2$ REPLACES FILTMP1$
REM         AND FILTMP2$ IS INITIALIZED TO EMPTY
REM     6: X1#, X2# ARE SCALING CONSTANTS FOR MAXIMAL TO BASIS CONVERSION,
REM         AND ARE ASSUMED COMPUTED BY CALLING PROGRAM
REM     7: NAMES OF DAT1$, DAT2$, AND DCOR$ ARE SET BY CALLING PROGRAM
REM     8: IN (I) VERSION, CORR VALUES ARE TRUNCATED TO INTEGERS

FILTMP1$ = "FILTMP1"
        FILTMP2$ = "FILTMP2"

OPEN FILTMP1$ FOR OUTPUT AS #43: CLOSE #43
        OPEN FILTMP2$ FOR OUTPUT AS #44: CLOSE #44
        OPEN DCOR$ FOR OUTPUT AS #43: CLOSE #43

REM     COPY DAT2$ TO FILTMP1$, CHECK FOR EQUIDIMENSIONALITY, AND SUM DAT1$

OPEN FILTMP1$ FOR APPEND AS #43
        OPEN DAT1$ FOR INPUT AS #41
        DAT1SUM# = 0
        OPEN DAT2$ FOR INPUT AS #42
precorti1:
        IF EOF(42) = -1 THEN GOTO precorti4 ELSE GOTO precorti2
precorti2:
        IF EOF(41) = -1 THEN GOTO cortierr ELSE GOTO precorti3
precorti3:
        INPUT #42, DT2$
        INPUT #41, DT1$
        DT1# = VAL(DT1$)
        DAT1SUM# = DAT1SUM# + DT1#
        PRINT #43, DT2$
        GOTO precorti1
precorti4:
        IF EOF(41) = -1 THEN GOTO precorti5 ELSE GOTO cortierr
precorti5:
        CLOSE #41: CLOSE #42: CLOSE #43
        GOTO cortiinit
cortierr:
        CLOSE
        PRINT "INPUT ERROR: SEQUENCES TO BE CORRELATED MUST HAVE EQUAL NUMBERS OF ELEMENTS"
        END cortiinit:
        OPEN DAT2$ FOR INPUT AS #42
corti0:
```

90

```
        IF EOF(42) = -1 THEN GOTO cortiend ELSE GOTO corti1
corti1:
        INPUT #42, DUMMY$
        DCR# = 0
corti2:
        OPEN FILTMP1$ FOR INPUT AS #43
        OPEN DAT1$ FOR INPUT AS #41
        NPROD = 0 corti3:
        IF EOF(41) = -1 THEN GOTO cortiexit ELSE GOTO corti4
corti4:
        INPUT #41, DT1$
        DT1# = VAL(DT1$)
        INPUT #43, DT2$
        DT2# = VAL(DT2$)

DCR# = DCR# + DT1# * DT2#
        IF NPROD = 0 THEN GOTO corti6 ELSE GOTO corti5

REM         FIRST COR TERM; NPROD = 0 corti6:
        DAT2FIRST$ = DT2$
        NPROD = 1

GOTO corti3

REM         POST FIRST COR TERM; SET FILTMP1$ ENTRY IN FILTMP2$ corti5:
        OPEN FILTMP2$ FOR APPEND AS #44
        PRINT #44, DT2$
        CLOSE #44
        GOTO corti3 cortiexit:
        CLOSE #41: CLOSE #43
        OPEN FILTMP2$ FOR APPEND AS #44
        PRINT #44, DAT2FIRST$
        CLOSE #44
        DCR# = X1# * DCR# + X2# * DAT1SUM#
        IF DCR# < .5 THEN GOTO cortiexit1 ELSE GOTO cortiexit2
cortiexit1:
        DCRI = 0
        GOTO cortiexit3
cortiexit2:
        DCRI = 1
cortiexit3:
        DCR$ = LTRIM$(STR$(DCRI))
        OPEN DCOR$ FOR APPEND AS #45
        PRINT #45, DCR$
        CLOSE #45
        KILL FILTMP1$
        NAME FILTMP2$ AS FILTMP1$
        OPEN FILTMP2$ FOR OUTPUT AS #44: CLOSE #44

GOTO corti0 cortiend:
```

```
        CLOSE #42

KILL FILTMP1$
        KILL FILTMP2$
END SUB
```

```
REM     PROGRAM DECODE0.BAS
REM         DECODE V.0 EXECUTES RECEIVE ELEMENTS OF WRIGHT-KIMME SCRP

DIM SHARED P AS INTEGER
        DIM SHARED N AS LONG
        DIM SHARED PEXP$
        DIM SHARED L AS LONG
        DIM SHARED X1#
        DIM SHARED X2#
        DIM SHARED NSPECIES AS LONG
        DIM SHARED NGENERA AS LONG
        DIM SHARED GENUS&
        DIM SHARED SPECIES&
        DIM SHARED FILECHG$
        DIM SHARED FILEMXSL$
        DIM SHARED TXFL$
        DIM SHARED OWFILE$
        DIM SHARED NCODEFILE$

DECLARE SUB DIVALG (DVDND&, DVSR&, QTNT&, RMNDR&)
        DECLARE FUNCTION LMOD& (A&, B&)
        DECLARE FUNCTION BNSN! (A!)
        DECLARE SUB MXCORR (DAT1$, DAT2$, DCOR$)              'FILES #40+
        DECLARE SUB MXREP (A$, GENUS&, SPECIES&, AREP$)        'FILES #50+
        DECLARE SUB MXCORRI (DAT1$, DAT2$, DCOR$)             'FILES #40+
        DECLARE SUB MXREPI (A$, GENUS&, SPECIES&, AREP$)       'FILES #50+
        DECLARE FUNCTION FLCOMP (A$, B$)                       'FILES #70+
        DECLARE SUB DATINDC0 (RTNEND)                          'FILES #60+
        DECLARE SUB DATINDC1 (SPECIES&, RTNEND)                'FILES #60+
        DECLARE SUB DATINDC2 (GENUS&, RTNEND)                  'FILES #60+
        DECLARE SUB DATINDC3 (GENUS&, SPECIES&, RTNEND)        'FILES #60+
        DECLARE SUB DATINDC4 (AFILE$, RTNEND)                  'FILES #60+
        DECLARE SUB DATOUTDC (B$)                              'FILES #80+

WIDTH LPRINT 127

REM     ORDERWIRE SPEC: 4 = TRANSMIT INPUT FILE
REM                     3 = TRANSMIT NEW GENUS&, SPECIES&
REM                     2 = TRANSMIT NEW GENUS&
REM                     1 = TRANSMIT NEW SPECIES&
REM                     0 = TRANSMIT NULL DATA (AOLD=A)

CLS
        PRINT "WRIGHT-KIMME SCRP: DECODE, V.0"
        LPRINT "WRIGHT-KIMME SCRP: DECODE, V.0"
        INPUT "ENTER EXPONENT OF MERSENNE PRIME CODE BLOCK LENGTH: ", P
        INPUT "ENTER NUMBER OF GENERA OF CHARACTERISTIC SEQUENCES: ", NGENERA
        INPUT "ENTER NUMBER OF SPECIES OF CHARACTERISTIC SEQUENCES: ", NSPECIES

PEXP$ = LTRIM$(STR$(P))
        FLMXPRM$ = "MXPRM" + PEXP$
        OPEN FLMXPRM$ FOR INPUT AS #5
        INPUT #5, PFILE
        INPUT #5, N
        INPUT #5, L
        LPRINT "  DATA BLOCK LENGTH = "; N

CLOSE #5
```

```
X1# = (SQR(N + 1)) / (N + 1)

X2# = -((N + 1) - SQR(N + 1)) / (N * (N + 1))

FILEMXSL$ = "MXSL" + PEXP$          'FILE #5
        FILECHG$ = "MXCHG" + PEXP$          'FILE #6
        TXFL$ = "TXFL"                      'FILE #2
        AFILE$ = "AFL"                      'FILE #4
        ALPHAFILE$ = "ALPHA"                'FILE #8
        NCODEFILE$ = "NCODE"                'FILE #1
        OWFILE$ = "OW"                      'FILE #3

REM    INITIALIZE: GENUS&=SPECIES&=0; AFL INPUT

OPEN NCODEFILE$ FOR INPUT AS #1
        OPEN OWFILE$ FOR INPUT AS #3

OPEN TXFL$ FOR OUTPUT AS #2
        CLOSE #2

GENUS& = 0
        SPECIES& = 0

INPUT #3, OWCHAR$
        OWNUM = VAL(OWCHAR$)
        IF OWNUM = 4 THEN GOTO decinit ELSE GOTO decinerr
decinerr:
        PRINT "INPUT ERROR: INITIAL OW CHARACTER MUST BE 4; DECODE ENDS"
        END
decinit:
        OPEN AFILE$ FOR OUTPUT AS #4
        CLOSE #4
        CALL DATINDC4(AFILE$, RTNEND)
        NBLOCKSRCNXTD& = 1
        IF RTNEND = 1 THEN GOTO decend ELSE GOTO decinit1
decinit1:
        OPEN ALPHAFILE$ FOR OUTPUT AS #8
        CLOSE #8
        CALL MXREP(AFILE$, GENUS&, SPECIES&, ALPHAFILE$)
        GOTO decout dec1:
        IF EOF(1) = -1 THEN GOTO decend ELSE GOTO dec2
dec2:
        IF EOF(3) = -1 THEN GOTO decend ELSE GOTO dec3:
dec3:
        INPUT #3, OWCHAR$
        OWNUM = VAL(OWCHAR$)
        NBLOCKSRCNXTD& = NBLOCKSRCNXTD& + 1

IF OWNUM = 0 THEN GOTO dec10 ELSE GOTO dec4      'TX NUL
dec4:
        IF OWNUM = 1 THEN GOTO dec20 ELSE GOTO dec5      'TX GEN
dec5:
        IF OWNUM = 2 THEN GOTO dec30 ELSE GOTO dec6      'TX SPEC
dec6:
        IF OWNUM = 3 THEN GOTO dec40 ELSE GOTO dec7      'TX GEN,SPEC
dec7:
```

```
            IF OLNUM = 4 THEN GOTO dec50 ELSE GOTO decowerr dec10:
        CALL DATINDC0(RTNEND)
        IF RTNEND = 1 THEN GOTO decend ELSE GOTO decout
dec20:
        GENUS& = GENUSOLD&
        CALL DATINDC1(SPECIES&, RTNEND)
        IF RTNEND = 1 THEN GOTO decend ELSE GOTO decrecon
dec30:
        SPECIES& = SPECIESOLD&
        CALL DATINDC2(GENUS&, RTNEND)
        IF RTNEND = 1 THEN GOTO decend ELSE GOTO decrecon
dec40:
        CALL DATINDC3(GENUS&, SPECIES&, RTNEND)
        IF RTNEND = 1 THEN GOTO decend ELSE GOTO decrecon
dec50:
        GENUS& = GENUSOLD&
        SPECIES& = SPECIESOLD&
        CALL DATINDC4(AFILE$, RTNEND)
        IF RTNEND = 1 THEN GOTO decend ELSE GOTO dec51
dec51:
        OPEN ALPHAFILE$ FOR OUTPUT AS #8
        CLOSE #8
        CALL NXREP(AFILE$, GENUS&, SPECIES&, ALPHAFILE$)
        GOTO decout
decrecon:
        OPEN AFILE$ FOR OUTPUT AS #4
        CLOSE #4
        CALL NXREPI(ALPHAFILE$, GENUS&, SPECIES&, AFILE$)
decout:
        CALL DATOUTDC(AFILE$)
        PRINT "DATA BLOCK NO. "; NBLOCKSRCNXTD&; "RECONSTRUCTED"
        GENUSOLD& = GENUS&
        SPECIESOLD& = SPECIES&
        GOTO dec1 decowerr:
        PRINT "CHARACTER ERROR IN OW FILE; DECODE ENDS"
        END decend:
        CLOSE #1
        CLOSE #2
        CLOSE #3
        PRINT "END CODED DATA/OW FILES; DECODE ENDS"
        PRINT "RECONSTRUCTED DATA RECORDED IN FILE "; TXFL$
        LPRINT : LPRINT "END CODED DATA/OW FILES; DECODE ENDS"
        LPRINT "   RECONSTRUCTED DATA RECORDED IN FILE "; TXFL$ decerchk:
        OPEN "RXFL" FOR INPUT AS #100
        OPEN "TXFL" FOR INPUT AS #101

BITSERR& = 0
decerchk0:
        IF EOF(100) = -1 THEN GOTO decerchk1 ELSE GOTO decerchk2
decerchk2:
        INPUT #100, RCHAR$
        IF EOF(101) = -1 THEN GOTO decerchk3 ELSE GOTO decerchk4
```

```
decerchk4:
        INPUT #101, TCHARS
        IF RCHARS = TCHARS THEN GOTO decerchk5 ELSE GOTO decerchk6
decerchk5:
        GOTO decerchk0
decerchk6:
        BITSERR& = BITSERR& + 1
        GOTO decerchk0
decerchk1:
        IF EOF(101) = -1 THEN GOTO decerchkend ELSE GOTO decerchk7
decerchk7:
        INPUT #101, TCHARS
        BITSERR& = BITSERR& + 1
        GOTO decerchk0
decerchk3:
        BITSERR& = BITSERR& + 1
        GOTO decerchk0
decerchkend:
        LPRINT "NO. OF BIT ERRORS, FILES TXFL/RXFL, = "; BITSERR&
        LPRINT CHR$(12)
        CLOSE #100
        CLOSE #101
END

FUNCTION BNSNI (AI)

REM     CONVERTS BINARY (0,1) TO ARITHMETIC BINARY (1,-1)

IF AI = 0 THEN GOTO bnsn1 ELSE GOTO bnsn2
bnsn1:
        B = 1
        GOTO bnsn4
bnsn2:
        IF AI = 1 THEN GOTO bnsn3 ELSE GOTO bnsn5
bnsn3:
        B = -1
bnsn4:
        BNSNI = B
        GOTO bnsn6
bnsn5:
        PRINT "ERROR: BINARY ARITHMETIC CONVERSION DEFINED ONLY FOR BINARY NUMBERS"
        END bnsn6:

END FUNCTION

SUB DATINDC0 (RTNEND)

RTNEND = 0
        IF EOF(1) = -1 THEN GOTO datindc0rtn ELSE GOTO datindc01
datindc01:
        INPUT #1, NUL$
        GOTO datindc0end
datindc0rtn:
        RTNEND = 1
datindc0end:

END SUB
```

```
SUB DATINDC1 (SPECIES&, RTNEND)
        RTNEND = 0
        IF EOF(1) = -1 THEN GOTO datindc1rtn ELSE GOTO datindc11
datindc11:
        INPUT #1, SPC$
        SPECIES& = VAL(SPC$)
        GOTO datindc1end
datindc1rtn:
        RTNEND = 1
datindc1end:

END SUB

SUB DATINDC2 (GENUS&, RTNEND)
        RTNEND = 0
        IF EOF(1) = -1 THEN GOTO datindc2rtn ELSE GOTO datindc21
datindc21:
        INPUT #1, GNS$
        GENUS& = VAL(GNS$)
        GOTO datindc2end
datindc2rtn:
        RTNEND = 1
datindc2end:

END SUB

SUB DATINDC3 (GENUS&, SPECIES&, RTNEND)
        RTNEND = 0
        IF EOF(1) = -1 THEN GOTO datindc3rtn ELSE GOTO datindc31
datindc31:
        INPUT #1, GNS$
        GENUS& = VAL(GNS$)
        INPUT #1, SPC$
        SPECIES& = VAL(SPC$)
        GOTO datindc3end
datindc3rtn:
        RTNEND = 1
datindc3end:

END SUB

SUB DATINDC4 (AFILE$, RTNEND)

RTNEND = 0
        OPEN AFILE$ FOR OUTPUT AS #61
        CLOSE #61
        OPEN AFILE$ FOR APPEND AS #61

RDINDX& = 0
datindc41:
        IF RDINDX& < N THEN GOTO datindc42 ELSE GOTO datindc4end
datindc42:
        IF EOF(1) = -1 THEN GOTO datindc4rtn ELSE GOTO datindc43
datindc43:
        INPUT #1, ACHAR$
        PRINT #61, ACHAR$
        RDINDX& = RDINDX& + 1
        GOTO datindc41
datindc4rtn:
```

97

```
        RTNEND = 1
datindc4end:
        CLOSE #61

END SUB

SUB DATOUTDC (AFILE$)
        OPEN AFILE$ FOR INPUT AS #4
        OPEN TXFL$ FOR APPEND AS #2
datoutdc1:
        IF EOF(4) = -1 THEN GOTO datoutdcend ELSE GOTO datoutdc2
datoutdc2:
        INPUT #4, ACHAR$
        PRINT #2, ACHAR$
        GOTO datoutdc1
datoutdcend:
        CLOSE #4
        CLOSE #2
END SUB
```

98

```
SUB DIVALG (DVDND&, DVSR&, QTNT&, RMNDR&)

DEFLNG A-Z dvalg0:
        IF DVDND& < 0 THEN GOTO dvalgxt ELSE GOTO dvalg1
dvalg1:
        IF DVSR& > 0 THEN GOTO dvalg2 ELSE GOTO dvalgxt
dvalgxt:
        PRINT "PROGRAM ERROR: DIVISION ALGORITHM DEFINED ONLY FOR NON-NEGATIVE NUMBERS"
        END
dvalg2:
        DVDNDX = DVDND&
        DVSRX = DVSR&
        QTNT& = INT(DVDNDX / DVSRX)
        RMNDR& = DVDNDX - QTNT& * DVSRX
END SUB
```

```
/*****************************************************************\
|                           bin2basc.c                            |
|                                                                 |
| This program converts a DOS binary file to an ASCII file consisting of |
| zeros and ones representing the original binary file. This is called |
| "binary to binary ASCII". Written by Thomas E. Reimer, November 1993. |
|                                                                 |
\*****************************************************************/ include <io.h>
include <dos.h>
#include <ctype.h>
#include <conio.h>
#include <stdio.h>
include <stdlib.h> define BYTE unsigned char

FILE *inFile;
FILE *outFile;

// function prototypes
void giveHelp (void);
int  binary2binaryAscii (char *inputFilename, char *outputFilename);
void printError (char *string);

// array to convert binary code by look-up to the equivalent binary string.
char byteString [256] [9] =
            {
            "00000000", "00000001", "00000010", "00000011",

"00000100", "00000101", "00000110", "00000111",

"00001000", "00001001", "00001010", "00001011",
            "00001100", "00001101", "00001110", "00001111",

"00010000", "00010001", "00010010", "00010011",
            "00010100", "00010101", "00010110", "00010111",
            "00011000", "00011001", "00011010", "00011011",
            "00011100", "00011101", "00011110", "00011111",

"00100000", "00100001", "00100010", "00100011",
            "00100100", "00100101", "00100110", "00100111",
            "00101000", "00101001", "00101010", "00101011",
            "00101100", "00101101", "00101110", "00101111",
            "00110000", "00110001", "00110010", "00110011",
            "00110100", "00110101", "00110110", "00110111",
            "00111000", "00111001", "00111010", "00111011",
            "00111100", "00111101", "00111110", "00111111",

"01000000", "01000001", "01000010", "01000011",
            "01000100", "01000101", "01000110", "01000111",
            "01001000", "01001001", "01001010", "01001011",
            "01001100", "01001101", "01001110", "01001111",
            "01010000", "01010001", "01010010", "01010011",
            "01010100", "01010101", "01010110", "01010111",
            "01011000", "01011001", "01011010", "01011011",
            "01011100", "01011101", "01011110", "01011111",
            "01100000", "01100001", "01100010", "01100011",
            "01100100", "01100101", "01100110", "01100111",
```

100

```
"01101000", "01101001", "01101010", "01101011",
"01101100", "01101101", "01101110", "01101111",
"01110000", "01110001", "01110010", "01110011",
"01110100", "01110101", "01110110", "01110111",
"01111000", "01111001", "01111010", "01111011",
"01111100", "01111101", "01111110", "01111111",

"10000000", "10000001", "10000010", "10000011",
"10000100", "10000101", "10000110", "10000111",
"10001000", "10001001", "10001010", "10001011",
"10001100", "10001101", "10001110", "10001111",
"10010000", "10010001", "10010010", "10010011",
"10010100", "10010101", "10010110", "10010111",
"10011000", "10011001", "10011010", "10011011",
"10011100", "10011101", "10011110", "10011111",
"10100000", "10100001", "10100010", "10100011",
"10100100", "10100101", "10100110", "10100111",
"10101000", "10101001", "10101010", "10101011",
"10101100", "10101101", "10101110", "10101111",
"10110000", "10110001", "10110010", "10110011",
"10110100", "10110101", "10110110", "10110111",
"10111000", "10111001", "10111010", "10111011",
"10111100", "10111101", "10111110", "10111111",
"11000000", "11000001", "11000010", "11000011",
"11000100", "11000101", "11000110", "11000111",
"11001000", "11001001", "11001010", "11001011",
"11001100", "11001101", "11001110", "11001111",
"11010000", "11010001", "11010010", "11010011",
"11010100", "11010101", "11010110", "11010111",
"11011000", "11011001", "11011010", "11011011",
"11011100", "11011101", "11011110", "11011111",
"11100000", "11100001", "11100010", "11100011",
"11100100", "11100101", "11100110", "11100111",
"11101000", "11101001", "11101010", "11101011",
"11101100", "11101101", "11101110", "11101111",
"11110000", "11110001", "11110010", "11110011",
"11110100", "11110101", "11110110", "11110111",
"11111000", "11111001", "11111010", "11111011",
"11111100", "11111101", "11111110", "11111111"
);

int
main (int argc, char * argv[])       // the file name will be entered.
{
int i;

// starts at top of open window area
clrscr ();

if (argc <= 2)                       // if the invocation of main() is not
    {                                // followed by a two filenames, give help.
    giveHelp ();
    exit (0);
    } printf ("Binary to Binary ASCII Conversion\n");

binary2binaryAscii (argv [1], argv [2]);

printf ("\nDONE!\n");
```

101

```
    return 0;
} int
binary2binaryAscii (char *inputFilename, char *outputFilename)
    {
    int handle, ch;
    long length, counter = 0, modulusNumber = 16;
    int filesClosed;
    BYTE byte;

// open original file in binary mode
    if ((inFile = fopen (inputFilename, "rb")) == NULL)
        {
        printError ("ERROR: Cannot Open Input File");
        exit (1);
        }

// establish a handle to use 'C's length function
    handle = fileno (inFile);
    length = filelength (handle);
    printf ("\nOriginal File Length = %8ld bytes\n", length);

// make sure it is OK to create a monstrous file
    printf ("The created text file will be %ld Kbytes\n", (length * 8)/1024);
    printf ("Continue (y/n)\n");
    ch = getch ();
    ch = toupper (ch);
    if (ch != 'Y') return 0;
    gotoxy (1,4);
    printf ("                                        \n");
    printf ("                        ");

// this makes sure there is not too much screen activity for speed
    if (length > 4096) modulusNumber = 1024;

// open output file in text mode
    if ((outFile = fopen (outputFilename, "wt")) == NULL)
        {
        printError ("ERROR: Cannot Open Output File");
        exit (1);
        } gotoxy (1,4);
    printf ("Progress:");

// original file is read, and new file is written
    while (length --)
        {
        byte = fgetc (inFile);
        //printf ("count=%ld, byte=%d, %s\n", length, byte, byteString [byte]);

counter ++;
        if (!(counter % modulusNumber))
            {
            gotoxy (24, 4);
            printf ("%8ld", counter);
            }
```

102

```c
    fputs (byteString [byte], outFile);
    }

// if the counter is not exactly equal to size, this corrects it
gotoxy (24, 4);
printf ("%8ld", counter);

printf ("\n");

// clean up before exit
filesClosed = fcloseall ();
if (filesClosed == EOF)
   printError ("A File Closing ERROR Occured!");

printf ("\n%d file Streams Closed!\n", filesClosed);
sound (700);
delay (400);
nosound ();
return 0;
} void
printError (char *string)
   {
   gotoxy (1, 7);
   puts (string);
   } void
giveHelp ()
   {
   clrscr ();
   puts ("The command invocation must be followed by a valid\n");
   puts ("input filename, and output filename\n\n");
   puts ("EXAMPLE:\n\n");
   puts ("   bin2basc input.pcx out.esc\n\n");
   }
```

103

```
/*****************************************************************\
|                            basc2bin.c                            |
|                                                                  |
| This program an ASCII text file consisting of zeros and ones to a DOS |
| binary file.  This is called "binary ascii to binary".           |
| Written by Thomas E. Reimer, November 1993.                      |
|                                                                  |
\*****************************************************************/ include <io.h>
include <dos.h>
#include <ctype.h>
#include <conio.h>
#include <stdio.h>
include <stdlib.h> define BYTE unsigned char

FILE *inFile;
FILE *outFile;

// function prototypes
void  giveHelp (void);
BYTE  string2byte (char *string);
void  printError (char *string);

BYTE
string2byte (char *string)
   {
   int i;
   BYTE byte = 0x00;
   BYTE bit  = 0x01;

for (i = 7; i >= 0; i --)
      {
      if (string [i] == '1')
         byte |= bit;
      else if (string [i] != '0' )
         {
         printError ("ERROR: File Read Encountered a non-binary character!");
         exit (1);
         } bit <<= 1;
      }
   return byte;
   } int
main (int argc, char * argv[])         // the file name will be entered.
   {
   int i;

// starts at top of open window area
   clrscr ();

if (argc <= 2)                      // if the invocation of main() is not
      {                                // followed by a two filenames, give help.
```

104

```c
    giveHelp ();
    exit (0);
    } printf ("Binary ASCII to Binary Conversion\n");

binaryAscii2binary (argv [1], argv [2]);

printf ("\nDONE!\n");
  return 0;
  } int
binaryAscii2binary (char *inputFilename, char *outputFilename)
  {
  int handle, modulusNumber = 16;
  long length, counter = 0;
  int filesClosed;
  BYTE byte;
  char string [8];
  int itemCount;

// open the original file in text mode
  if ((inFile = fopen (inputFilename, "rt")) == NULL)
     {
     printError ("ERROR: Cannot Open Input File");
     exit (1);
     }

// establish a handle to use 'C's length function
  handle = fileno (inFile);
  length = filelength (handle);
  printf ("\nFile Length = %8ld bytes\n", length);

if (length % 8)
     {
     printError ("ERROR: File length not divisable by bytes!");
     exit (1);
     }

// this makes sure there is not too much screen activity for speed
  if (length > 4096) modulusNumber = 1024;

// open the output file in binary mode
  if ((outFile = fopen (outputFilename, "wb")) == NULL)
     {
     printError ("ERROR: Cannot Open Output File");
     exit (1);
     } gotoxy (1,4);
  printf ("Progress:");

// original file is read, and new file is written
  do {
     itemCount = fread (string, 8, 1, inFile);

counter += 8;
     if (!(counter % modulusNumber))
```

```
            {
            gotoxy (15, 4);
            printf ("%8ld", counter);
            } if (itemCount != 1)
            {
            printError ("A File Read ERROR Occured!");
            exit (1);
            } byte = string2byte (string);

fputc (byte, outFile);

}
    while (length -= 8);

// if the counter is not exactly equal to size, this corrects it
    gotoxy (15, 4);
    printf ("%8ld", counter);

printf ("\n");

filesClosed = fcloseall ();
    if (filesClosed == EOF)
        printError ("A File Closing ERROR Occured!");

// clean up before exit
    printf ("\n%d file Streams Closed!\n", filesClosed);
    sound (700);
    delay (400);
    nosound ();
    return 0;
    } void
giveHelp ()
    {
    clrscr ();
    puts ("The command invocation must be followed by a valid\n");
    puts ("input filename, and output filename\n\n");
    puts ("EXAMPLE:\n\n");
    puts ("   basc2bin input.txt out.bin\n\n");
    } void
printError (char *string)
    {
    gotoxy (1, 7);
    puts (string);
    }
```

We claim:

1. A data compression system comprising:

means for accepting a series of data at an input representing information to be transferred;

means for selecting one or more maximal sequences to represent at least a portion of the series of data, wherein each maximal sequence has a corresponding unique label; and means for transmitting to an output the one or more labels corresponding to the selected maximal sequences.

2. The data compression system of claim 1 wherein the accepting means includes an encoding processor for dividing the series of data into blocks of binary bits and further comprises means for converting the blocks of binary bits into blocks of numbers.

3. The data compression system of claim 2 wherein the means for selecting one or more maximal sequences includes means for determining a maximal sequence of length N for a first block, wherein the first block of binary bits includes a block of N binary bits.

4. The data compression of claim 3 further comprising means for communicating with a remote processor.

5. The data compression system of claim 4 wherein the remote processor includes means for receiving a label corresponding to a maximal sequence from the output of the transmitting means;

means for synthesizing the series of data from the maximal sequence corresponding to the label from the transmitting means.

6. The data compression system of claim 3 wherein N is a Mersenne prime number.

7. The data compression system of claim 6 further comprising means for selecting at least one maximal sequence of length N and a number "i" representing how much the at least one maximal sequence is to be shifted.

8. A data compression method comprising the steps of:

accepting a series of data at an input of a processor representing information to be transferred;

selecting one or more maximal sequences having unique labels to represent at least a portion of the series of data; and transmitting to an output the one or more labels corresponding to the maximal sequences representing the portion of the series of data.

9. The data compression method of claim 8 wherein the step of accepting includes the step of dividing the series of data into blocks of data containing N characters in each block.

10. The data compression method of claim 9 wherein the step of dividing includes the step of dividing the series of data into blocks of binary bits and converting the blocks of binary bits into blocks of numbers.

11. A data compression system comprising:

means for accepting a series of data at an input representing information to be represented by at least one value having a character length less than the character length of the data to be represented;

means for separating the series of data into blocks of a predetermined length;

means for obtaining an orthonormal sequence having a length equal to the predetermined length;

means for comparing a block of data with one or more orthonormal sequences obtained from the means for obtaining orthonormal sequences and matching a block to a sequence;

means for outputting the block of data;

means for selecting a value corresponding uniquely to the orthonormal sequence matched with the block of data; and means for outputting a value corresponding to the amount of shift from the sequence representing the output block of data must be made to obtain a sequence representing a further block of data.

12. A data compression system comprising:

means for accepting a series of data at an input representing information to be represented by at least one value having a character length less than the character length of the data to be represented;

means for separating the series of data into blocks of a predetermined length;

means for obtaining a maximal sequence having a length equal to the predetermined length;

means for comparing a block of data with one or more maximal sequences obtained from the means for obtaining maximal sequences and matching a block to a sequence; and means for selecting a value corresponding uniquely to the maximal sequence matched with the block of data.

* * * * *